United States Patent
Kumata

[19]

[11] Patent Number: 6,127,872
[45] Date of Patent: Oct. 3, 2000

[54] DELAY CIRCUIT AND OSCILLATOR CIRCUIT USING THE SAME

[75] Inventor: Ichiro Kumata, Kanagawa, Japan

[73] Assignee: Sony Corporation, Tokyo, Japan

[21] Appl. No.: 09/039,028

[22] Filed: Mar. 13, 1998

[30] Foreign Application Priority Data

Mar. 17, 1997 [JP] Japan ................................. 9-062841

[51] Int. Cl.$^7$ ................................................. H03H 11/26
[52] U.S. Cl. ........................ 327/276; 327/277; 327/278; 327/392; 327/395
[58] Field of Search ................................. 327/276, 277, 327/278, 261, 264, 270, 271, 283, 392, 393, 394, 395, 400; 331/57

[56] References Cited

U.S. PATENT DOCUMENTS

| | | | |
|---|---|---|---|
| 3,649,843 | 3/1972 | Redwine et al. | 326/84 |
| 3,898,479 | 8/1975 | Proebsting | 327/589 |
| 4,061,933 | 12/1977 | Schroeder et al. | 327/269 |
| 4,223,396 | 9/1980 | Kinoshita | 365/194 |
| 4,366,400 | 12/1982 | Kirsch | 327/261 |
| 4,503,550 | 3/1985 | Sauer | 377/63 |
| 4,638,186 | 1/1987 | McLaughlin | 326/110 |
| 5,146,121 | 9/1992 | Searles et al. | 327/276 |
| 5,355,037 | 10/1994 | Andresen et al. | 327/158 |
| 5,406,216 | 4/1995 | Millman et al. | 327/202 |
| 5,420,546 | 5/1995 | Watanabe et al. | 331/57 |
| 5,485,126 | 1/1996 | Gersbach et al. | 331/57 |
| 5,497,263 | 3/1996 | Masuda et al. | 327/278 |
| 5,544,203 | 8/1996 | Casasanta et al. | 375/376 |
| 5,559,476 | 9/1996 | Zhang et al. | 331/57 |
| 5,570,294 | 10/1996 | McMinn et al. | 364/481 |
| 5,796,313 | 8/1998 | Eitan | 331/57 |
| 5,818,259 | 10/1998 | Martin | 326/84 |

FOREIGN PATENT DOCUMENTS

| | | |
|---|---|---|
| 495 573 | 7/1992 | European Pat. Off. . |
| 613 245 | 8/1994 | European Pat. Off. . |
| 641 078 | 3/1995 | European Pat. Off. . |
| 657 796 | 6/1995 | European Pat. Off. . |
| 661 809 | 7/1995 | European Pat. Off. . |

OTHER PUBLICATIONS

"*CMOS On–Chip Starter Circuit for Substrate Bias Generator*", IBM Technical Disclosure Bulletin, vol. 28, No. 9, pp. 3974–3975 (Feb. 1986).

*Primary Examiner*—Terry D. Cunningham
*Assistant Examiner*—An T. Luu
*Attorney, Agent, or Firm*—Frommer Lawrence & Haug, LLP.; William S. Frommer; Bruno Polito

[57] ABSTRACT

A delay circuit is constituted by connecting a plurality of delay elements in series, each delay element is constituted by a pMOS transistor P1 and a nMOS transistor N1 having a larger driving capability than P1 and by a nMOS transistor N2 and a pMOS transistor P2 having a larger driving capability than N2, an input signal is applied to the gate of the transistor P1, a precharge signal is applied to the gate of the transistor N1, an inverted signal of the precharge signal is applied to the gate of the transistor P2, the gate of the transistor N2 is connected to an intermediate node A, an input signal $S_{IN}$ is input to each delay element as the precharge signal, and when the input signal $S_{IN}$ is at a high level, the node A is in the state of a low level and the output terminal OUT is in the state of a high level, the falling edge of the input signal $S_{IN}$ is sequentially propagated by delay elements, and thus a delay signal is obtained.

44 Claims, 37 Drawing Sheets

DELAY CIRCUIT AND OSCILLATOR CIRCUIT USING THE SAME

BACKGROUND OF THE INVENTION

1. Field of the Invention

The present invention relates to a delay circuit for outputting an input signal delayed by exactly a predetermined delay time and to an oscillator circuit constituted by using the delay circuit, more particularly to a delay circuit controlling the delay time and oscillation frequency in accordance with a digital signal and to an oscillator circuit using the same.

2. Description of the Related Art

An example of a delay circuit in which the delay time can be freely set in accordance with a digital control signal is shown in FIG. 1. As illustrated, the delay circuit comprises n number of stages of delay elements DLY1, DLY2, . . . , and DLYn connected in series and an n-to-1 selection circuit SEL for selecting one among the n number of output signals from these delay elements and outputting the same. Each of the n number of stages of delay elements connected in series outputs a delay signal obtained by delaying an input signal by a predetermined time to the delay element of the next stage. The selection circuit SEL selects one from among the output signals of the n number of stages of delay elements in accordance with the digital control signal and then outputs the same.

For example, assuming that each delay element gives the same delay time $t_D$ to the input signal, by the delay circuit constituted as shown in FIG. 2, delay time of $t_D$ to $nt_D$ can be freely given with respect to an input signal.

An example of an oscillator circuit constituted by using the delay circuit is shown in FIG. 2. As illustrated, an inverter INV1 is provided in the delay circuit shown in FIG. 1, the output signal of the selection circuit SEL is input to the inverter INV1, and the output signal of the inverter INV1 is input as the input signal of the delay circuit to the delay element DLY1 of the initial stage. An oscillation signal (clock signal) CLK is obtained from the output terminal of the selection circuit SEL.

Namely, the oscillator circuit is constituted by a delay circuit comprised of elements connected in the form of a ring via the inverter. Since the oscillation frequency of the oscillator circuit is controlled by the delay time of the delay circuit, the frequency of the clock signal CLK can be controlled by controlling the delay time by a digital control signal.

Further, another example of an oscillator circuit controlling the oscillation frequency by a digital signal is shown in FIG. 3. The present example is constituted by a digital/analog converter (D/A converter) DAC and a voltage-controlled oscillator (VCO), the digital control signal is converted to an analog control voltage signal VC by the digital/analog converter DAC, and the oscillation frequency of the voltage-controlled oscillator VCO is controlled by the control voltage signal VC. By this, the frequency of the clock signal CLK generated by the voltage-controlled oscillator VCO can be controlled by a digital control signal.

FIG. 4 shows an example of an oscillator circuit changed in capacitance by a digital signal and controlling the oscillation frequency in accordance with the change of capacitance. As illustrated, the on/off state of switches SW0, SW1, SW2, . . . , and SWn is controlled in accordance with the digital signal. The total capacitance of the capacitance elements connected to the oscillator circuit OSC is controlled in accordance with this. Since the oscillation frequency of the oscillator circuit OSC is set in accordance with the capacitance of the connected capacitance elements, the frequency of the clock signal CLK obtained from the oscillator circuit OSC can be controlled by a digital control signal.

In the above-mentioned conventional digital control oscillator circuit, for example, the oscillator circuit shown in FIGS. 3 and 4, however, analog-like design elements are included. Therefore, there is a disadvantage that troublesome circuit design and correction are required taking into consideration the trade off between oscillation frequency range, linearity (linear characteristic) and the circuit scale etc. for every specification of the oscillator circuit and process of the LSI (large scale integrated circuit).

On the other hand, in a digital control oscillator circuit constituted by the selection circuit together with using usual gate circuits such as inverters and buffers as the delay elements, the circuit configuration, as shown in FIG. 2, is simple and then there are no analog-like elements, so the control of the frequency of the oscillation signal and the stability of the circuit operation are good. However, the delay time per stage of a usual delay element is large, therefore the step width of the frequency is large and it is difficult to finely set the oscillation frequency.

For example, where a delay element is constituted by two stage of inverters as shown in FIG. 5, an output terminal A of the inverter of the former stage constituted by a pMOS transistor PT1 and an nMOS transistor NT1 is connected to both of the gates of the pMOS transistor PT2 and nMOS transistor NT2 constituting the inverter of the latter stage, the load of the inverters become large, and the operation speed is lowered. Further, as shown in the waveform diagram of FIG. 6, the threshold voltage of the usual inverter is a half of the power supply voltage VDD, the output signal level of the inverter changes around a time when the level of the input signal becomes substantially VDD/2, therefore the delay time $t_D$ per stage of inverter becomes large.

SUMMARY OF THE INVENTION

An object of the present invention is to provide a delay circuit capable of finely controlling the delay time, reducing the step width of the oscillation frequency of the oscillator circuit, and enabling control by a digital signal with a simple circuit configuration and an oscillator circuit using the same.

To achieve the above object, the present invention provides a delay circuit for outputting an input signal taking a first or a second level delayed by exactly a predetermined time, having a first holding means for receiving a control signal and holding a first node at a first level in accordance with the control signal; a second holding means for holding a second node at a second level in accordance with the control signal; a first switching means for receiving the input signal and switching the first node from the first level to the second level when the input signal switches from the second level to the first level; and a second switching means for switching the second node from the second level of the first level in accordance with a level change of the first node and then outputting the signal of the second node.

Further, in the present invention, preferably the first holding means has a first first conductivity type transistor which is connected between a first power source for supplying the first level and the first node, is controlled in its on/off state in accordance with the control signal, and holds the first node at the first level at the time of conduction; the second holding means has a first second conductivity type transistor which is connected between a second power source for supplying the second level and the second node, is controlled in its on/off state in accordance with the control signal, and holds the second node at the second level at the time of conduction; the first switching means has a second second conductivity type transistor which is connected between the second power source and the first node, receives the input signal, is controlled in its on/off state in accordance with the input signal, switches from the conductive state to the nonconductive state when the input signal switches from the second level to the first level, and switches the first node from the first level to the second level; the second switching means has a second first conductivity type transistor which is connected between the first power source and the second node, is controlled in its on/off state in accordance with the level change of the first node, switches from the nonconductive state to the conductive state when the first node changes from the first level to the second level, and switches the second node from the second level to the first level; and a driving capability of the first first conductivity type transistor serving as the first holding means is set larger than that of the second second conductivity type transistor serving as the first switching means and the driving capability of the first second conductivity type transistor serving as the second holding means is set larger than that of the second first conductivity type transistor serving as the second switching means.

Further, in the present invention, preferably the first holding means has a first first conductivity type transistor which is connected between the first power source and the first node, is controlled in its on/off state in accordance with the control signal, and holds the first node at the first level at the time of conduction; the second holding means has a first second conductivity type transistor which is connected between the second power source and the second node, is controlled in its on/off state in accordance with the control signal, and holds the second node at the second level at the time of conduction; the first switching means has a second second conductivity type transistor and a third second conductivity type transistor connected in series between the second power source and the first node, the second second conductivity type transistor is controlled in its on/off state in accordance with the input signal upon receive of the input signal and is set in the conductive state when the input signal is held at the first level, the third second conductivity type transistor is controlled in its on/off state in accordance with the control signal and is set in an on/off state reverse to that of the first first conductivity type transistor serving as the first holding means, and the first node is switched from the first level to the second level when the second and third second conductivity type transistors are set in the conductive state; and the second switching means has a second first conductivity type transistor and a third first conductivity type transistor connected in series between the first power source and the second node, the second first conductivity type transistor is controlled in its on/off state in accordance with the level of the first node and is set in the conductive state when the first node is held at the second level, the third first conductivity type transistor is controlled in its on/off state in accordance with the control signal and is set in an on/off state reverse to that of the first second conductivity type transistor serving as the second holding means, and the second node is switched from the second level to the first level when the second and third first conductivity type transistors are set in the conductive state.

Further, the present invention provides a delay circuit comprising at least two delay elements which are connected in series and outputting a delay input signal taking a first or a second level delayed by exactly a predetermined time, wherein each of the delay elements has a first holding means for receiving a control signal and holding a first node at the first level in accordance with the control signal, a second holding means for holding a second node at the second level in accordance with the control signal, a first switching means for receiving an input signal and switching the first node from the first level to the second level when the input signal switches from the second level to the first level, and a second switching means for switching the second node from the second level to the first level in accordance with a level change of the first node and then outputting the signal of the second node to a delay element of a latter stage as the input signal of the delay element of the latter stage; and the delay input signal is input as the input signal of the delay element of an initial stage to the delay element of the initial stage and further input to each delay element as the control signal of each delay element.

Further, in the present invention, there is provided a delay circuit in which a delay time is set in accordance with a control signal, having a plurality of basic circuits each comprising a first delay element for delaying an input signal of a first input terminal by a predetermined time and outputting the result to a first output terminal, a selecting means for selecting either of the output signal of the first delay element or the input signal of a second input terminal in accordance with a control signal and outputting the same, and a second delay element for delaying the output signal of the selecting means by a predetermined time and outputting the same to a second output terminal, the first output terminal of a basic circuit of a former stage being connected to the first input terminal the basic circuit of a latter stage, and the second input terminal of the basic circuit of a former stage being connected to the second output terminal of the basic circuit of a latter stage.

Further, in the present invention, there is provided a delay circuit in which a delay time is set in accordance with a control signal, having a plurality of stages of delay elements each comprising a first inverting means for inverting an input signal of a first input terminal and outputting the same to a first node, a second inverting means for inverting the signal of the first node and outputting the same to a first output terminal, a third inverting means for inverting the input signal of a second input terminal and outputting the same to a second node, a fourth inverting means for inverting the signal of the second node and outputting the same, a first switch which is connected between the first input terminal and the second output terminal and is controlled in its on/off state in accordance with a first control signal, and a second switch which is connected between the first and second nodes and is controlled in its on/off state in accordance with a second control signal; the first output terminal of the delay element of a former stage being connected to the first input terminal of the delay element of a latter stage, and the second input terminal of the delay element of a former stage being connected to the second output terminal of the delay element of a latter stage.

Further, in the present invention, there is provided an oscillator circuit feeding back an output signal of a delay circuit to an input side so as to oscillate at an oscillation frequency in accordance with a delay time of said delay circuit, wherein said delay circuit is comprised by a plurality of delay elements connected in series, each delay element being constituted by a first holding means for receiving a control signal and holding a first node at a first level in accordance with the control signal, a second holding means for holding a second node at a second level in accordance with the control signal, a first switching means for receiving an input signal and switching the first node from the first level to the second level when the input signal switches from the first level to the second level, and a second switching means for switching the second node from the second level to the first level in accordance with a level change of the first node and then outputting the signal of the second node to the delay element of a latter stage as the input signal of the delay element of the latter stage; and provision is made of an inverting means for inverting the output signal of the delay element of the final stage and inputting the inverted signal to the delay element of the initial stage as the input signal of the delay element of the initial stage; the input signal of the delay element of the initial stage being supplied to each delay element as the control signal of each delay element.

Further, in the present invention, there is provided an oscillator circuit feeding back an output signal of a delay circuit to an input side and controlled in oscillation frequency in accordance with a control signal, wherein the delay circuit is comprised by a plurality of basic circuits connected in series; each basic circuit having a first delay element for delaying the input signal of a first input terminal by a predetermined time and then outputting the same to a first output terminal, a selecting means for selecting either of the output signal of the first delay element or the input signal of a second input terminal in accordance with the control signal and outputting the same, and a second delay element for delaying an output signal of the selecting means by a predetermined time and then outputting the same to a second output terminal; the first output terminal of the basic circuit of a former stage is connected to the firsts input terminal of the basic circuit of a latter stage, the second input terminal of the basic circuit of a former stage is connected to the second output terminal of the basic circuit of a latter stage, and the first output terminal of the basic circuit of the final stage is connected to the second input terminal; and provision is made of an inverting means for inverting the output signal of the second output terminal of the basic circuit of the initial stage and inputting the inverted signal to the first input terminal of the basic circuit of the initial stage.

Further, in the present invention, there is provided an oscillator circuit feeding back an output signal of a delay circuit to an input side and controlled in oscillation frequency in accordance with a control signal, wherein the delay circuit is comprised of a plurality of delay elements connected in series; each delay element having a first inverting means for inverting the input signal of a first input terminal and then outputting the same to a first node, a second inverting means for inverting the signal of the first node and then outputting the same to a first output terminal, a third inverting means for inverting the input signal of a second input terminal and then outputting the same to a second node, a fourth inverting means for inverting the signal of the second node and then outputting the same, a first switch connected between the first input terminal and the second output terminal and controlled in its on/off state in accordance with the first control signal, and a second switch connected between the first and second nodes and controlled in its on/off state in accordance with the second control signal; the first output terminal of the delay element of a former stage is connected to the first input terminal of the delay element of a latter stage, and the second input terminal of the delay element of a former stage is connected to the second output terminal of the delay element of a latter stage; and provision is made of an inverting means for inverting the output signal of the second output terminal of the delay element of the initial stage and inputting the inverted signal to the first input terminal of the delay element of the initial stage.

Further, in the present invention, there is provided an oscillator circuit for generating an oscillation signal controlled in its oscillation frequency and duty ratio in accordance with a first and a second control signal, having a first delay circuit for giving a first delay time to an input signal in accordance with the first control signal and then outputting the same, a second delay circuit for giving a second delay time to the input signal in accordance with the second control signal upon receipt of the output signal of the first delay circuit and then outputting the same, and an inverting means for inverting the output signal of the second delay circuit and then outputting the inverted signal as the input signal of the first delay circuit to the first delay circuit and outputting the output signal of the first delay circuit as the oscillation signal to an external portion.

According to the present invention, the delay circuit is constituted by connecting a plurality of delay elements in series, the delay elements are set to a precharge state in advance in response to the precharge control signal, the state of each delay element sequentially changes in response to a level change of the input signal, and therefore a change of the signal level is sequentially transferred to the output side of the delay circuit by the delay elements. Since the delay time of each delay element is small, it is possible to finely adjust the delay time of the delay circuit constituted by this.

Further, by a basic circuit comprising two upper and lower stages of delay elements, two, an outgoing and a returning, signal propagation routes are formed and a selecting means is provided between these propagation routes to constitute a ladder type delay circuit. The propagation route of the signal is set by the selecting means in accordance with the delay control signal which is input. The delay time of the delay circuit is controlled in accordance with this. By this, an increase or decrease of the delay time can be easily dealt with by increasing or decreasing the number of the basic circuits. Further, the linear characteristic of the amount of the delay can be maintained with respect to a delay control signal without the maximum number of delay steps having an influence upon the minimum delay time.

Further, according to the present invention, the selecting means for controlling the delay route is constituted by a switch controlled in its on/off state in accordance with the delay control signal and can be realized by one transistor in an actual circuit. Therefore, a reduction of the size of the circuit can be achieved and generation of an unnecessary delay time in the selecting means can be suppressed.

It is possible to use the delay circuit of the present invention, invert the output signal of the delay circuit, and feed this back to the input side so as to constitute a ring-configuration oscillator circuit. In the thus constituted oscillator circuit, a plurality of oscillation signals having different oscillation frequencies and duty ratios are obtained by a fine steps of change. Further, a wide range of oscillation frequencies can be dealt with by increasing or decreasing the number of basic circuits constituting the delay circuit, and the minimum possible oscillation frequency can be set low. Further, the maximum possible oscillation frequency of the oscillator circuit is not influenced by the adjustment of the minimum oscillation frequency. The linear characteristic of the oscillator circuit with respect to the control signal is good, and the frequency range in which the oscillator circuit can oscillate can be set wide.

Further, according to the present invention, the ring-configuration oscillator circuit is constituted by serially connecting first and second delay circuits having delay times which can be controlled independently from each other, inverting the output signal of the second delay circuit, and inputting the same to the first delay circuit. By setting the delay times of the first and second delay circuits independently from each other, it is possible to obtain an oscillation signal which can be controlled in its oscillation frequency and duty ratio from the output side of the first delay circuit.

BRIEF DESCRIPTION OF THE DRAWINGS

The above and other objects and features of the present invention will be described more in detail with reference to the accompanying drawings, in which.

DESCRIPTION OF THE PREFERRED EMBODIMENT

First Embodiment

Figure 7:
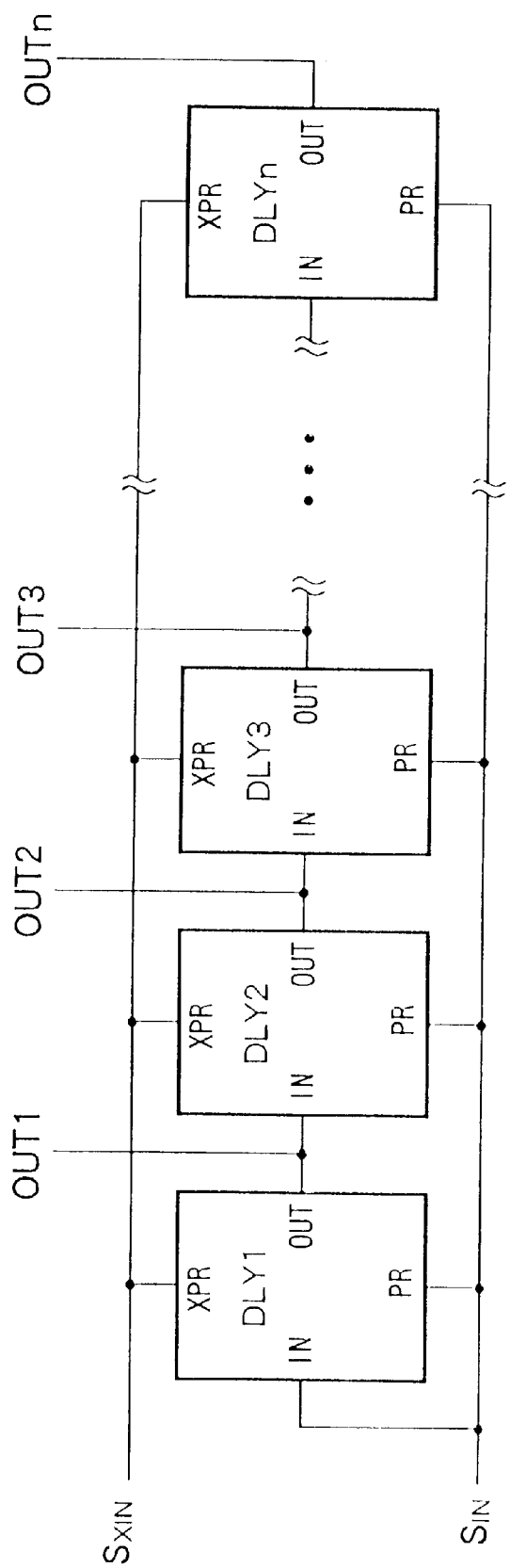
FIG. 7 is a circuit diagram of a first embodiment of a delay circuit according to the present invention.

FIG. 7 is a circuit diagram of a first embodiment of the delay circuit according to the present invention.

As illustrated, the delay circuit of the present embodiment is constituted by n number of stages of delay elements DLY1, DLY2, . . . , and DLYn. These delay elements are connected in series. Namely, the input terminal IN of each delay element is connected to the output terminal OUT of the delay element of the former stage. The input terminal IN of the delay element DLY1 of the initial stage is connected to the input terminal of the signal $S_{IN}$. Further, the delay elements DLY1, DLY2, . . . , and DLYn are provided with input terminals PR and XPR for a precharge signal and the inverted signal thereof, the input terminal PR of the precharge signal of each delay element is connected to the input terminal of the signal $S_{IN}$, and the input signal XPR of the inverted signal of the precharge signal is connected to the input terminal of the inverted signal $S_{XIN}$ of the signal $S_{IN}$.

Figure 8:
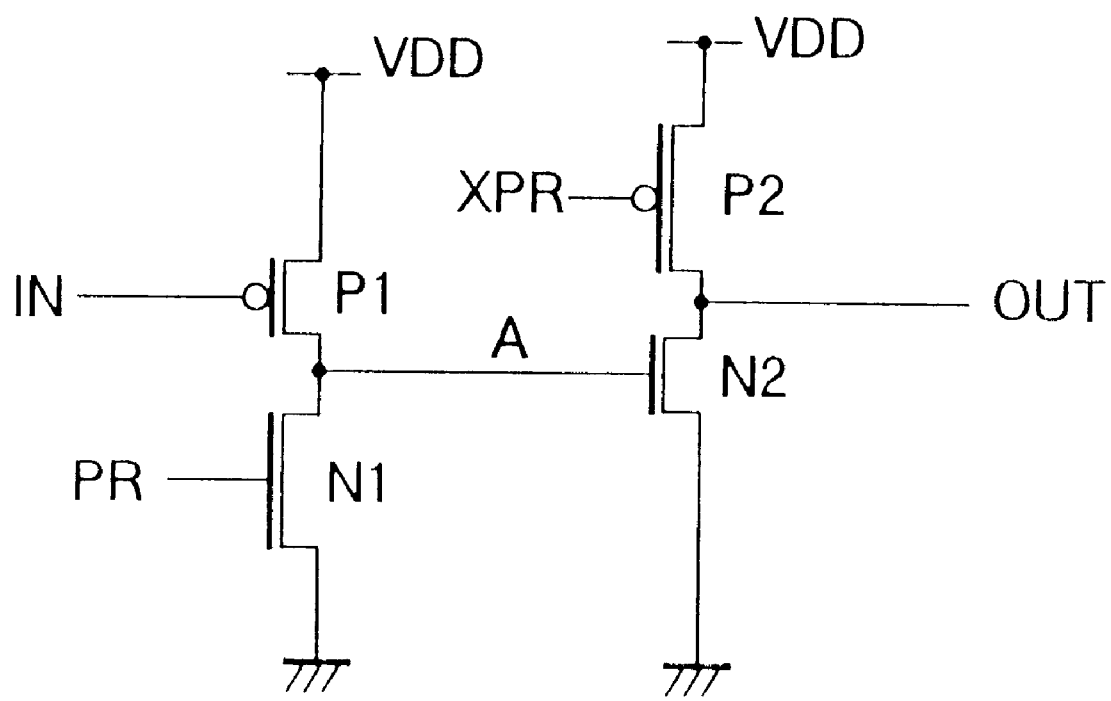
FIG. 8 is a circuit diagram of the delay element of the first embodiment.

An example of a delay element constituting the delay circuit is shown in FIG. 8. The delay element is constituted by pMOS transistors P1 and P2 and nMOS transistors N1 and N2.

The gate of the pMOS transistor P1 is connected to the input terminal IN of the delay element, the source is connected to the supply line of the power supply voltage VDD, and the drain is connected to the node A. The gate of the nMOS transistor N1 is connected to the input terminal PR of the precharge signal, the drain is connected to the node A, and the source is grounded.

The gate of the pMOS transistor P2 is connected to the input terminal XPR of the inverted signal of the precharge signal, the source is connected to the supply line of the power supply voltage VDD, and the drain is connected to the output terminal OUT of the delay element. The gate of the nMOS transistor N2 is connected to the node A, the drain is connected to the output terminal OUT, and the source is grounded.

Further, in FIG. 8, the size of the circuit symbol of the transistor indicates the driving capability of the transistor. Namely, the driving capability of the nMOS transistor N1 is set larger than the driving capability of the pMOS transistor P1, and the driving capability of the pMOS transistor P2 is set larger than the driving capability of the nMOS transistor N2.

In the delay element shown in FIG. 8, when a signal of a high level, for example, the power supply voltage VDD level, is supplied to the input terminal IN, a signal of a high level is similarly supplied to the precharge signal input terminal PR, and a signal of a low level, for example, the signal of the ground potential GND level, is supplied to the inverted signal input terminal XPR thereof, the nMOS transistor N1 and the pMOS transistor P2 are in the conductive state, the node A is held at the ground potential GND, and the output terminal OUT is held at the level of the power supply voltage VDD. At this time, both of the pMOS transistor P1 and the nMOS transistor N2 are in the nonconductive state, therefore even in a case where the level of the precharge signal changes, the levels of the node A and the output terminal OUT are held by the charges.

When the precharge signal is at the low level and the input signal supplied to the input transistor IN changes from the high level to the low level, the pMOS transistor P1 switches from the nonconductive state to the conductive state, and the node A changes from the low level to the high level. The nMOS transistors N2 switches from the nonconductive state of the conductive state in accordance with this, and the output terminal OUT of the delay element switches from the high level to the low level.

Figure 9:
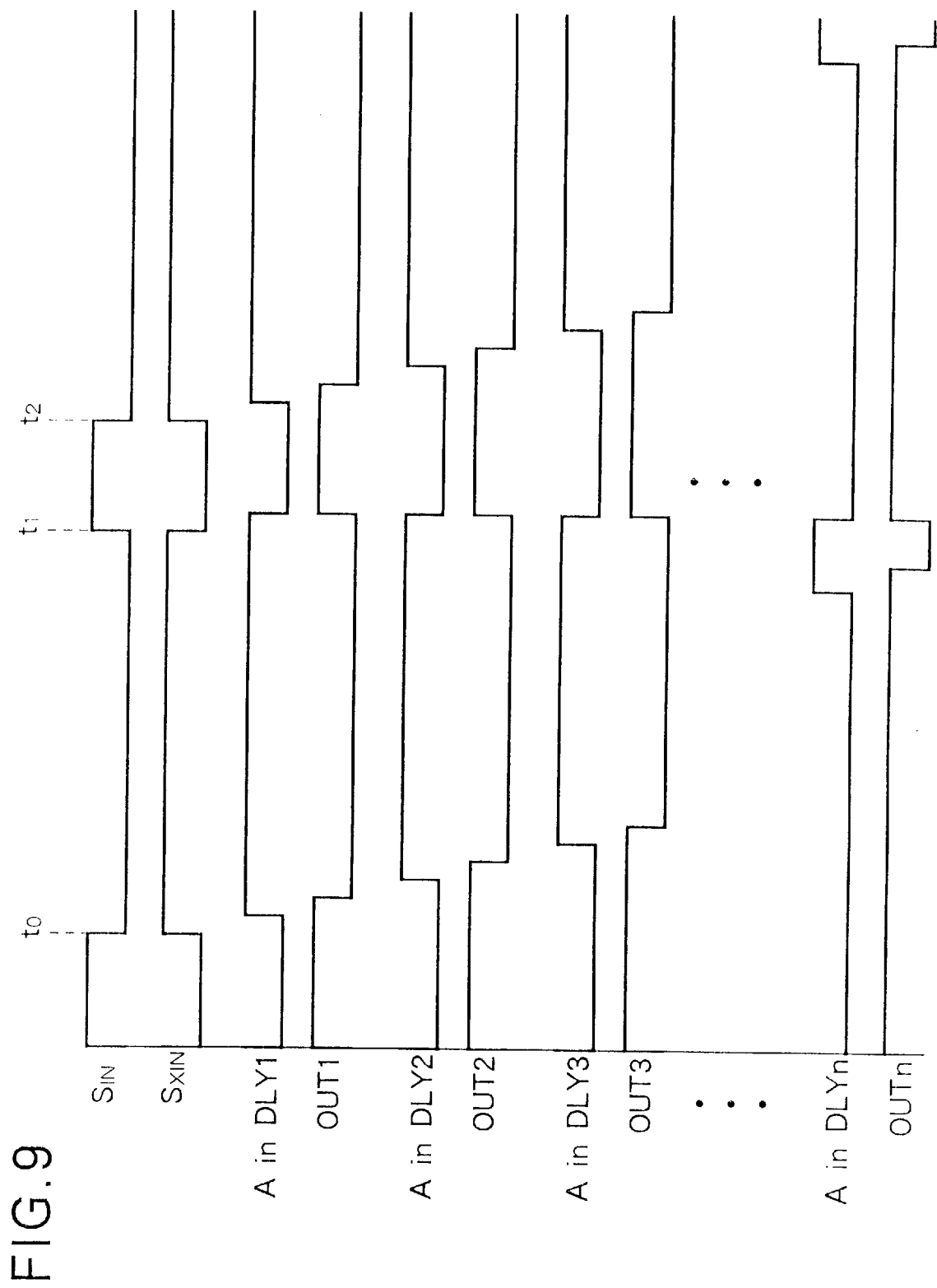
FIG. 9 is a waveform diagram of the delay circuit of the first embodiment.

FIG. 9 is a waveform diagram of the operation of the delay circuit shown in FIG. 7 and indicates the waveforms of the input signal $S_{IN}$ and the inverted signal $S_{XIN}$ thereof, input/output terminals of the delay elements DLY1, DLY2, ..., and DLYn, and nodes A of the delay elements.

In the initial state, the input signal $S_{IN}$ is held at a high level, for example, the power supply voltage VDD, and the inverted signal $S_{XIN}$ thereof is held at a low level, for example, the ground potential GND. In the delay elements DLY1, DLY2, ..., and DLYn, the node A is held at a low level, and the output signals OUT1, OUT2, ....., and OUTn are held at the power supply voltage VDD level.

At the time $t_0$, the input signal $S_{IN}$ switches from the high level to the low level, and simultaneously, the inverted signal $S_{XIN}$ switches from the low level to the high level. In the delay element DLY1, when the level of the input signal $S_{IN}$ falls below the threshold voltage $V_{thp}$ of the pMOS transistor P1, the pMOS transistor P1 becomes the conductive state, and the potential of the node A rises. When the potential of the node A exceeds the threshold voltage $V_{thn}$ of the nMOS transistor N2, the nMOS transistor N2 becomes the conductive state, and the output signal OUT1 of the delay element DLY1 switches from the high level to the low level. Namely, after an elapse of a constant delay element time from the falling edge of the input signal $S_{IN}$, the output signal OUT1 of the delay element DLY1 switches from the high level to the low level.

In the delay elements DLY2, DLY3, ..., and DLYn connected to the latter stage of the delay element DLY1, similar operations to that of the delay element DLY1 are carried out. The delay elements output delay signals obtained by giving constant delay times to the falling edges of the signals input to the delay terminals.

Here, when assuming that the delay elements similarly give the delay time $t_0$ to the input signal, the output signals of the delay elements DLY1, DLY2, ..., and DLYn are given the delay times of $t_D$, $2t_D$, ..., and $nt_D$ with respect of the input signal. An delay time of $nt_D$ at the maximum is given by the n number of stages of delay elements with respect to the input signal $S_{IN}$.

At the time $t_1$, the input signal $S_{IN}$ switches from a low level to a high level. In the delay element DLY1, the nMOS transistor N1 switches from the nonconductive state to the conductive state in accordance with this, and the node a switches from high level to low level. For this reason, the nMOS transistor N2 switches from the conductive state to the nonconductive state, and the signal output to the inverted signal terminal of the precharge signal becomes the low level, therefore the pMOS transistor P2 becomes the conductive state, and the output signal OUT1 of the delay element DLY1 becomes the high level.

In the other delay elements DLY2, DLY3, ..., and DLYn, at the instant when the input signal $S_{IN}$ switches to the high level and the inverted signal $S_{XIN}$ thereof switches to the low level, all of the transistors P1, P2, N1, and N2 become the conductive state, and an instantaneous through current flows through these transistors. However, as mentioned above, the transistors are formed with different sizes and the driving capabilities of these transistors differ accordingly. For example, the driving capability of the nMOS transistors N1 is larger than the driving capability of the pMOS transistor P1, and the driving capability of the pMOS transistor P2 is lager than that of the nMOS transistor N2. For this reason, without waiting for the successive propagation of the change of status of the delay element DLY1 of the initial stage, the potential of the node A falls and the potential of the output terminal rises in the delay elements DLY2, DLY3, ..., and DLYn. This change of status will further weaken the driving capabilities of the pMOS transistors P1 and the nMOS transistor N2. As a result, without waiting for the successive propagation of change of the input signal $S_{IN}$ of the delay element DLY1 of the initial stage, all of the delay elements DLY1, DLY2, ..., and DLYn substantially simultaneously change, and the output signals OUT1, OUT2, ..., and OUTn are substantially simultaneously switched to the high level.

When the input signal $S_{IN}$ is held at a high level, and the inverted signal $S_{IN}$ thereof is held at a low level, the nodes A of the delay elements DLY1, DLY2, ..., and DLYn are held at a low level, and the output terminal is held at a high level. Then, at the time $t_2$, the input signal $S_{IN}$ falls from the high level to the low level, and the output signals OUT1, OUT2, ..., and OUTn of the delay elements change from the high level to the low level after receiving through the individual delay times.

As explained above, according to the present embodiment, when a plurality of delay elements are connected in series to constitute the delay circuit, each delay element is constituted by a pMOS transistor P1 and an nMOS transistors N1 having a larger driving capability than this and by an nMOS transistor N2 and a pMOS transistor P2 having a larger driving capability than this, the input signal is applied to the gate of the pMOS transistor P1, the gate of the nMOS transistor N1 is connected to the precharge signal terminal PR, the gate of the pMOS transistor P2 is connected to the inverted signal terminal XPR of the precharge signal, the gate of the nMOS transistor N2 is connected to the intermediate node A comprising the drains of P1 and N1, the input signal $S_{IN}$ is input to each delay element as the precharge signal and held at high level, the node A is at low level, and the output terminal OUT is in the precharge state of a high level, the falling edge of the input signal $S_{IN}$ is sequentially propagated by the delay elements and the delay signal OUTn is obtained from the output terminal of the delay circuit, therefore a delay time with a small step width is obtained by simple circuit configuration.

Second Embodiment

Figure 10:
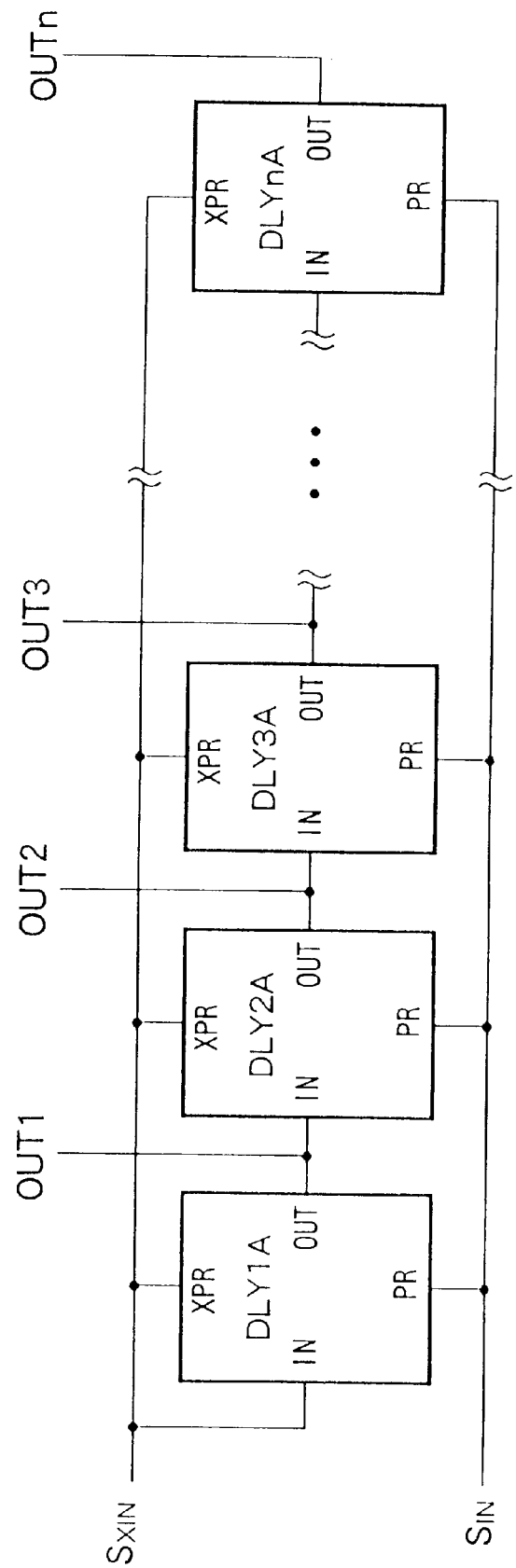
FIG. 10 is a circuit diagram of a second embodiment of the delay circuit according to the present invention.

FIG. 10 is a circuit diagram of a second embodiment of the delay circuit according to the present invention.

As illustrated, the delay circuit of the present embodiment is constituted by a number of stages of delay elements DLY1A, DLY2A, . . . , and DLYnA connected in series substantially the same as those of the first embodiment shown in FIG. 7. The input terminal IN of each delay element is connected to the output terminal OUT of the delay element of the former stage. The input terminal IN of the delay element DLY1A of the initial stage is connected to the input terminal of the inverted signal $S_{XIN}$ of the signal $S_{IN}$. Further, the delay elements DLY1A, DLY2A, . . . , and DLYnA are provided with input terminals PR and XPR for a precharge signal and the inverted signal thereof, the input terminal PR of the precharge signal of each delay element is connected to the input terminal of the signal $S_{IN}$, and the input terminal XPR of the inverted signal of the precharge signal is connected to the input terminal of the inverted signal $S_{XIN}$ of the signal $S_{IN}$.

Figure 11:
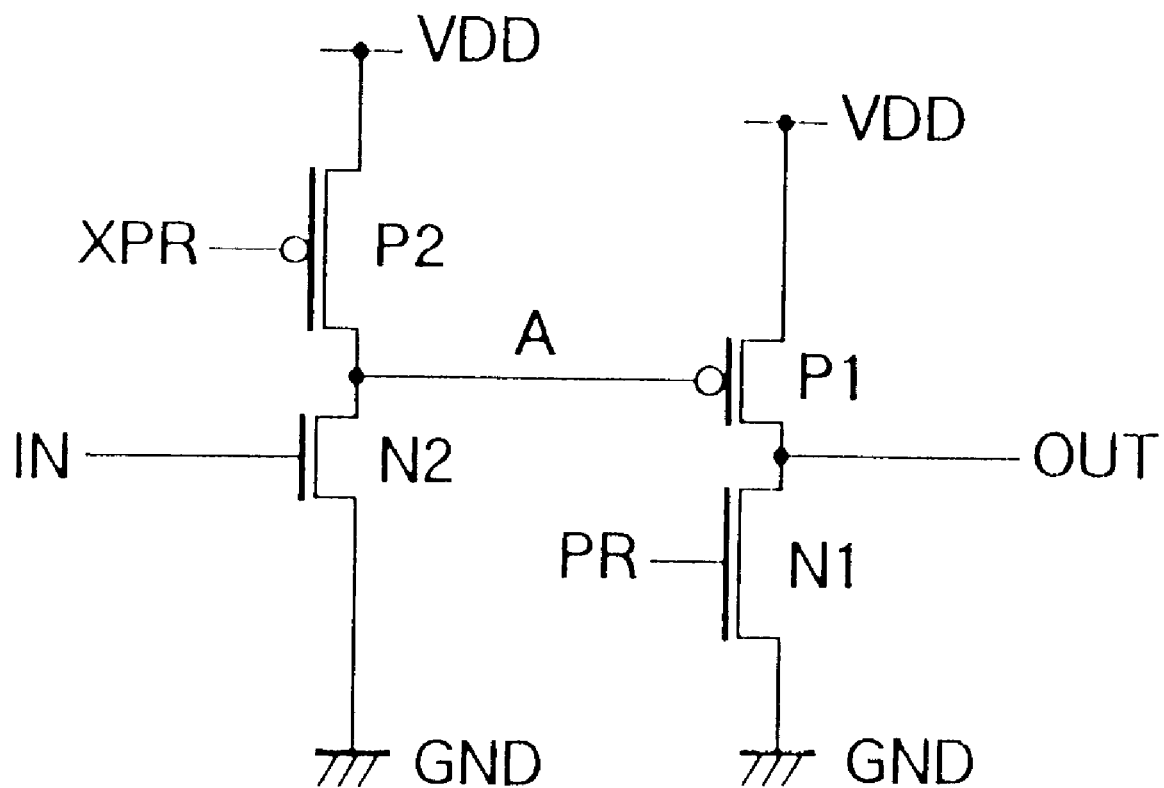
FIG. 11 is a circuit diagram of the delay element of the second embodiment.

An example of the delay elements constituting the delay circuit of FIG. 10 is shown in FIG. 11. The delay element is constituted by pMOS transistors P1 and P2 and nMOS transistors N1 and N2.

The gate of the pMOS transistor P2 is connected to the input terminal XPR of the inverted signal of the precharge signal, the source is connected to the power supply voltage VDD, and the drain is connected to the node A. The gate of the nMOS transistor N2 is connected to the input signal terminal IN, the drain is connected to the node A, and the source is grounded.

The gate of the pMOS transistor P1 is connected to the node A, the source is connected to the power supply voltage VDD, and the drain is connected to the output terminal OUT. The gate of the nMOS transistor N1 is connected to the input terminal PR of the precharge signal, the drain is connected to the output terminal OUT, and the source is grounded.

Further, the pMOS transistor P2 has a larger driving capability than that of the nMOS transistor N2, and the driving capability of the nMOS transistor N1 is set larger than that of the pMOS transistor P1.

When a signal of a low level is input to the input signal terminal IN of the delay element, a signal of a high level is input to the input terminal PR of the precharge signal, and a signal of a low level is input to the inverted signal terminal XPR thereof, the pMOS transistor P2 and the nMOS transistor N1 are held in the conductive state, and the nMOS transistor N2 and the pMOS transistor P1 are held in the nonconductive state, therefore the node A is precharged by the power supply voltage VDD and held at the high level, and the output terminal OUT is held at the ground potential GND.

When the signal of the input terminal IN changes from a low level to a high level, the precharge signal changes from a high level to a low level, and the inverted signal thereof changes from a low level to a high level, the nMOS transistor N2 switches to the conductive state and the pMOS transistor P2 switches to the nonconductive state, therefore the node A is discharged and changes from a high level to a low level. According to the change of potential of the node A, the pMOS transistor P1 switches from the nonconductive state to the conductive state, and the nMOS transistor N1 switches to the nonconductive state by the precharge signal of a low level, therefore the output terminal OUT of the delay element is charged by the power supply voltage VDD and switches from a low level to a high level.

Such a change is sequentially propagated from the delay element DLY1A to the latter stage. After an elapse of a constant delay time of the falling edge of the input signal, the output signal OUTn of the delay element of the last stage rises from a low level to a high level.

Figure 12:
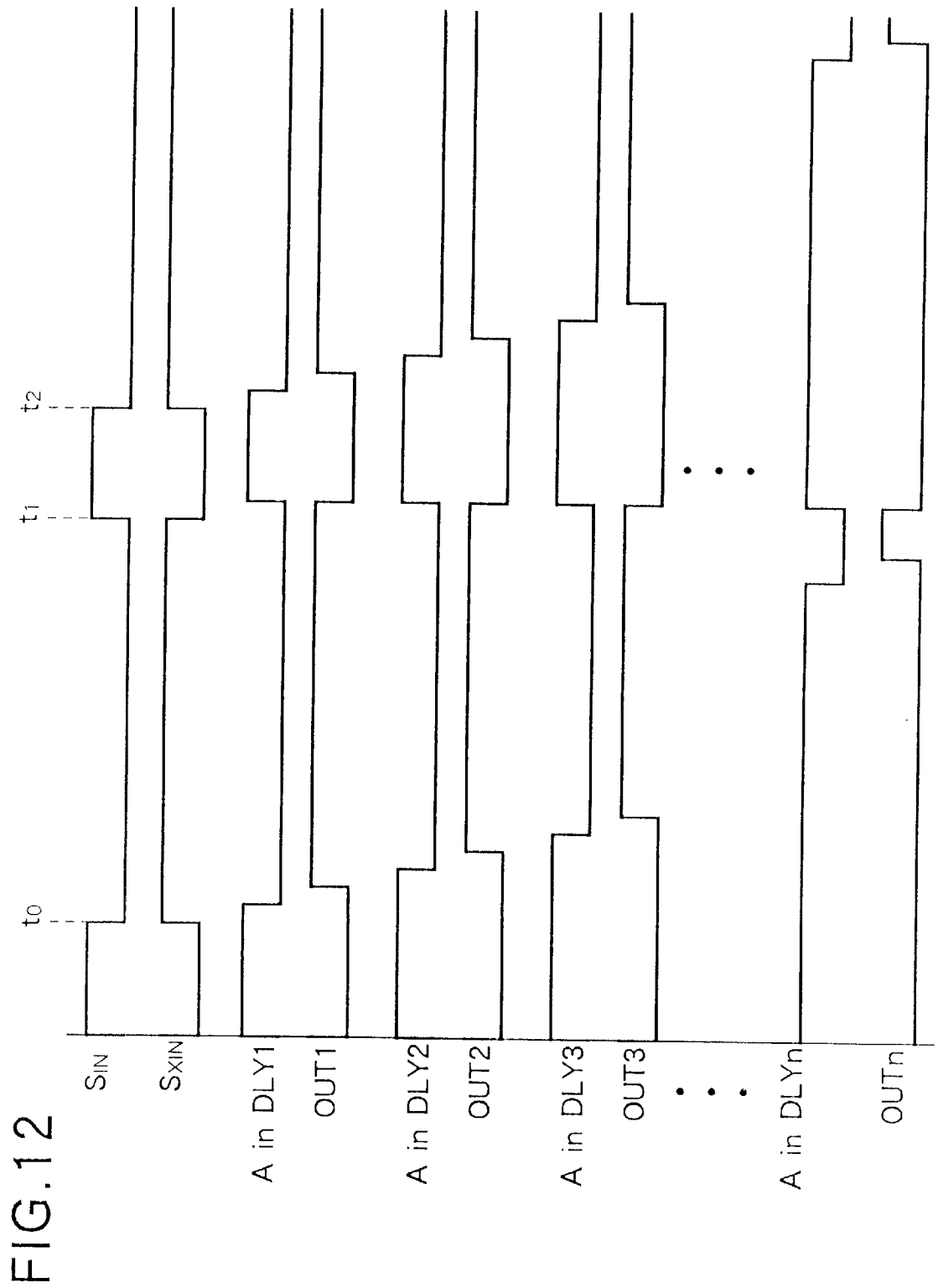
FIG. 12 is a waveform diagram of the delay circuit of the second embodiment.

FIG. 12 is a waveform diagram of the operation of the delay circuit shown in FIG. 10. Below, the operation of the delay circuit of the present embodiment will be explained by referring to FIG. 12.

As shown in FIG. 12, in the initial state, the input signal $S_{IN}$ is held at a high level, and the inverted signal $S_{XIN}$ thereof is held at a low level. In the delay elements DLY1A, DLY2A, . . . , and DLYnA, the node A is precharged to the power supply voltage VDD level, and the output signals OUT1, OUT2, . . . , and OUTn are held at a low level.

At the time $t_0$, the input signal $S_{IN}$ switches from a high level to a low level, and, simultaneously, the inverted signal $S_{XIN}$ switches from a low level to a high level. In the delay element DLY1A, the nMOS transistor N2 switches form the nonconductive state to the conductive state and the node A is discharged and switches to a low level. According to this, the pMOS transistor P1 switches from the nonconductive state to the conductive state, and the output terminal is charged by the power supply voltage VDD and switches from a low level to a high level. Namely, after an elapse of a constant delay time from the falling edge of the input signal $S_{IN}$, that is, the rising edge of the inverted signal $S_{XIN}$ thereof, the output signal OUT1 of the delay element DLY1A rises from a low level to a high level. In the delay elements DLY2A, DLY3A, . . . , and DLYnA existing at the latter stages of the delay element DLY1A, similarly, the delay signal is output with a predetermined delay time given with respect to the signal input to the input terminal IN.

Here, when assuming that each delay element gives the same delay time $t_D$ to the input signal, the output signals of the delay elements DLY1A, DLY2A, . . . , and DLYnA are given individual delay times of $t_D$, $2t_D$, . . . , and $nt_D$ with respect to the output signal. A delay time of $nt_D$ at a maximum is given from the n number of gates of delay elements with respect to the input signal $S_{IN}$.

At the time $t_1$, the input signal $S_{IN}$ switches from a low level to a high level, and the inverted signal $S_{XIN}$ thereof switches from a high level to a low level. According to this, in the delay element DLY1A, the node A changes from a low level to a high level, and the output terminal OUT changes from a high level to a low level.

In the other delay elements DLY2A, DLY3A, . . . , and DLYnA, at the instant when the input signal $S_{IN}$ switches to a high level and the inverted signal $S_{XIN}$ thereof switches to a low level, all of the transistors P1, P2, N1, and N2 become the conductive state, and an instantaneous through current flows through these transistors. However, as mentioned above, since the transistors are formed with different sizes and also the driving capabilities are different, the potential of the node A rises in the delay elements DLY2A, DLY3A, . . . , and DLYnA without waiting for the successive propagation the change of status of the delay element DLY1A of the initial stage and the potential of the output terminal falls. The change of this potential will further weaken the driving capabilities of the nMOS transistor N1 and the pMOS transistor P1. As a result, all of the delay elements DLY1A, DLY2A, . . . , and DLYnA substantially simultaneously change without waiting for the signal change of the delay element DLY1A of the initial stage, and all output signals OUT1, OUT2, . . . , and OUTn are substantially simultaneously switched to a low level.

Then, at the time $t_2$, the input signal $S_{IN}$ changes from a high level to a low level. According to this, by the delay elements, the output signals OUT1, OUT2, . . . , and OUTn change from a low level to a high level after the elapse of individual delay times.

Figure 3:
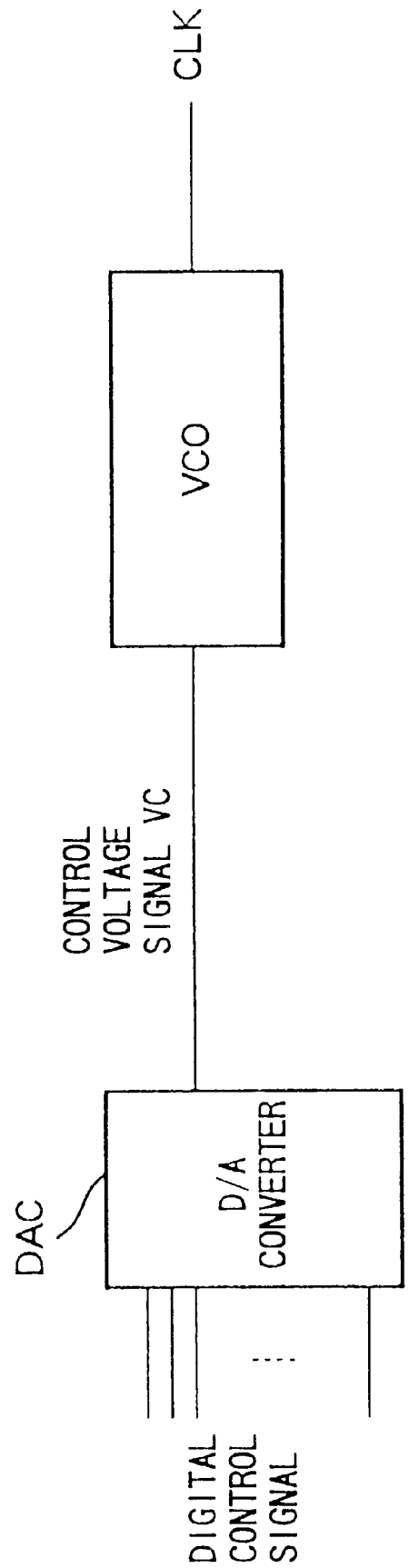
FIG. 3 is a circuit diagram of a conventional frequency variable oscillator circuit comprising DAC and VCO.
Figure 4:
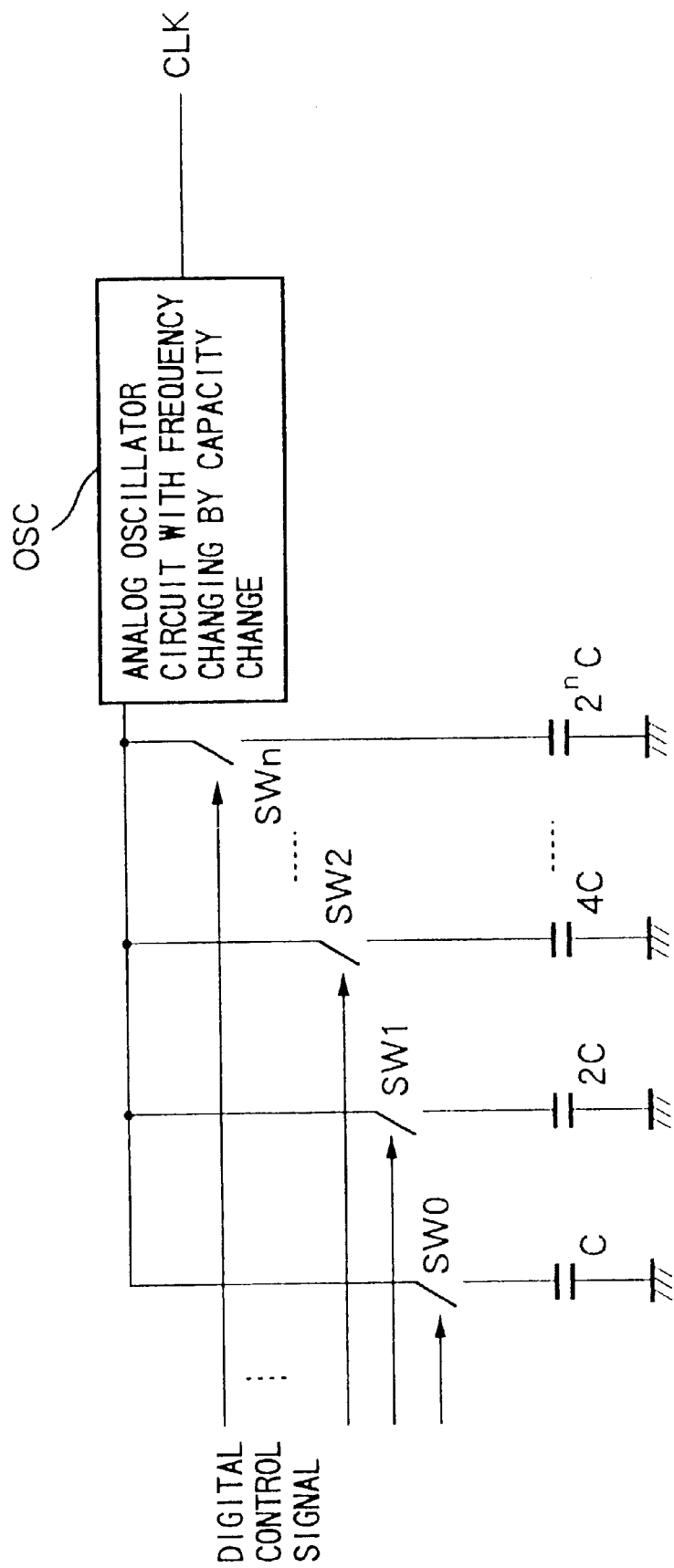
FIG. 4 is a circuit diagram of a conventional frequency variable oscillator circuit comprising switches and capacity elements.
Figure 5:
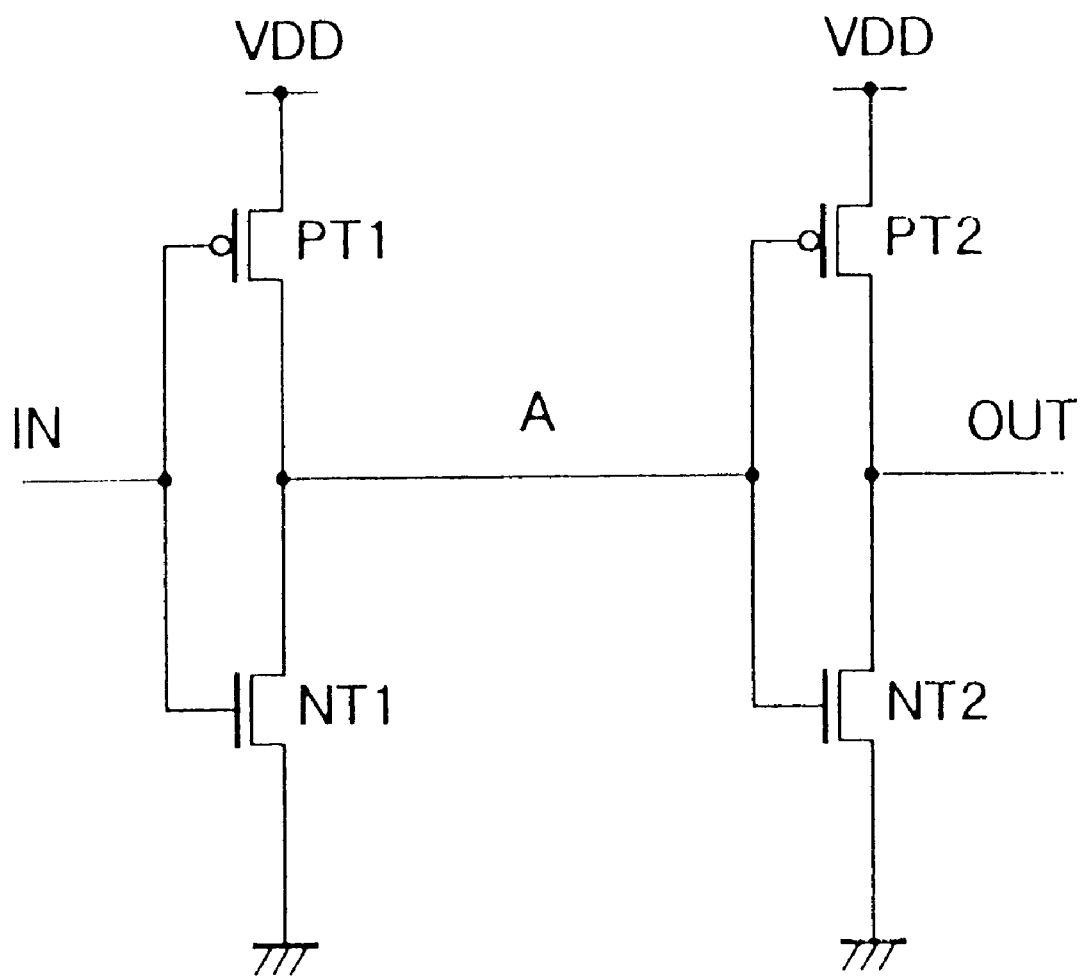
FIG. 5 is a circuit diagram of a conventional delay element comprising inverters.
Figure 13:
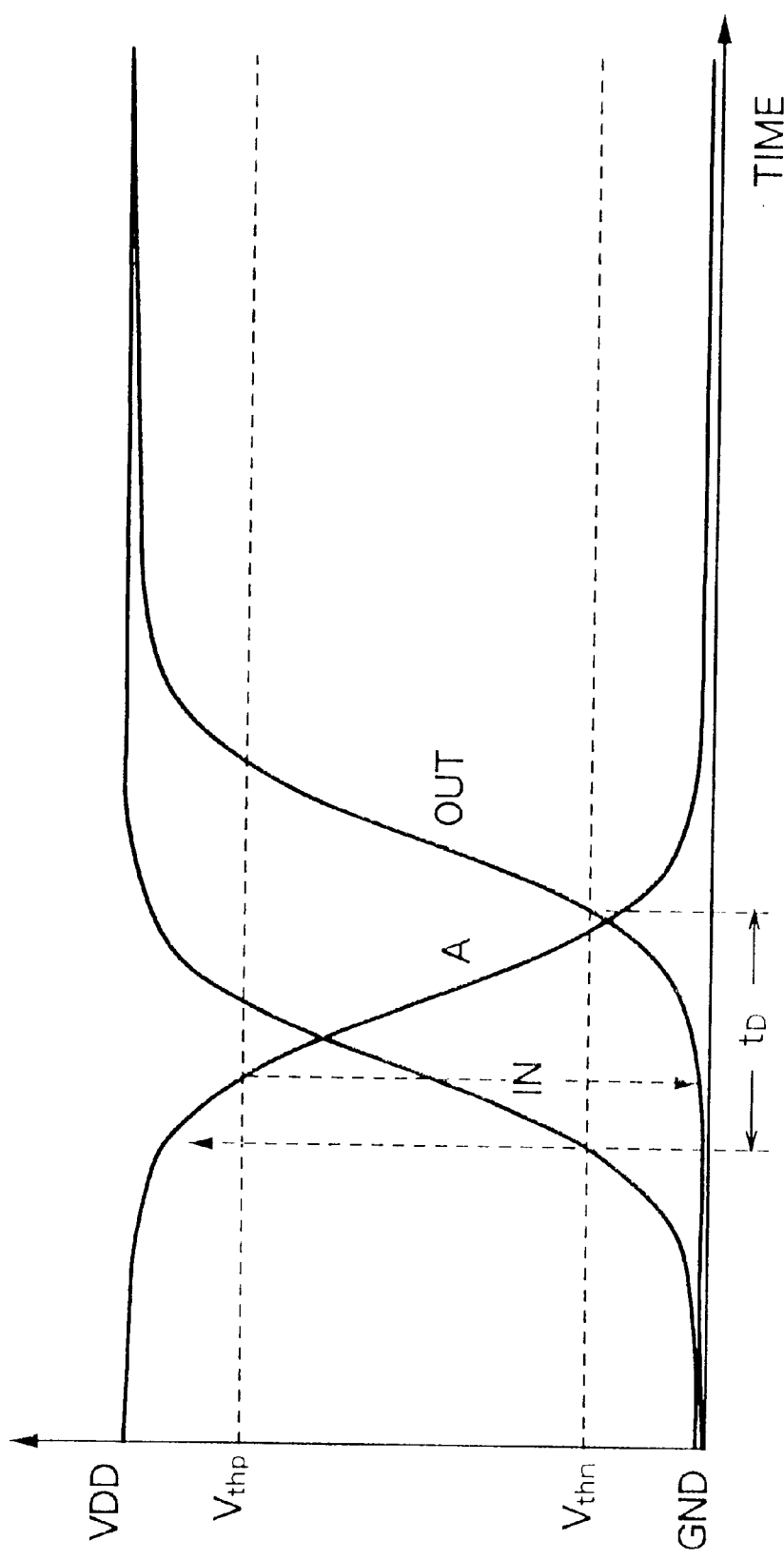
FIG. 13 is a waveform diagram of the delay time of the delay element.

FIG. 13 shows the waveforms at the time of change of the state of the delay elements shown in FIG. 11. This view indicates the level change of the node A and the output terminal OUT when the input signal of the delay element changes from a low level to a high level. Note that, here, the precharge signal input terminal PR of the delay element is held at a low level, and the input terminal XPR of the inverted signal thereof is held at a high level. Further, the waveform diagram of FIG. 3 shows the delay operation of the delay element defining a so-called precharge state, that is, a state where the node A is precharged by the power supply voltage VDD and held at a high level and the output terminal OUT is held at a low level, as the initial state.

As illustrated, when the input terminal IN is held at a low level, the node A is held at a high level and the output terminal OUT is held at a low level. When the level of the signal supplied to the input terminal IN rises and exceeds the threshold voltage $V_{thn}$ of the illustrated nMOS transistor N1, the potential of the node A changes from a high level to a low level. When the potential of the node A becomes lower than the threshold voltage $V_{thp}$ of the pMOS transistor P1, the pMOS transistor P1 becomes a conductive state and the potential of the output terminal OUT rises and finally reaches the power supply voltage VDD level.

Figure 6:
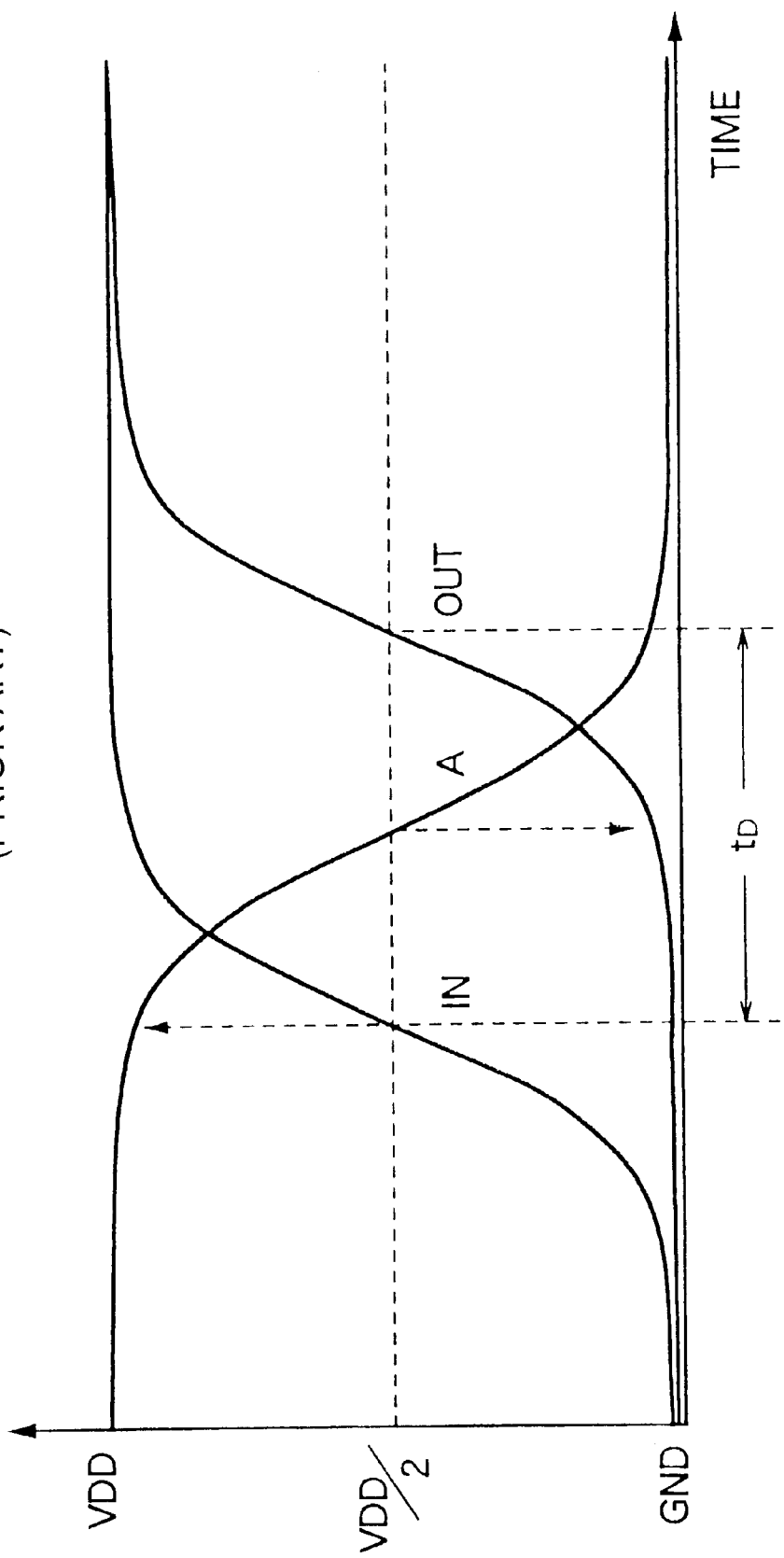
FIG. 6 is a waveform diagram showing the delay time of the conventional delay element.

The delay time $t_D$ of the delay element operating in this way is as shown in FIG. 13. It will be understood that the delay time of the delay element of the present embodiment is shorter when compared with the operating waveform of the delay element constituted by connecting two stages of inverters of the prior art shown in FIG. 6.

In the delay element of the present embodiment, only the gate of one transistor of the delay element of a latter stage is connected to the output terminal of the former stage, and the load capacity of the output terminal of each delay element is small. In the conventional delay element, gates of two transistors of the delay element of a latter stage are connected to the output terminal of the former stage, and the load capacity of the delay element is large. Further, in the usual inverter, when the input signal voltage substantially reaches the level of a half of the power supply voltage VDD, the output signal level changes, but in the delay element of the present embodiment, the level of the output terminal changes at the threshold voltages $V_{thp}$ and $V_{thn}$ of the transistors. For these reasons, the delay time of the delay element of the present embodiment is smaller than the delay time of the delay element constituted by inverters of the related art. Fine adjustment of the delay time is possible in accordance with this.

As explained above, according to the present embodiment, when a plurality of delay elements are connected in series to constitute a delay circuit, each delay element is constituted by a pMOS transistor P1 and an nMOS transistor N1 having a larger driving capability than this and by an nMOS transistor N2 and a pMOS transistor P2 having a larger driving capability than this, the input signal is supplied to the gate of the nMOS transistor N2, the gate of the pMOS transistor P2 is connected to the inverted signal input terminal XPR of the precharge signal, the gate of the nMOS transistor N1 is connected to the input terminal PR of the precharge signal, the gate of the pMOS transistor P1 is connected to the intermediate node A comprising drains of P2 and N2, the inverted signal $S_{XIN}$ of the input signal is input to each delay element as the inverted signal of the precharge signal, and the input signal $S_{IN}$ is held at a high level, the node A is at a high level, the output terminal OUT is in a low level state, the falling edge of the input signal $S_{IN}$, that is, the rising edge of the inverted signal $S_{XIN}$, is sequentially propagated by the delay elements, and the delay signal OUTn is obtained from the output terminal of the delay circuit, therefore the delay circuit can be formed by a simple circuit configuration and a delay time with a small delay step width is obtained.

Third Embodiment

Figure 14:
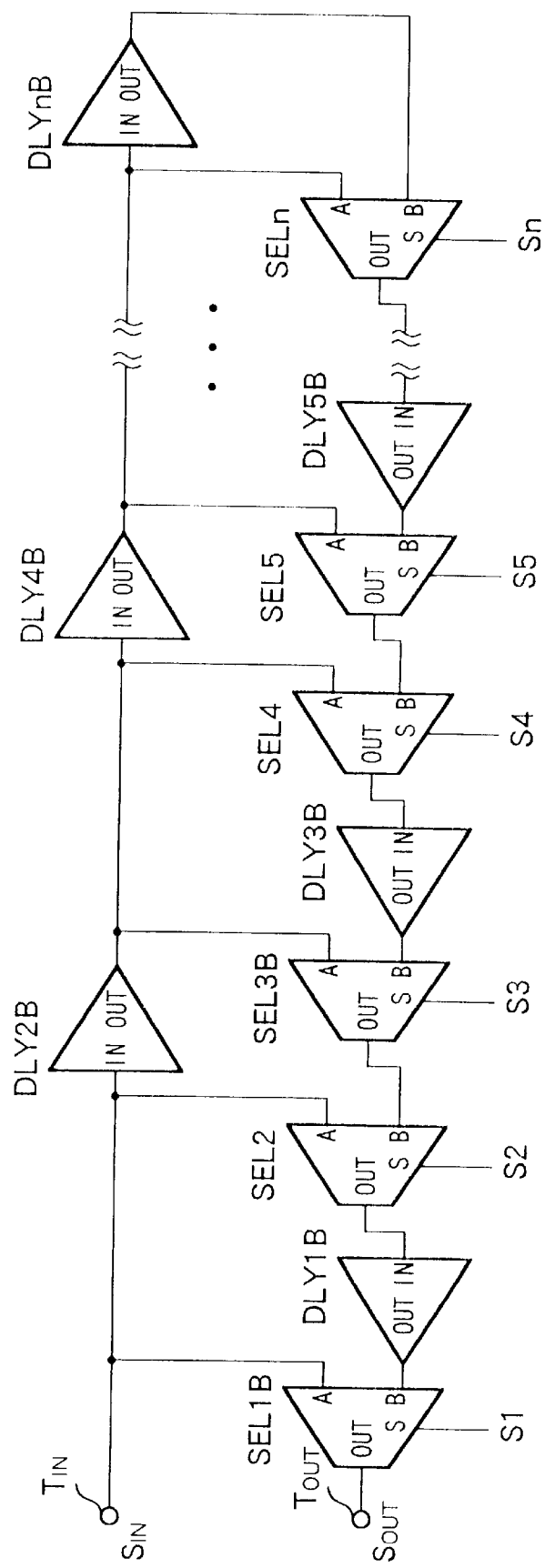
FIG. 14 is a circuit diagram of a third embodiment of the delay circuit according to the present invention.

FIG. 14 is a circuit diagram of a third embodiment of a delay circuit according to the present invention.

In the present embodiment, a ladder-type variable delay circuit is constituted by delay elements DLY1B, DLY2B, . . . , and DLYnB and selectors SEL1, SEL2, . . . , and SELn. The delay elements DLY1B, DLY2B, . . . , and DLYnB are comprised for example of delay elements having an amplification function and not having logical signal values of inputs and outputs which are inverted. The selectors SEL1, SEL2, . . . , and SELn each select one of two signals input to the input terminals A and B in accordance with the delay control signals S1, S2, . . . , and Sn and output the same to the output terminal OUT.

As shown in FIG. 14, two routes, that is, an outgoing and returning route, are constituted by the delay elements DLY1B, DLY2B, . . . , and DLYnB and the selectors SEL1, SEL2, . . . , and SELn. The input terminal A of the selector SEL1 is connected to the input terminal $T_{IN}$ of the signal $S_{IN}$, and the input terminal B is connected to the output terminal of the delay element DLY1B. The input terminal of the delay element DLY1B is connected to the output terminal of the selector SEL2. The input terminal A of the selector SEL2 is connected to the input terminal $T_{IN}$, and the input terminal B is connected to the output terminal of the selector SEL3.

The input terminal of the delay element DLY2B is connected to the input terminal $T_{IN}$ together with the input terminal A of the selector SEL2. The input terminal A of the selector SEL3 is connected to the output terminal of the delay element DLY2B, and the input terminal B is connected to the output terminal of the delay element DLY3B. The input terminal of the delay element DLY3B is connected to the output terminal of the selector SEL4. The input terminal A of the delay element DLY4B is connected to the output terminal of the delay element DLY2, and the input terminal B is connected to the output terminal of the delay element DLY5B.

The parts after the delay circuit are similarly constituted by connecting the delay elements and selectors.

Here, it is assumed that the selectors SEL1, SEL2, . . . , and SELn select the signals of the input terminals A and output the same to the output terminals OUT when the delay control signals S1, S2, . . . , and Sn are at a low level and select the signals of the input terminals B and output the same to the output terminals OUT when they are at a high level. In such a delay circuit, the turnabout point of the input signal $S_{IN}$ is determined in accordance with digital signals, that is, the delay control signals S1, S2, . . . , and Sn, and the delay time of the output signal $S_{OUT}$ is controlled with respect to the input signal $S_{IN}$.

For example, where the delay control signals S1 to S4 are at a high level, and S5 is at a low level, the input signal $S_{IN}$ is delay at the delay element DLY2B and input to the input terminal A of the selector SEL4. By the selector SEL4, the output signal of the delay element DLY2B is selected and input to the delay element DLY3B. Further, this is output through the route comprising the selectors SEL3 and SEL2, the delay element DLY1B, and the selector SEL1 to the output terminal $T_{OUT}$ as the output signal $S_{OUT}$. Note that, the signals S6 to Sn after the delay control signal S6 do not exert an influence upon the delay time of the delay circuit, therefore can be set to any values.

By setting bits of the delay control signals S1, S2, . . . , and Sn in this way, the delay time of the delay circuit becomes the total of the delay times of the delay elements DLY1B, DLY2B, DLY3B, and DLY4B.

By setting the bits of the delay control signals S1, S2, . . . , and Sn in accordance with a required delay time, a delay signal $S_{OUT}$ given a predetermined delay time is obtained from the output terminal $T_{OUT}$. For example, where the delay time of m number of stages of delay elements is necessary, if S1 to Sm among the delay control signals are set to a high level and Sm+1 is set to a low level, the output signal $S_{OUT}$ from the output terminal $T_{OUT}$ of the delay circuit becomes the delay signal delayed by the total delay time of m number of stages of delay elements with respect to the input signal $S_{IN}$.

Figure 1:
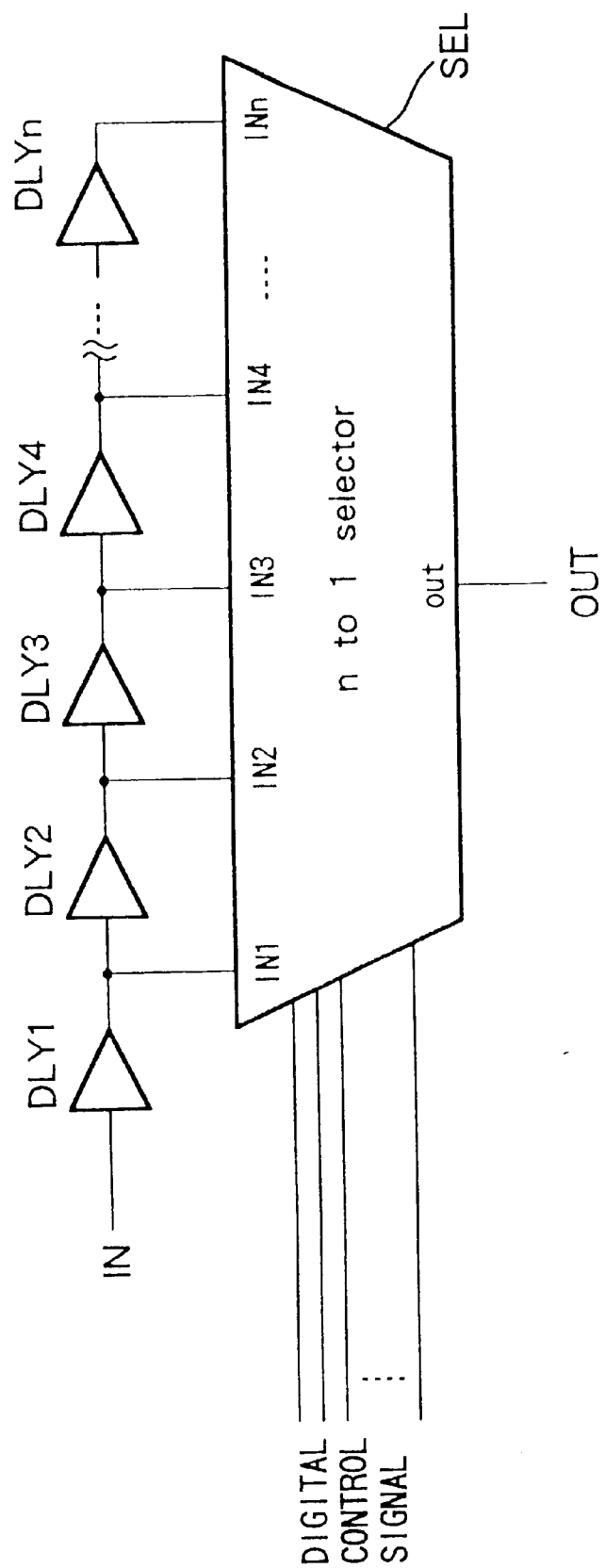
FIG. 1 is a circuit diagram of a conventional variable delay circuit.
Figure 2:
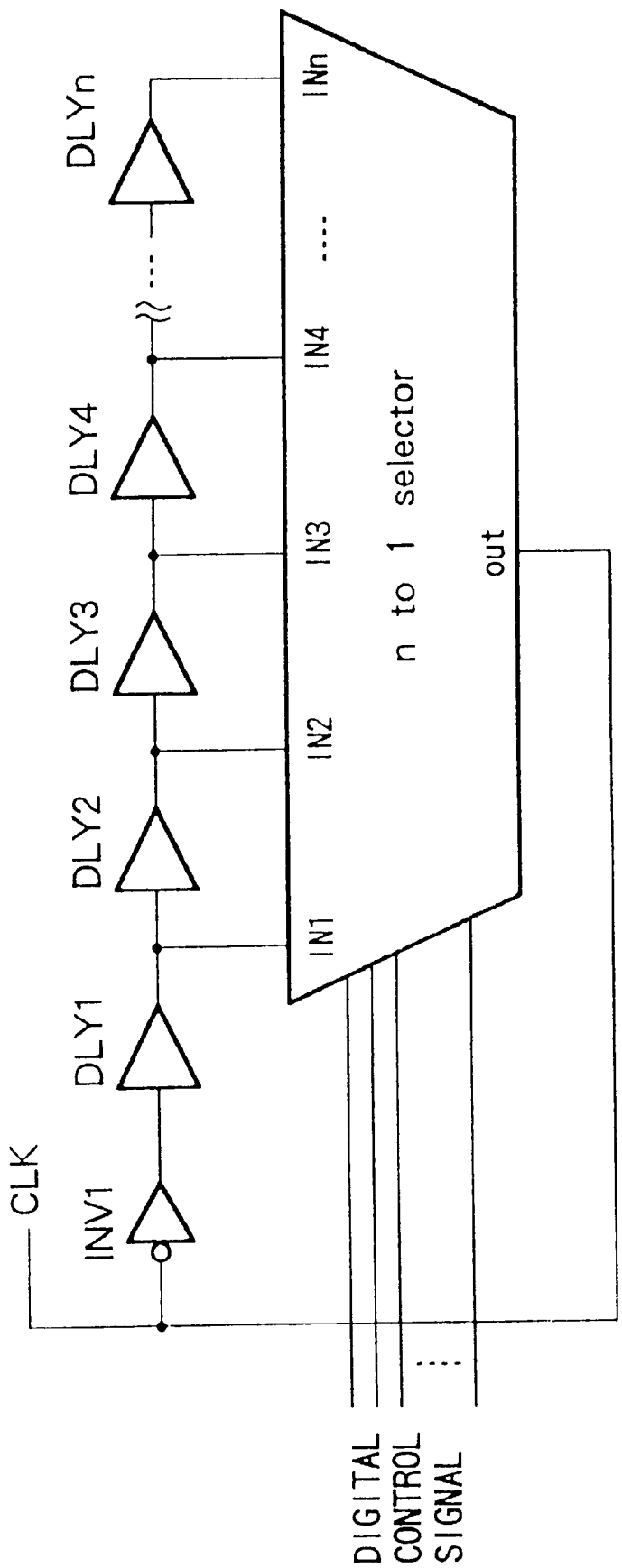
FIG. 2 is a circuit diagram of a conventional frequency variable oscillator circuit.

When compared with the conventional variable delay circuit shown in FIG. 1, in the variable delay circuit of the present embodiment, the minimum delay time is not influenced by the number of delay steps and the linear characteristic of the delay control signal and delay time is good. For example, when the delay time is controlled by an n-input and 1-output selector as in the conventional variable delay circuit, if the maximum number n of delay steps is made large, the circuit configuration and amount of delay of the selector part change and the minimum delay time becomes big. In order to obtain a circuit not changing the minimum delay time, the wiring length and the number of gate stages required for the selector become different between the delay selection route of the initial stage and the delay selection route of the latter stage according to the increase of the maximum number n of delay steps and the linear characteristic of the delay time with respect to the delay control signal is deteriorated.

According to the present embodiment, since the delay elements DLY1B, DLY2B, . . . , and DLYnB and selectors SEL1, SEL2, . . . , and SELn are connected in the form of a ladder, the selectors are controlled by the delay control signals S1, S2, . . . , and Sn input to the selectors, and the delay time of the delay circuit is controlled by changing the route of the signal propagation, an increase or decrease of the number of delay steps can be easily dealt with by repetition of the same circuit. Further, the maximum number n of delay steps does not exert an influence upon the minimum delay time, and the linear characteristic of the delay time with respect to the delay control signal is held constant. Further, the input/output position of the signal on the chip is fixed and it is easy to design and modify the circuit.

Fourth Embodiment

Figure 15:
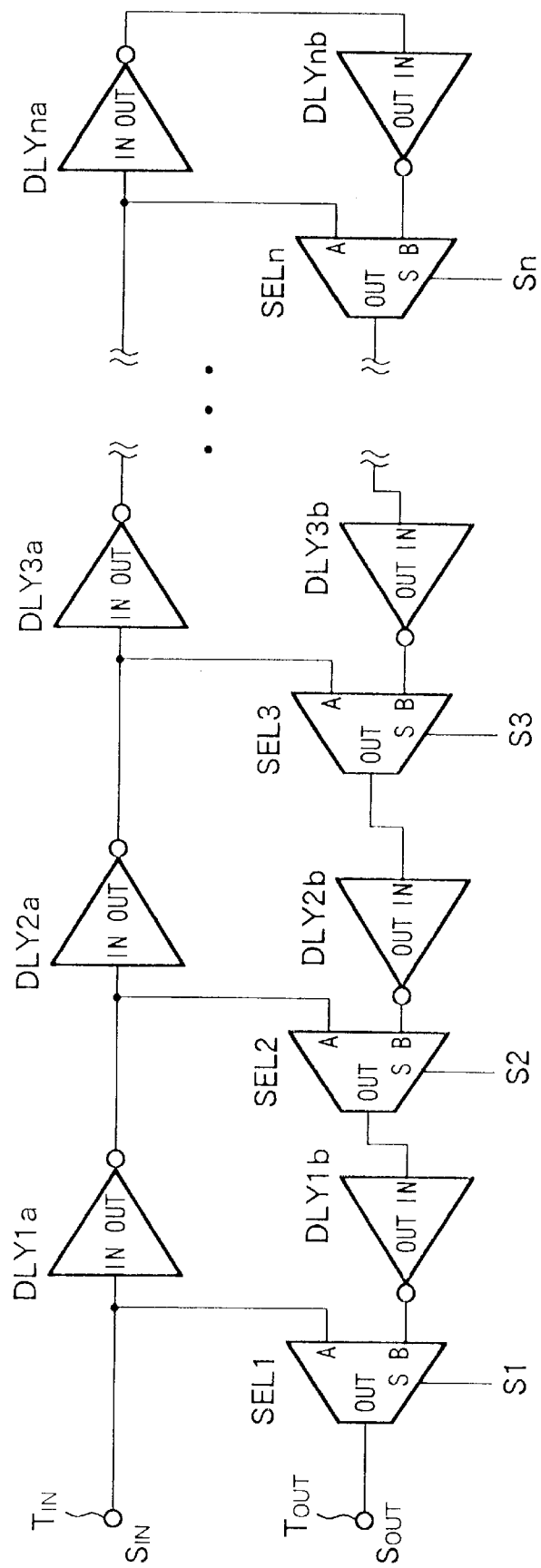
FIG. 15 is a circuit diagram of a fourth embodiment of the delay circuit according to the present invention.

FIG. 15 is a circuit diagram of a fourth embodiment of a delay circuit according to the present invention.

In the present embodiment, a ladder type variable delay circuit is constituted by the delay elements DLY1a, DLY1b, DLY2a, DLY2b, . . . , DLYna and DLYnb and the selectors SEL1, SEL2, . . . , and SELn. The delay elements DLY1a, DLY1b, . . . , DLYna and DLYnb are comprised for example of delay elements having an amplification function and having logical signal values of inputs and outputs which are inverted. The selectors SEL1, SEL2, . . . , and SELn select one of two signals input to the input terminals A and B in accordance with the delay control signals S1, S2, . . . , and Sn and output them to the output terminals OUT.

As shown in FIG. 15, two routes, that is, an outgoing and returning route, are constituted by the delay elements DLY1a, DLY1b, DLY2a, DLY2b, . . . , DLYna and DLYnb and the selectors SEL1, SEL2, . . . , and SELn. The input terminal A of the selector SEL1 is connected to the input terminal $T_{IN}$ of the signal $S_{IN}$ together with the input terminal of the delay element DLY1a, and the input terminal B is connected to the output terminal of the delay element DLY1b. The input terminal of the delay element DLY1b is connected to the output terminal of the selector SEL2. The input terminal A of the selector SEL2 is connected to the output terminal of the delay element DLY1a, and the input terminal B is connected to the output terminal of the delay element DLY2b.

Each stage after the delay circuit has a similar structure, and a ladder type delay circuit is constituted by the delay elements and selectors.

Here, it is assumed that the selectors SEL1, SEL2, . . . , and SELn select the signals of the input terminals A and output the same to the output terminals OUT when the delay control signals S1, S2, . . . , and Sn are at a low level and select the signals of the input terminals B and output the same to the output terminal OUT when they are at a high level. In such a delay circuit, the turnaround point of the input signal $S_{IN}$ is determined in accordance with digital signals, that is, the delay control signals S1, S2, . . . , and Sn, and the delay time of the output signal $S_{OUT}$ is controlled with respect to the input signal $S_{IN}$.

For example, where a delay time of an amount of four stages of delay elements is necessary, by setting the S1 and S2 among the delay control signals S1, S2, . . . , Sn at a high level and setting the signal S3 at a low level, the signal $S_{IN}$ input to the input terminal $T_{IN}$ is turned around via the delay elements DLY1a and DLY2a by the selector SEL3 and output to the output terminal $T_{OUT}$, therefore the delay time of the delay circuit becomes the total of the delay times of the delay elements DLY1a, DLY2a, DLY2b, DLY1b.

In general, when a delay time of an amount of 2m number of stages of delay elements is necessary, by setting the delay control signals S1 to Sm at a high level and setting the delay control signal Sm+1 at a low level, a desired delay time is obtained by the delay circuit.

As explained above, according to the present embodiment, since the delay elements DLY1a, DLY1b, DLY2a, DLY2b, . . . , DLYna and DLYnb and the selectors SEL1, SEL2, . . . , and SELn are connected in the form of a ladder, the selectors are controlled by the delay control signals S1, S2, . . . , and Sn input to the selectors, and the delay time of the delay circuit is controlled by changing the route of the signal propagation, an increase or decrease of the number of delay steps can be easily dealt with by the repetition of the same circuit. Further, the maximum number n of delay steps does not exert an influence upon the minimum delay time, the linear characteristic of the delay time with respect to the delay control signal is held uniform, and the input/output position of the undelayed signal on the chip can be fixed.

Fifth Embodiment

Figure 16:
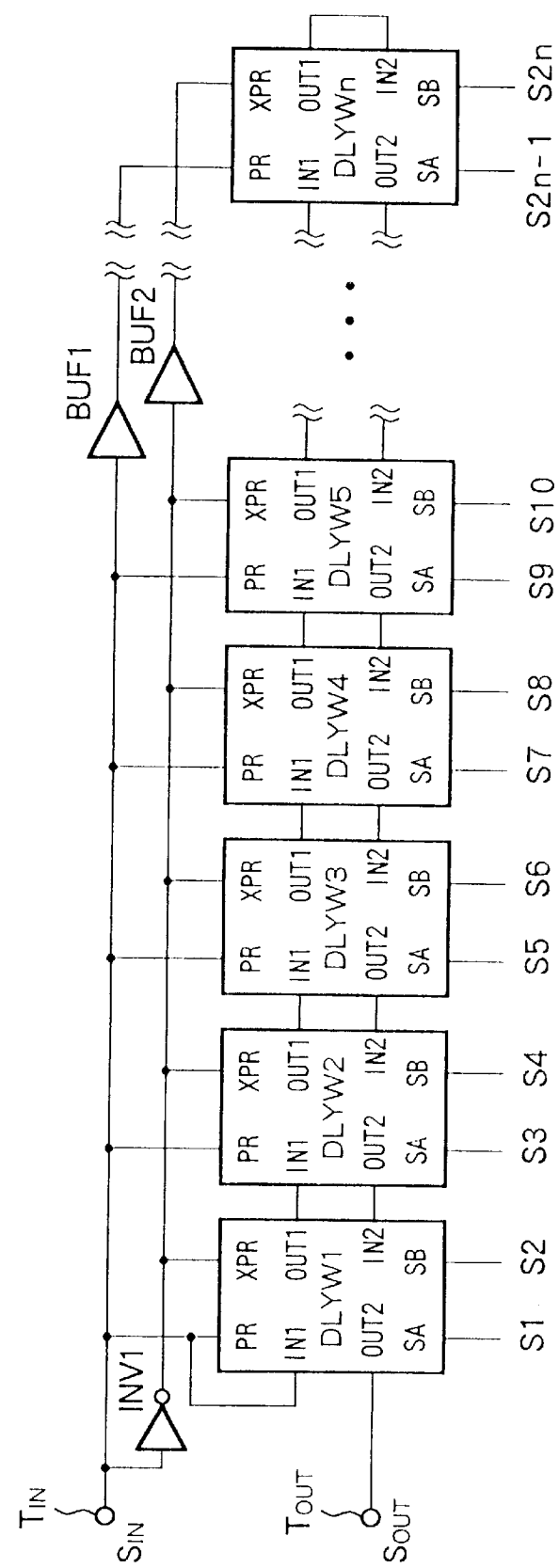
FIG. 16 is a circuit diagram of a fifth embodiment of the delay circuit according to the present invention.

FIG. 16 is a circuit diagram of a fifth embodiment of a delay circuit according to the present invention.

The delay circuit of the present embodiment is constituted by n number of stages of delay elements DLYW1, DLYW2, . . . , and DLYWn. Each of the delay elements DLYW1, DLYW2, . . . , and SLYWn is provided with a precharge signal input terminal PR, an inverted signal input terminal XPR thereof, signal input terminals IN1 and IN2, and delay signal output terminals OUT1 and OUT2.

The precharge signal input terminal PR of each delay element is connected to the input terminal $T_{IN}$ of the delay circuit, and the inverted signal input terminal XPR thereof is connected to the output terminal of the inverter INV1. The input terminal of the inverter INV1 is connected to the input terminal $T_{IN}$ of the delay circuit. Note that the buffers BUF1 and BUF2 amplify the input signal $S_{IN}$ and the inverted signal thereof and hold the level of the precharge signal supplied to the delay element arranged far away from the input terminal $T_{IN}$ and output terminal of the inverter INV1 and the inverted signal thereof constant.

The output terminal OUT1 of the delay element DLYW1 is connected to the input terminal IN1 of the delay element DLYW2, the input terminal IN2 of the delay element DLYW1 is connected to the output terminal OUT2 of the delay element DLYW2, and the output terminal OUT2 is connected to the output terminal $T_{OUT}$ of the delay circuit.

The output terminal OUT 1 of the delay element DLYW2 is connected to the input terminal IN1 of the delay element DLYW3, and the input terminal IN2 is connected to the output terminal OUT2 of the delay element DLYW3.

The delay elements of the delay stages after the delay element DLYW3 are similarly connected. In the delay element DLYWn constituting the final stage, the output terminal OUT1 is connected to the input terminal IN2.

In this way, the delay circuit is constituted by the delay elements DLYW1, DLYW2, . . . , and DLYWn. The delay circuit has two, that is, and upper and a lower, signal propagation routes. The signals are propagated from the left to right in the upper propagation route, while the signals are propagated from the right to left in the lower propagation route. Delay control signals S1, S2, S3, S4, . . . ,S2n-1 and S2n are input to the delay elements, the turnaround point of signals in the delay circuit is set in accordance with these delay control signals, the propagation route of signals is controlled, and the delay time of the output signal $S_{OUT}$ with respect to the input signal $S_{IN}$ is controlled.

Figure 17:
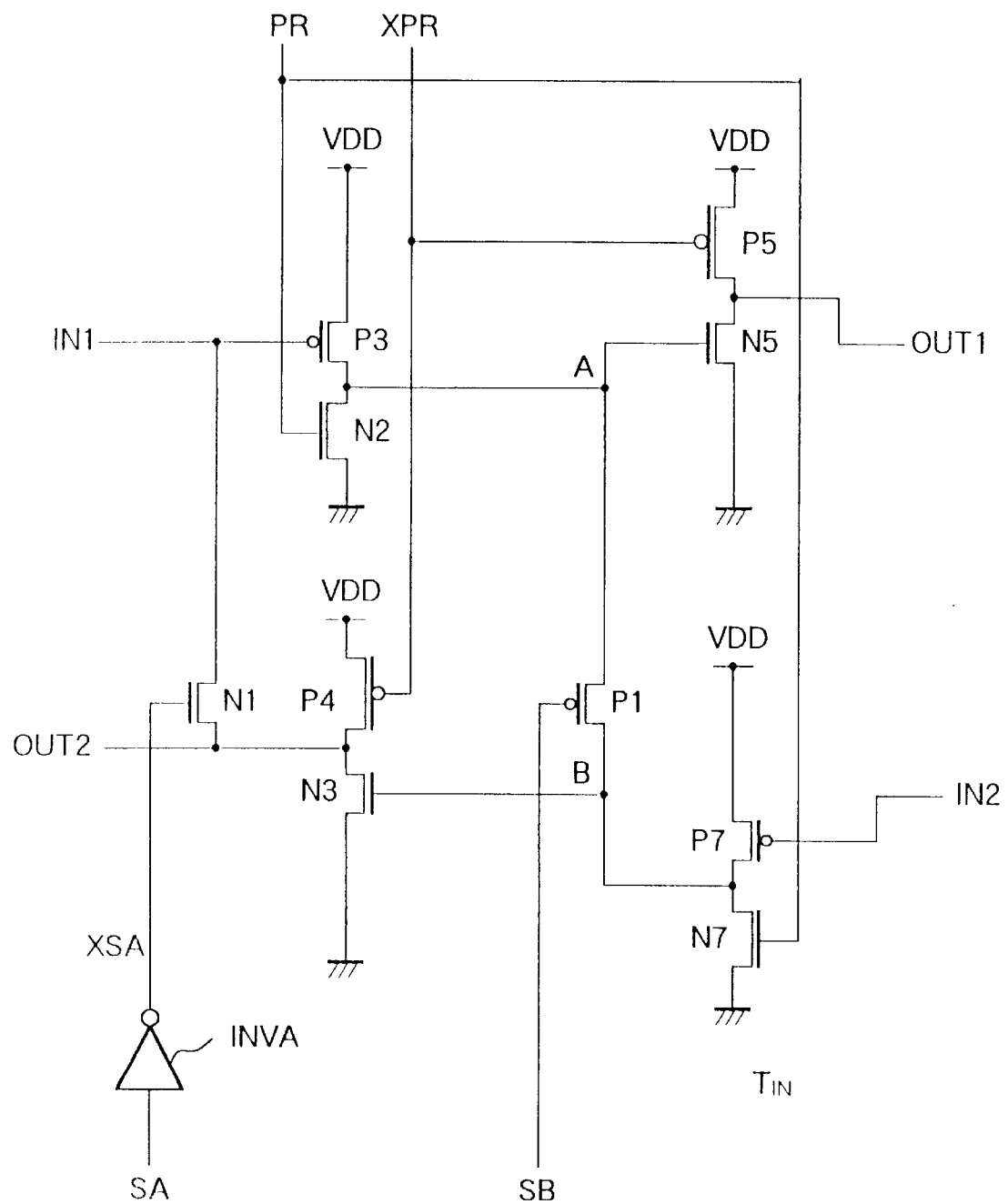
FIG. 17 is a circuit diagram of the delay element constituting the delay circuit of the fifth embodiment.

FIG. 17 shows an example of the configuration of a delay element. As illustrated, the delay element of the present example is constituted by vertically arranging two stages of the delay elements of the first embodiment of the present invention shown in FIG. 8. In the part of the upper stage, a predetermined delay time is given to the signal input to the input terminal IN1 and output to the output terminal OUT1, while in the part of the lower stage, the predetermined delay time is given to the signal input to the input terminal IN2 and this is output to the output terminal OUT2. Further, and nMOS transistor N1 is connected between the input terminal of the upper stage and the output terminal OUT2 of the lower stage, while a pMOS transistor P1 is connected between the intermediate node A of the upper stage and the intermediate node B of the lower stage.

The gate of the nMOS transistor N1 is connected to the output terminal of the inverter INVA, and the input terminal of the inverter INVA is connected to the input terminal of the delay control signal SA. The gate of the pMOS transistor P1 is connected to the input terminal of the delay control signal SB.

When the delay control signal SA is held at a high level, a signal of a low level is supplied to the gate of the nMOS transistor N1, the nMOS transistor N1 is held in the nonconductive state, and the signal input to the input terminal IN1 is delayed by the predetermined delay time via the intermediate node A and then propagated to the output terminal OUT1.

On the other hand, when the delay control signal SA is held at a low level, a signal of a high level is supplied to the gate of the nMOS transistor N1, and the nMOS transistor N1 is held in the conductive state, therefore the signal input to the input terminal IN1 is output to the output terminal OUT2 as it is without passing through the delay element.

When the delay control signal SB is held at a high level, the pMOS transistor P1 is held in the nonconductive state, the signal of the node A is output to the output terminal OUT1 in the circuit of the upper stage, and the signal input to the input terminal IN2 is output via the intermediate node B to the output terminal OUT2 in the circuit of the lower stage.

On the other hand, when the delay control signal SB is held at a low level, the pMOS transistor P1 is held in the conductive state, the intermediate node A of the upper stage and the intermediate node B of the lower stage are made conductive, and the signal of the intermediate node A of the upper stage is propagated to the intermediate node B of the lower stage and output to the output terminal OUT2 of the lower stage.

In this way, by setting the levels of the delay control signals SA and SB input to the delay element, the propagation or turn around operation of the signal in the delay elements in controlled, and one delay element commonly has both functions of signal delay and selection. Below, an explanation will be made of the operation of the delay circuit of the present embodiment by referring to FIGS. 16 and 17.

Before the delay circuit operates, the circuits of the upper stage and the lower stage are precharged in accordance with the respectively input precharge signals and inverted signals thereof. The falling edge of the signal input to the input terminal is propagated to the output terminal after receiving individual predetermined delay times.

For example, in the delay element shown in FIG. 17, when both of the delay control signals SA and SB are held at a high level, the signal input to the input terminal IN1 in the circuit of the upper stage is output to the output terminal OUT1 after receiving a delay time. The change of the level of the signal at the time of discharge is transferred from the input terminal IN1 to the output terminal OUT1 of the upper stage, the change of the signal is returned via the circuit of the latter stage as shown in FIG. 16 and input to the input terminal IN2 of the lower stage, and the signal input to the input terminal IN2 in the circuit of the lower stage is output to the output terminal OUT1 after receiving the predetermined delay time.

When the delay control signal SA is held at a high level and SB is held at a low level, the intermediate node A of the upper stage and the intermediate node B of the lower stage are connected. In this case, the intermediate node A of the upper stage circuit switches from a low level to a high level in accordance with the falling edge of the signal input to the input terminal IN1 of the upper stage. The intermediate node B of the circuit of the lower stage similarly changes in level in accordance with this. The output terminal OUT2 of the lower stage changes from a high level of the precharge state to a low level of the discharge state in accordance with the level change of the intermediate node B. In this case, when the pMOS transistor P4 constituting part of the circuit of the lower stage, the pMOS transistor P5 constituting part of the circuit of the upper stage, the nMOS transistor N3 constituting part of the circuit of the lower stage, and the nMOS transistor N5 constituting part of the circuit of the upper stage are formed to have the same size, the delay time of the delay signal output to the output terminal OUT2 becomes the same as the delay time of an amount of one delay element shown in FIG. 8. When defining the delay time of the delay element shown in FIG. 8 as $t_D$, in this case, the delay time of the delay signal output from the output terminal OUT2 with respect to the signal input to the input terminal IN1 is $t_D$.

Thereafter, the level change of the intermediate node A of the upper stage is output to the outside via the output terminal OUT1, passes through the circuit of the lower stage, and is input to the input terminal IN2 of the lower stage as shown in FIG. 16. However, at this time, the intermediate node B of the lower stage has already become a high level, so the level of the node B does not change.

When the delay control signal SA is held at a low level, the input terminal IN1 of the upper stage and the output terminal OUT2 of the lower stage are connected and the signal input to the input terminal IN1 is output to the output terminal OUT2 without delay.

Namely, when both of the delay control signals SA and SB are held at a high level, the circuits of the upper stage and the lower stage operate as the delay elements and give a delay time of the amount of one delay element shown in FIG. 8 with respect to the input signal.

When the delay control signal SA is held at a high level and SB is held at a low level, a delay time of the amount of one delay element is given with respect to the signal input to the input terminal IN1 of the upper stage, and the delay signal is output to the output terminal OUT2 of the lower stage.

When the delay control signal SA is held at a low level, the signal input to the input terminal IN2 of the upper stage is not delayed and is output as is to the output terminal OUT2 of the lower stage.

In the delay circuit constituted by connecting the delay elements as shown in FIG. 16, by controlling the delay control signals S1, S2, S3, S4, . . . , S2n-1 and S2n input to the delay elements DLYW1, DLYW2, . . . , and DLYWn, the delay time of the delay circuit can be controlled. In the delay elements DLYW1, DLYW2, . . . , and DLYWn, the signal selection part controlling the propagation route of the signal is constituted by one transistor, so the configuration of the circuit is simplified.

As explained above, according to the present embodiment, since the delay circuit is constituted by an number of stages of delay elements each constituted by vertically arranging two stages of delay elements, the propagation route of signals in the delay circuit is changed in accordance with the delay control signal input to each delay element, the delay time of the delay circuit is controlled, and the signal selection circuit in each delay element can be constituted by one transistor, therefore both functions of the delay element and selection circuit can be realized by a simple circuit configuration, a reduction of the circuit size can be realized, the amount of delay of signals in the selection circuit can be suppressed to be small compared with the selection circuit constituted by logic circuits, and a delay circuit in which the linear characteristic of the delay control signal and delay time is excellent can be realized.

Sixth Embodiment

Figure 18:
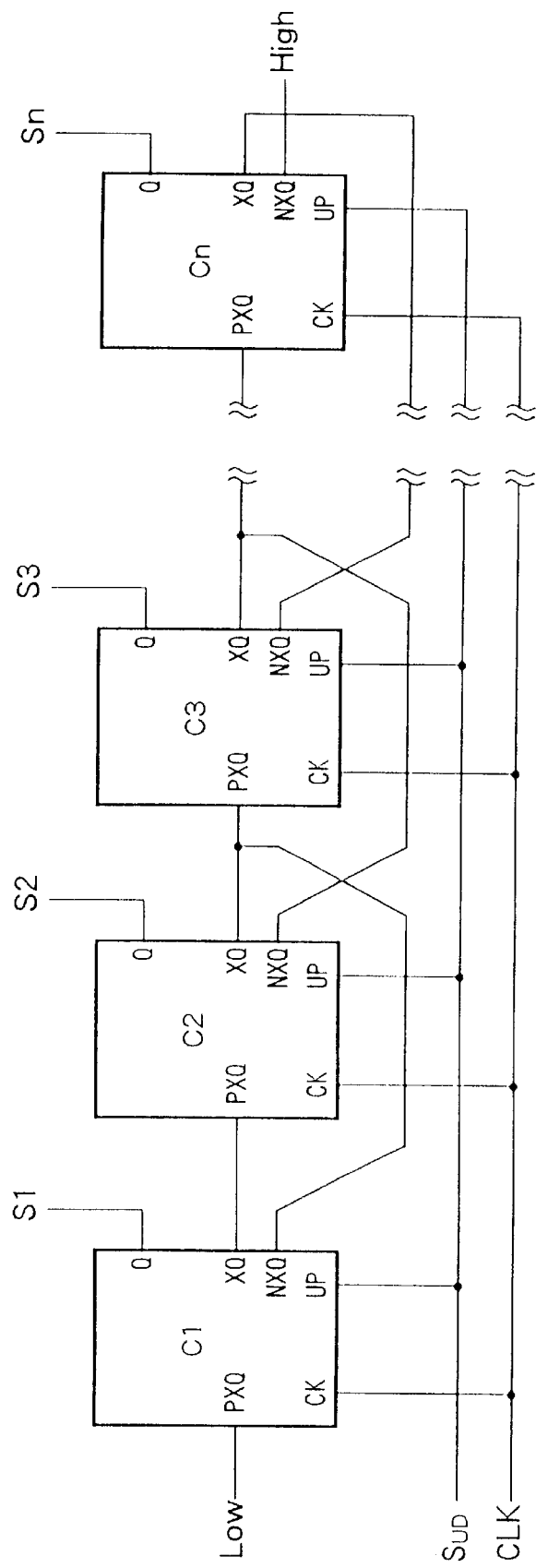
FIG. 18 is a circuit diagram of a delay control signal generation circuit.

FIG. 18 is a circuit diagram of a sixth embodiment of a delay circuit according to the present invention.

The present embodiment is a circuit for supplying delay control signals S1, S2, . . . , and Sn to the variable delay circuits of the third, fourth, and fifth embodiments explained above.

As explained above, the propagation route of signals in the delay circuit changes and the delay time is controlled according to the values of bits of the delay control signal supplied to the variable delay circuit. More specifically, the turn around point of the signal is determined by the bit which becomes the low level first in the order of the delay control signals S1, S2, . . . , and Sn. A delay time according to this is set.

Further, the delay control signals S1, S2, . . . , and Sn are sometimes generated in accordance with an up/down signal $S_{UD}$ instructing an increase or a decrease of the delay time in actual applications. FIG. 18 shows an example of such a delay control signal generation circuit.

As illustrated, the generation circuit of the present example generates the delay control signals S1, S2, . . . , and Sn for controlling the delay time of the variable delay circuit in accordance with the indication of the up/down signal $S_{UP}$ upon receipt of the up/down signal $S_{UD}$ and the clock signal CLK.

The delay control signal generation circuit is constituted by latch circuits C1, C2, . . . , and Cn. Each latch circuit receives the up/down signal $S_{UD}$ and clock signal CLK and further receives the inverted signal XQ of the output signal Q of the latch circuit of the former stage from the PXQ terminal and the inverted signal XQ of the latch circuit of the latter stage from the NXQ terminal, determines the next output by the result of a logical operation performed on these signals, and increases or decreases the delay control signal by only one stage of the number of delay steps for every cycle of clock signal CLK. Further, the PXQ terminal of the latch circuit C1 of the initial stage is held at a low level, for example, the ground potential GND, and the terminal NXQ of the latch circuit Cn of the final stage is held at a high level, for example, the power supply voltage VDD level.

Figure 19:
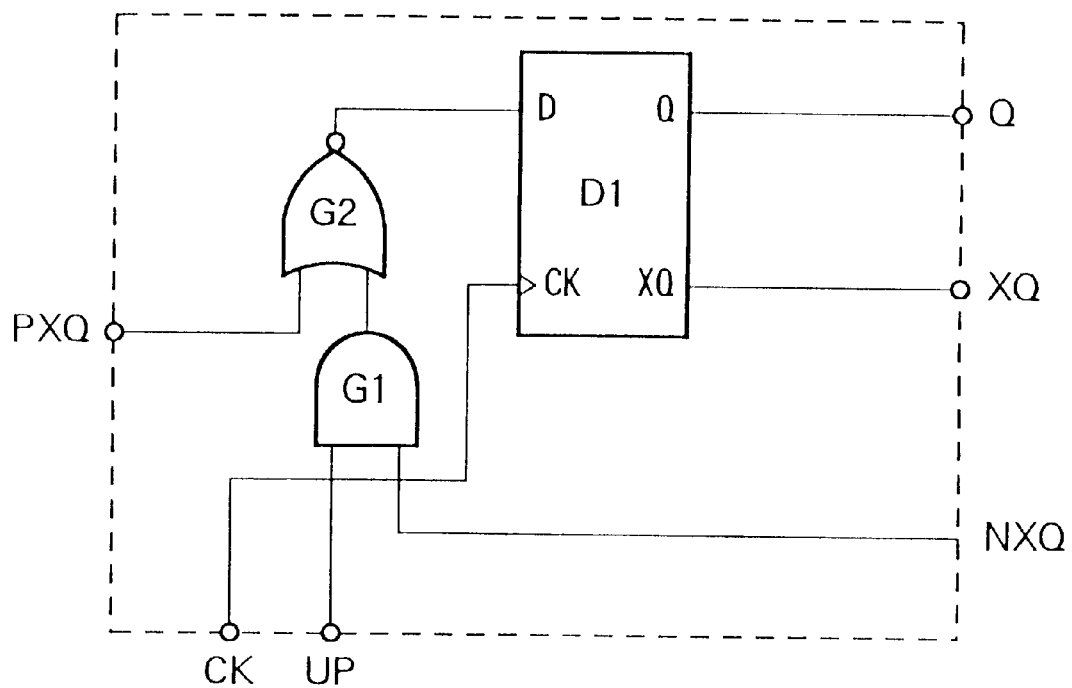
FIG. 19 is a circuit diagram of a delay signal generation element.

FIG. 19 shows an example of the configuration of the latch circuit. As illustrated, the latch circuit is constituted by an AND gate G1, a NOR gate G2, and a D flip-flop D1.

One input terminal of the AND gate G1 is connected to the input terminal UP of the up/down signal $S_{UD}$, while the other input terminal is connected to the input terminal NXQ of the inverted output signal of the latch circuit of the latter stage, and one input terminal of the NOR gate G2 is connected to the input terminal PXQ of the inverted output signal of the latch circuit of the former stage, while the other input terminal is connected to the output terminal of the AND gate G1. The signal input terminal D of the D flip-flop is connected to the output terminal of the NOR gate G2, while the clock signal input terminal is connected to the input terminal CK of the clock signal CLK. One bit of the delay control signal is output from the output terminal Q of the D flip-flop, while the inverted signal thereof is output from the output terminal XQ.

Here, it is assumed that the up/down signal $S_{UD}$ is set at a low level by an external control circuit where the delay time of the delay circuit is to be increased, while the up/down signal $S_{UD}$ is set at a high level where the delay time is to be reduced. In the delay control signal generation circuit shown in FIG. 18, only one latch circuit outputs a signal of a low level, while the other latch circuit outputs a signal of a high level.

For example, as the initial state, it is assumed that S1 to Sx among the delay control signals S1, S2, ..., and Sn are at high level, and Sx+1 to Sn are at a low level. Where the up/down signal $S_{UD}$ is held at a low level by the external control circuit so as to increase the delay time, at the timing of change of the clock signal CLK, for example, the rising edge, the output signal Q of the latch circuit Cx+1 is switched from a low level to a high level. According to this, the signal propagation route in the variable delay circuit changes and the number of delay steps is increased, therefore the delay time is increased by the amount of one stage of delay element.

On the other hand, in the same initial state, when the up/down signal $S_{UD}$ is held at a high level by an external control circuit so as to reduce the delay time, at the rising edge of the clock signal CLK, the output signal Q of the latch circuit Cx−1 is switched from a high level to a low level. The number of delay steps in the variable delay circuit is reduced according to this, therefore the delay time is reduced by the amount of one stage of delay element.

In the latch circuit shown in FIG. 19, where the up/down signal $S_{UD}$ is held at a low level by an external control circuit, the input signal level to the D flip-flop D1 is determined in accordance with the output signal of the latch circuit of the former stage. For example, where a delay control signal of a high level is output from the latch circuit of the former stage, a signal of a low level is input from the PXQ terminal, the output terminal of the NOR gate G2 is held at a high level, and the output terminal Q of the D flip-flop D1 is switched to a high level at the rising edge of the clock signal CLK. By this, the number of stages of delay elements of the signal propagation route in the variable delay circuit is increased, and the delay time is increased.

On the other hand, where the up/down signal $S_{UD}$ is held at a high level by an external control circuit, the output signal level of the D flip-flop D1 is determined in accordance with the output signal of the latch circuit of the latter stage. For example, where a delay control signal of low level is output of a high level is input from the terminal NXQ and a signal of a high level is output from the AND gate G1, therefore the output terminal of the NOR gate G2 is held at a low level and the output terminal Q of the D flip-flop D1 is switched to a low level at the rising edge of the clock signal CLK. By this, the number of delay elements of the signal propagation route in the variable delay circuit is decreased, and the delay time is reduced.

Note that there are a large number of latch circuits for generating the delay control signal mentioned above, but only one example is shown in FIG. 19. Here, for example, when "·" represents the AND logic, "+" represents the OR logic, and INV(x) represents the logic inversion of the signal x, it is sufficient that the latch circuit have a logical circuit for generating the signal y shown in the following equation and supplying this to the D flip-flop D1.

$$y = INV(S_{UD} \cdot INV \text{ (Q of next stage)} + INV \text{ (Q of former stage)}) \quad (1)$$

Figure 20:
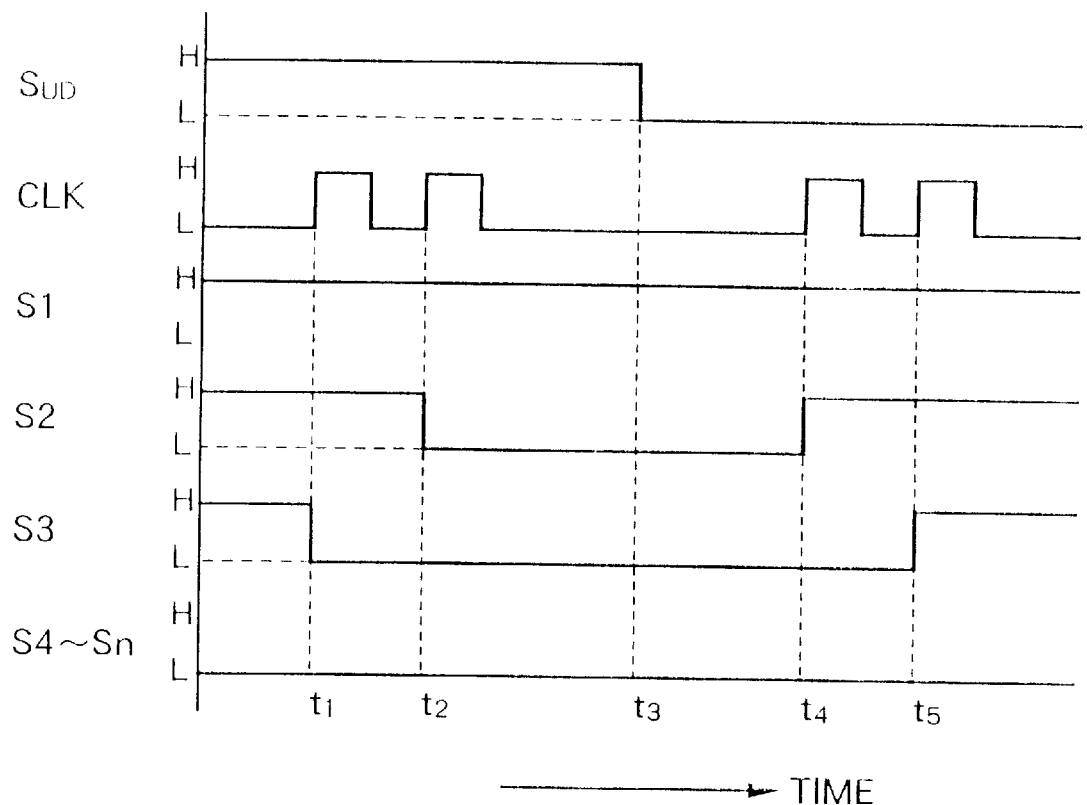
FIG. 20 is a waveform diagram of the delay control signal generation circuit.

FIG. 20 shows the waveforms of the delay control signals S1, S2, ..., and Sn output from the delay control signal generation circuit shown in FIG. 18 in accordance with the up/down signal $S_{UD}$ and the clock signal CLK. As illustrated, they start from the initial state where S1, S2, and S3 among the delay control signals S1, S2, ..., and Sn are at a high level and S4 to Sn are at a low level. The clock signal CLK rises at the time $t_1$. The up/down signal $S_{UD}$ is held at a high level at this time, therefore, the delay control signal S3 is switched from a high level to a low level.

Further, at the time $t_2$, the delay control signal S2 is switched from a high level to a low level. According to this, the number of delay elements of the signal propagation route of the variable delay circuit shown in FIG. 18 is decreased one by one and the delay time is reduced by the amount of two stages of delay elements.

At a time $t_3$, the up/down signal $S_{UD}$ is switched from a high level to a low level, the clock signal CLK rises at a time $t_4$ in accordance with this, and the delay control signal S2 switches from a low level to a high level. Further, at a time $t_5$, the delay control signal S3 switches from a low level to a high level in accordance with the rising edge of the clock signal CLK. By this, the number of delay elements of the signal propagation route of the variable delay circuit is increased one by one, and the delay time is increased by the amount of two stages of delay elements.

As explained above, according to the present embodiment, since the delay control signal generation circuit is constituted by using a logical circuit comprising the AND gate G1 and the NOR gate G2 and by the latch circuits C1, C2, ..., and Cn constituted by the D flip-flops D1, the logical circuit of each latch circuit operates in response to the output signals of the latch circuit of the former and latter stages, the up/down signal $S_{UD}$ controlling the increase or decrease of delay time, and the clock signal CLK for controlling the operation timing, the output signal of each latch circuit is controlled in accordance with the level of the up/down signal $S_{UD}$, and the propagation route of the signal in the variable delay circuit received this is changed thereby to control the delay time, the desired delay time is obtained by the variable delay circuit by setting the up/down signal $S_{UD}$.

Seventh Embodiment

Figure 21:
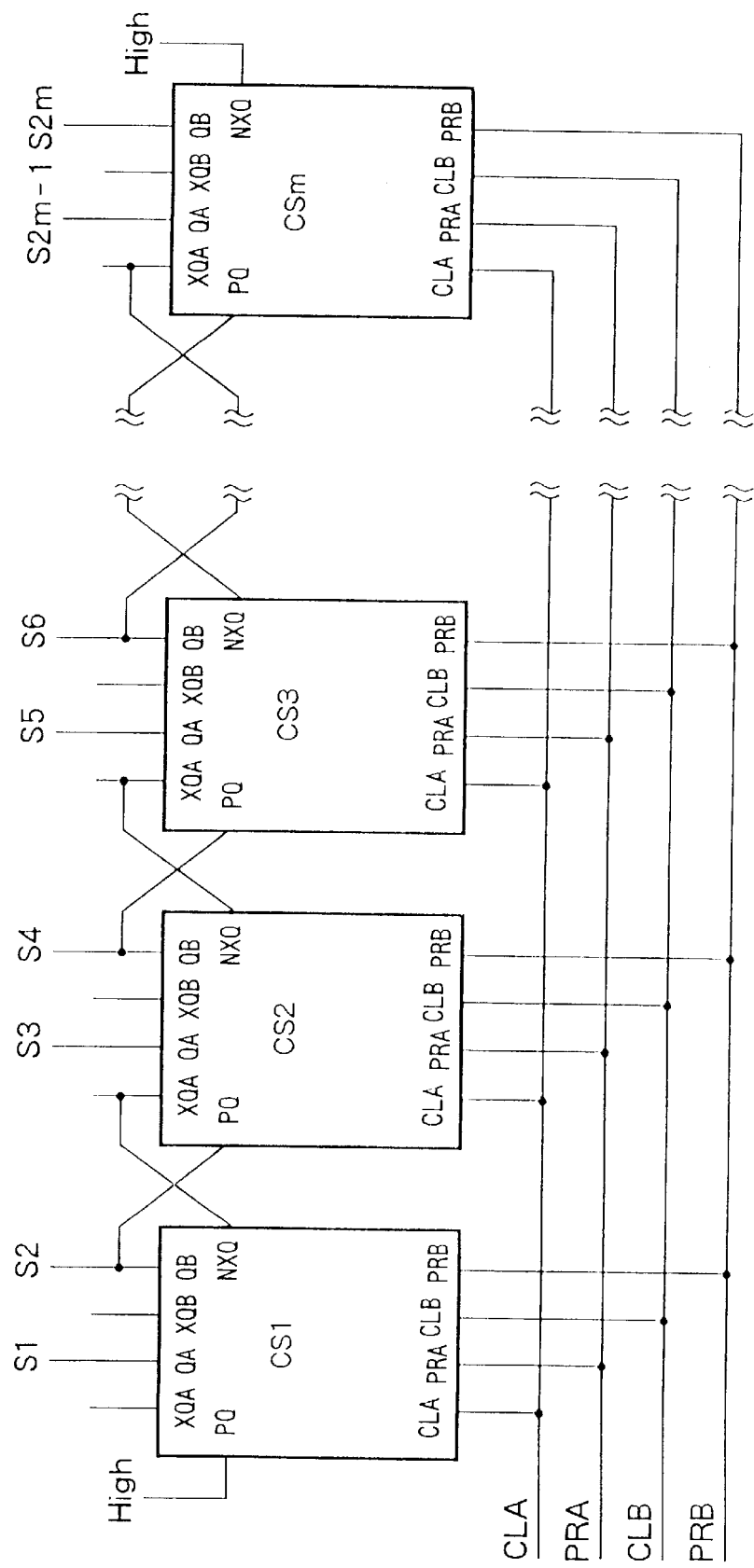
FIG. 21 is a another example of the circuit of the delay control signal generation circuit.

FIG. 21 is a circuit diagram of a seventh embodiment of a delay circuit according to the present invention.

The present embodiment is a delay control signal generation circuit for supplying delay control signals S1, S2, ..., Sm to the variable delay circuit similar to the sixth embodiment of the present invention explained above, but in the present embodiment, unlike the sixth embodiment, the delay control signals S1, S2, ..., S2m-1 and S2m are generated by using latch circuits CS1, CS2, ..., and CSm constituted by SR latches SRLAT1 and SRLAT2 and NAND gates G1, G2, G3, and G4.

Figure 22:
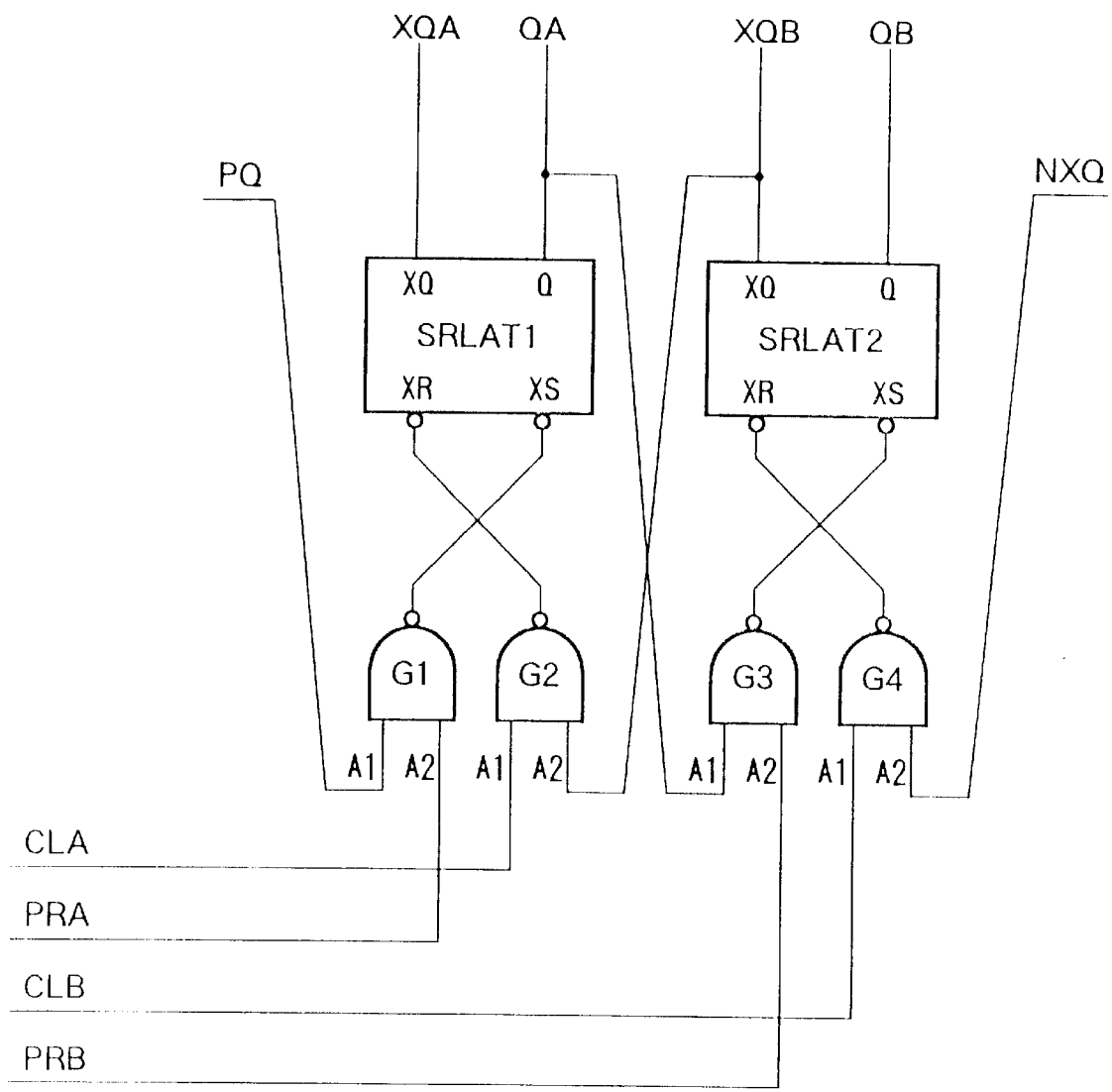
FIG. 22 is a circuit diagram of a delay control signal generation element comprising a latch circuit and NAND gates.

FIG. 22 shows an example of the configuration of the latch circuit. As illustrated, the latch circuit of the present example is constituted by the SR latches SRLAT1 and SRLAT2 and NAND gates G1, G2, G3, and G4, receives control signals CLA, PRA, CLB, and PRB for instructing the increase or decrease of the delay time from an external portion and output signals of the latch circuits of the former stage and the latter stage, and sets output signals QA and QB.

Note that, the control signals CLA, PRA, CLB, and PRB are supplied by an external control circuit. For example, where the number of the delay elements is even in the variable delay circuit and the number of delay elements is increased by one stage form this, a pulse is given to the PRA; where the number of delay elements is even and the number of delay elements is decreased by one stage from this, a pulse is given to the CLB; where the number of the delay elements is odd and the number of the delay element is decreased by one stage from this, a pulse is given to the PRB; and where the number of the delay elements is odd and the number of the delay element is decreased by one stage from this, a pulse is given to the CLA. The delay control signal generation circuit of the present embodiment generates delay control signals S1, S2, ..., S2m-1 and S2m in accordance with such control signals CLA, PRA, CLB, and PRB to increase or decrease the number of delay elements in the variable delay circuit.

The NAND gates G1, G2, G3, and G4 are NAND gates each having two inputs A1 and A2. The input terminal A1 of the NAND gate G1 is connected to the input terminal PQ of the latch circuit, while the input terminal PQ is connected to the output terminal QB of the latch circuit of the former stage. The input terminal A2 of the NAND gate G1 is connected to the input terminal of the control signal PRA. The input terminal A1 of the NAND gate G2 is connected to the input terminal of the control signal CLA, while the input terminal A2 is connected to the output terminal XQ of the SR latch SRLAT2. The output terminals of the NAND gates G1 and G2 are connected to the input terminals XR and XS of the SR latch SRLAT1.

The input terminal A1 of the NAND gate G3 is connected to the output terminal Q of the SR latch SRLAT1, while the input terminal A2 is connected to the input terminal of the control signal PRB. The input terminal A1 of the NAND gate G4 is connected to the input terminal of the control signal CLB, while the input terminal A2 is connected to the input terminal NXQ of the latch circuit. The output terminals of the NAND gates G3 and G4 are connected to the input terminals XR and XS of the SR latch SRLAT2.

Figure 23:
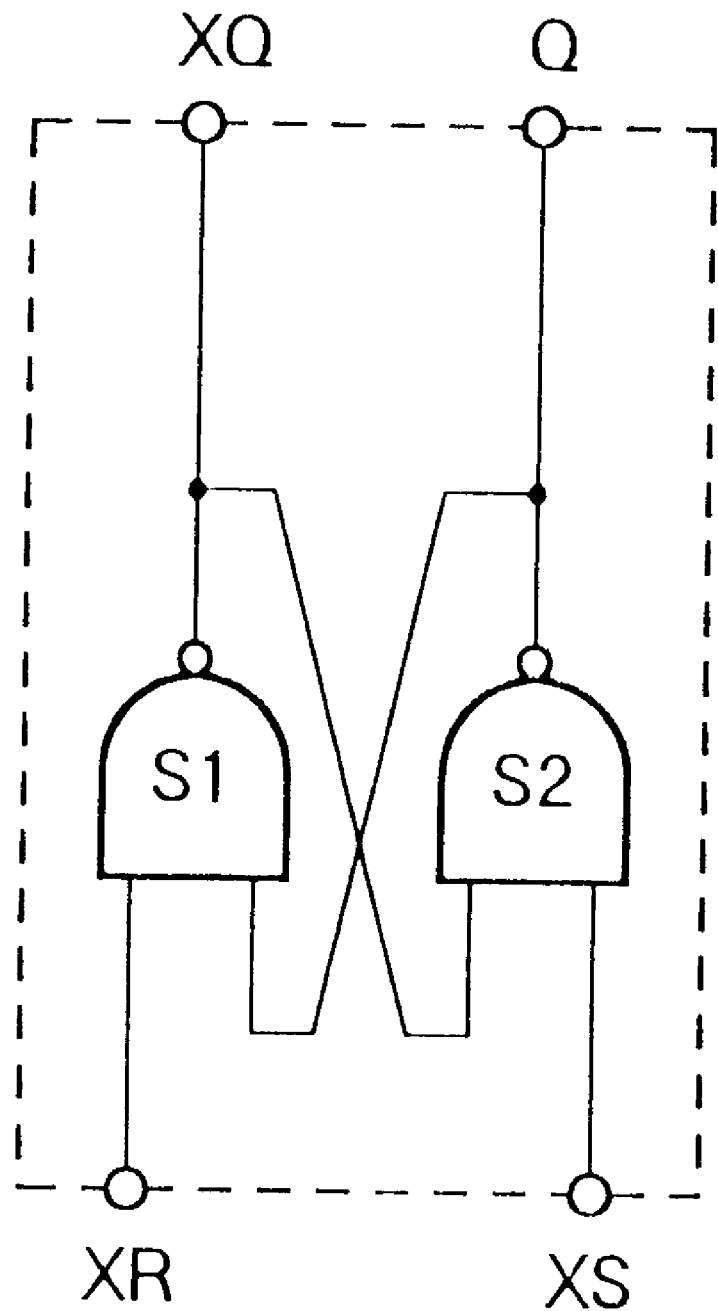
FIG. 23 is a circuit diagram of the configuration of the latch circuit.

The SR latches SRLAT1 and SRLAT2 have the same configurations. FIG. 23 shows the configurations thereof. The SR latch is constituted by two NAND gates S1 and S2 as illustrated. One input terminal of the NAND gate S1 is connected to the XR terminal, while the other input terminal is connected to the output terminal of the NAND gate S2, and one input terminal of the NAND gate S2 is connected to the XS terminal, while the other input terminal is connected to the output terminal of the NAND gate S1.

In such an SR latch, the signals of the output terminals XQ and Q are set by the change of level of signals input to the input terminals XR and XS, i.e., here, at the falling edge. Here, where the input signals XR and XS are "10" and "01" when defining the signal of a high level as "1" and the signal of a low level as "0", the output signals XQ and Q are respectively set to "01" and "10", while where the input signal is "11", the output signal holds the previous state. Further, where the input signal is "00", the output signal becomes indeterminate. This is the prohibited state.

Since the SR latch circuit shown in FIG. 23 is constituted by two NAND gates S1 and S2, the entire latch circuit shown in FIG. 22 is constituted by eight NAND gates. One NAND gate can be constituted by four MOS transistors, therefore the one latch circuit shown in FIG. 22 is constituted by 32 transistors in total.

Figure 24:
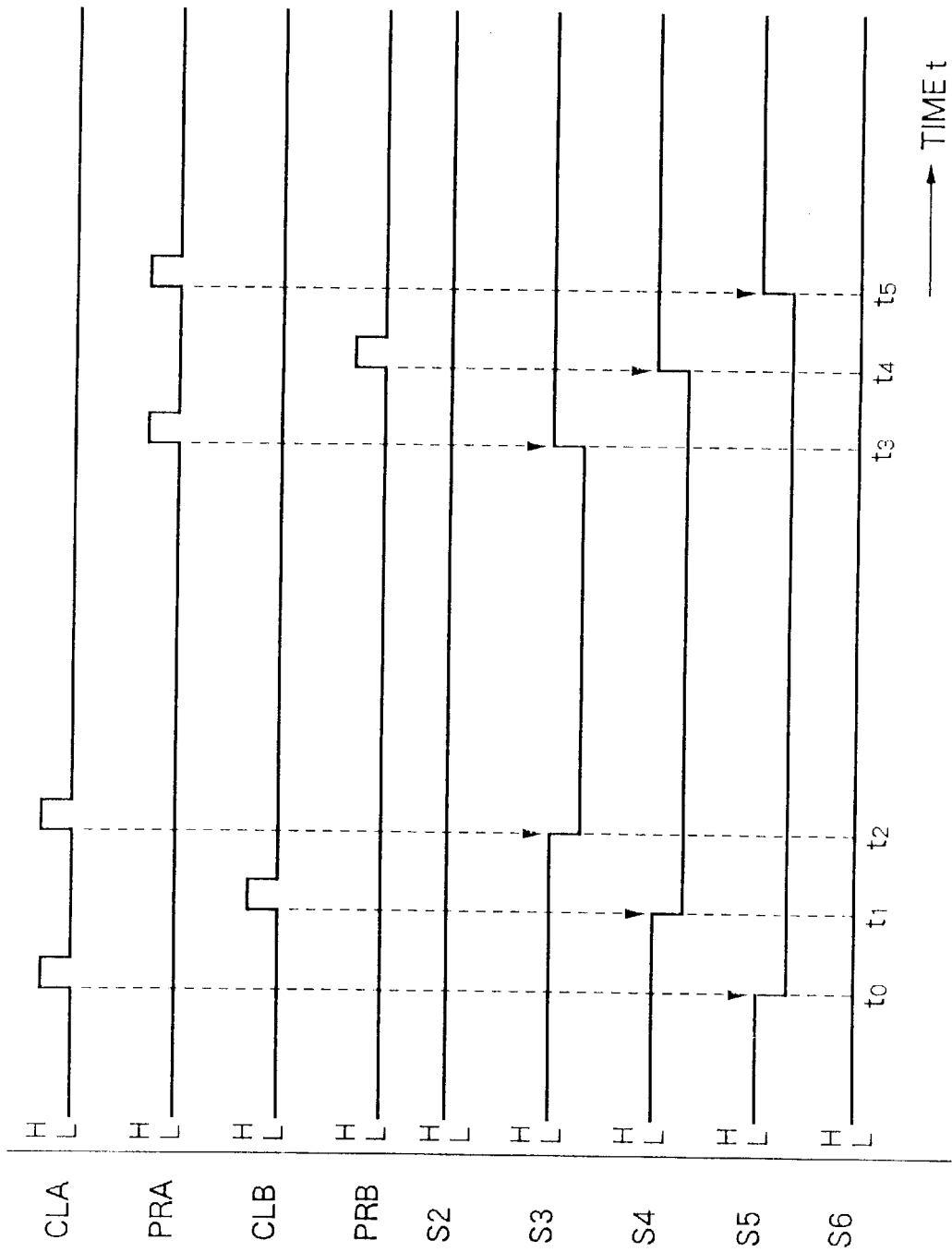
FIG. 24 is a waveform diagram of the delay control signal generation circuit.

FIG. 24 is a waveform diagram of the waveforms of part of the control signals CLA, PRA, CLB, and PRB and delay time control signals S1, S2, ..., S2m-1, and S2m set in accordance with them. Below, an explanation will be made of the operation of the delay control signal generation circuit of the present embodiment by referring to FIG. 21 and FIG. 24.

As shown in FIG. 24, as the initial state, S1 (not illustrated), S2, S3, S4, and S5 are set at a high level, and S6 and the not illustrated S7 and on are held at a low level. At the time $t_0$, a pulse is given to the control signal CLA, and the delay control signal S5 is switched from a high level to a low level in accordance with this, therefore in the variable delay circuit controlled by this, the signal propagation route changes, and the delay time is reduced by the amount of one stage of delay element.

Then, at the time $t_1$, a pulse is given to the control signal CLB, and the delay control signal S4 is switched from a high level to a low level in accordance with this, therefore the delay time of the variable delay circuit is further reduced by the amount of one stage of delay element. Similarly, at the time $t_2$, a pulse is given to the control signal CLA, and the delay control signal S3 is switched from a high level to a low level in accordance with this, therefore, the signal propagation route changes in the variable delay circuit controlled by this, and the delay time is reduced by the amount of one stage of delay element.

At the time $t_3$, a pulse is given to the control signal PRA, and the delay control signal S3 is switched from a low level to a high level in accordance with this, therefore the signal propagation route changes in the variable delay circuit, and the delay time is increased by the amount of one stage of delay element. Then, at the time $t_4$, a pulse is given to the control signal PRB, and the delay control signal S4 is switched from a low level to a high level in accordance with this, therefore, the signal propagation route changes in the variable delay circuit, and the delay time is increased by the amount of one stage of delay element. Further, at the time $t_5$, a pulse is given to the control signal PRA, and the delay control signal S5 is switched from a low level to a high level in accordance with this, therefore, the signal propagation route changes in the variable delay circuit, and the delay time is increased by the amount of one stage of delay element.

As explained above, according to the present embodiment, since the delay control signal generation circuit is constituted by using latch circuits CS1, CS2, ..., and CSm comprising SR latches SRLAT1 and SRLAT2 and NAND gates G1, G2, G3, and G4, each latch circuit receives the output signals of the latch circuits of the former and latter stages and the control signals CLA, PRA, CLB and PRB for controlling the increase or decrease of the delay time, generates the delay control signals S1, S2, ..., and S2m-1 and S2m, and changes the propagation route of the signal in the variable delay circuit in response to this thereby to control the delay time, therefore a desired delay time is obtained by the variable delay circuit by setting the control signals CLA, PRA, CLB, and PRB.

For example, in the method of forming delay control signals S1 to Sn necessary for the variable delay circuit by a decoder comprising the logical gate from the output of the counter, a unrequired glitch is sometimes generated at the switching in the count value. According to the delay signal generation circuit of the present sixth and seventh embodiments, there is no apprehension of generation of a glitch in comparison with such a method. Further, the delay signal generation circuit can be realized by the repetition of the same, simple circuit, and the delay time of the delay circuit can be controlled without using a counter and a large sized decoder circuit.

Eighth Embodiment

Figure 25:
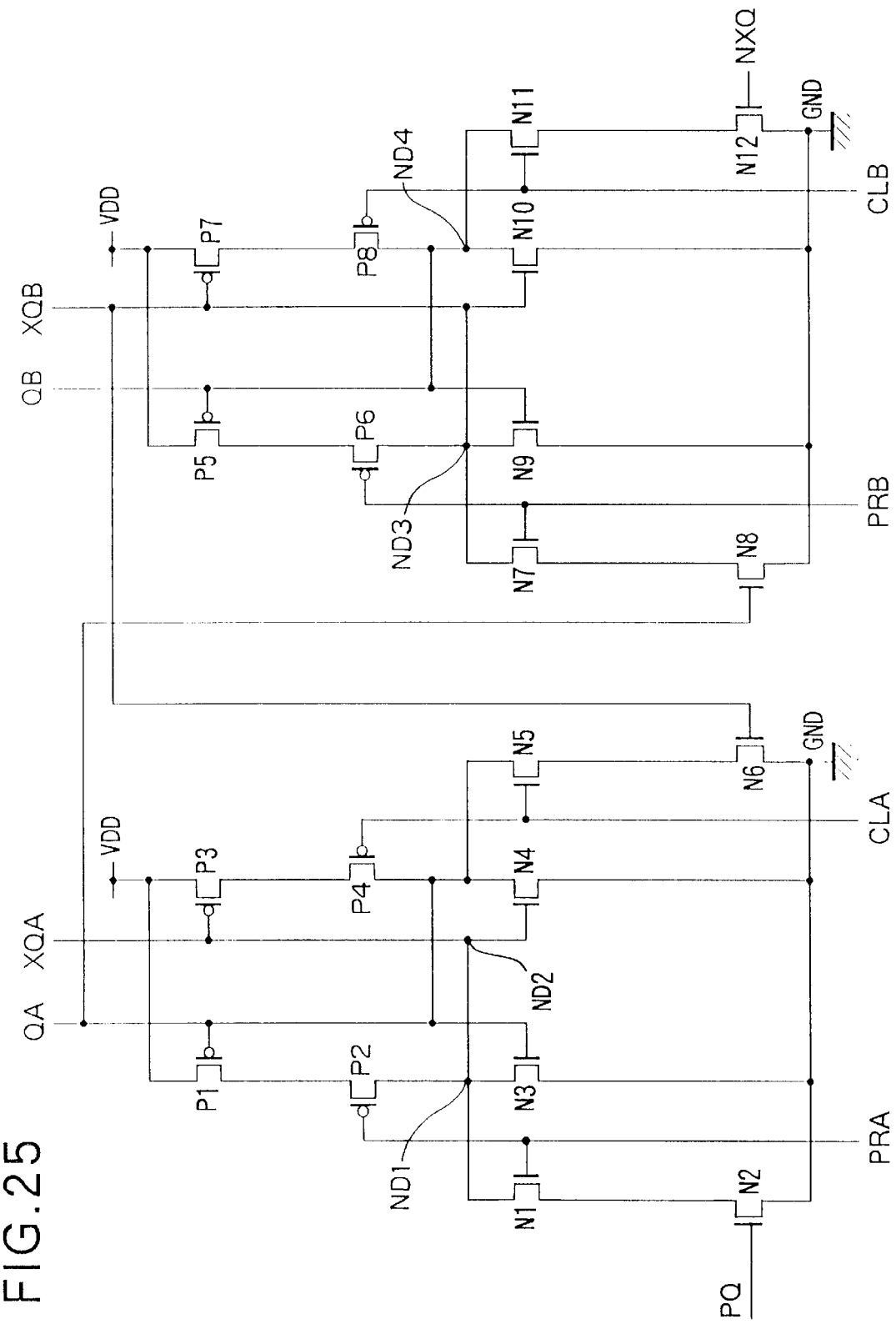
FIG. 25 is a circuit diagram of another example of the configuration of the delay signal generation circuit.

FIG. 25 is a circuit diagram of an eighth embodiment of the delay circuit according to the present invention.

The present embodiment shows another example of the configuration of the latch circuits CS1, CS2, ..., and CSm constituting the delay control signal generation circuit shown in FIG. 21.

As shown in FIG. 25, the latch circuit of the present embodiment is constituted by pMOS transistors P1 to P8 and nMOS transistors N1 to N12, that is, one stage of latch circuit can be constituted by 20 MOS transistors in total. The number of the MOS transistors for constituting a latch circuit is greatly reduced when compared with the latch circuit shown in FIG. 22.

Both of the gates of the pMOS transistor P1 and nMOS transistor N3 are connected to the node ND2, and both of the gates of the nMOS transistor N1 and pMOS transistor P2 are connected to the input terminal of the control signal PRA. The gate of the nMOS transistor N2 is connected to the terminal PQ and connected to the output terminal QB of the latch circuit of the former stage.

Both of the gates of the pMOS transistor P3 and nMOS transistor N4 are connected to the node ND1, and both of the gates of the nMOS transistor N5 and pMOS transistor P4 are connected to the input terminal of the control signal CLA. The gate of the nMOS transistor N6 is connected to the node ND4.

Both of the sources of the pMOS transistors P1 and P3 are connected to the supply line of the power supply voltage VDD, the drain of the pMOS transistor P1 is connected to the source of the pMOS transistor P2, and the drain of the pMOS transistor P2 is connected to the node ND1. The drains of the nMOS transistors N1 and N3 are commonly connected to the node ND1, the source of the nMOS transistor N1 is connected to the drain of the nMOS transistor N2, and the sources of the nMOS transistors N2 and N3 are grounded.

The drain of the pMOS transistor P3 is connected to the source of the pMOS transistor P4, and the drain of the pMOS transistor P4 is connected to the node ND2. The drains of the nMOS transistors N4 and N5 are commonly connected to the node ND2, the source of the nMOS transistor N5 is connected to the drain of the nMOS transistor N6, and the sources of the nMOS transistors N4 and N6 are grounded.

Further, the pMOS transistors P5 to P8 and nMOS transistors N7 to N12 are connected substantially similarly to the parts mentioned above.

The output terminal QA of the latch circuit is connected to the node ND2, and the output terminal XQA is connected to the node ND1. Further, the output terminal QB is connected to the node ND4, and the output terminal XQB is connected to the node ND3. Further, the odd number signals S1, S3, . . . , and S2m-1 of the delay control signals are output from the output terminal QA of the latch circuit, and the even number signals S2, S4, . . . , and S2m of the delay control signals are output from the output terminal QB.

The operation in the thus constituted latch circuit will be explained from the initial state where a signal of a high level is output from the output terminal QA and a signal of a low level is output from the output terminal QB. In this case, the output terminal XQA is held at a low level, and the output terminal XQB is held at a high level. Namely, the node ND1 is held at a low level, the node ND2 is held at a high level, the node ND3 is held at a high level, and the node ND4 is held at a low level.

For example, as shown in the waveform diagram of FIG. 24, where a positive pulse is given to the control signal CLA, the nMOS transistor N5 becomes the conductive state. Note that, at this time, a signal of a high level is output from the output terminal XQB of the latch circuit, therefore the nMOS transistor N6 also becomes the conductive state. According to this, the node ND2 is switched from a high level to a low level, both of the pMOS transistors P1 and P2 become the conductive state in accordance with this, and the node ND1 is switched from a low level to a high level.

Namely, the output terminal QA of the latch circuit is switched from a high level to a low level. In the variable delay circuit controlled by the output signal of the latch circuit, the delay time is reduced by the amount of one stage of delay element.

Next, an explanation will be made of the operation where a positive pulse signal is given to the control signal PRB in the initial state the same as that of the above explanation, that is, when a signal of a high level is output from the output terminal QA and a signal of a low level is output from the output terminal QB. At this time, the nMOS transistor N7 is switched from the nonconductive state to the conductive state, and the nMOS transistor N8 is in the conductive state, therefore the node ND3 is switched from a high level to a low level. According to this, the pMOS transistor P7 is switched from the nonconductive state to the conductive state, and the pMOS transistor P8 is in the conductive state, therefore the node ND4 is switched from a low level to a high level.

Namely, the output terminal QB of the latch circuit is switched from a low level to a high level. In the variable delay circuit controlled by the output signal of the latch circuit, the delay time is increased by the amount of one stage of delay element.

As explained above, according to the present embodiment, since each of the latch circuits constituting the delay control signal generation circuit is constituted by 20 MOS transistors, when compared with the seventh embodiment of the present invention mentioned above, the number of MOS transistors for constituting the latch circuit can be decreased, and the configuration of the entire delay control signal generation circuit can be simplified.

Ninth Embodiment

Figure 26:
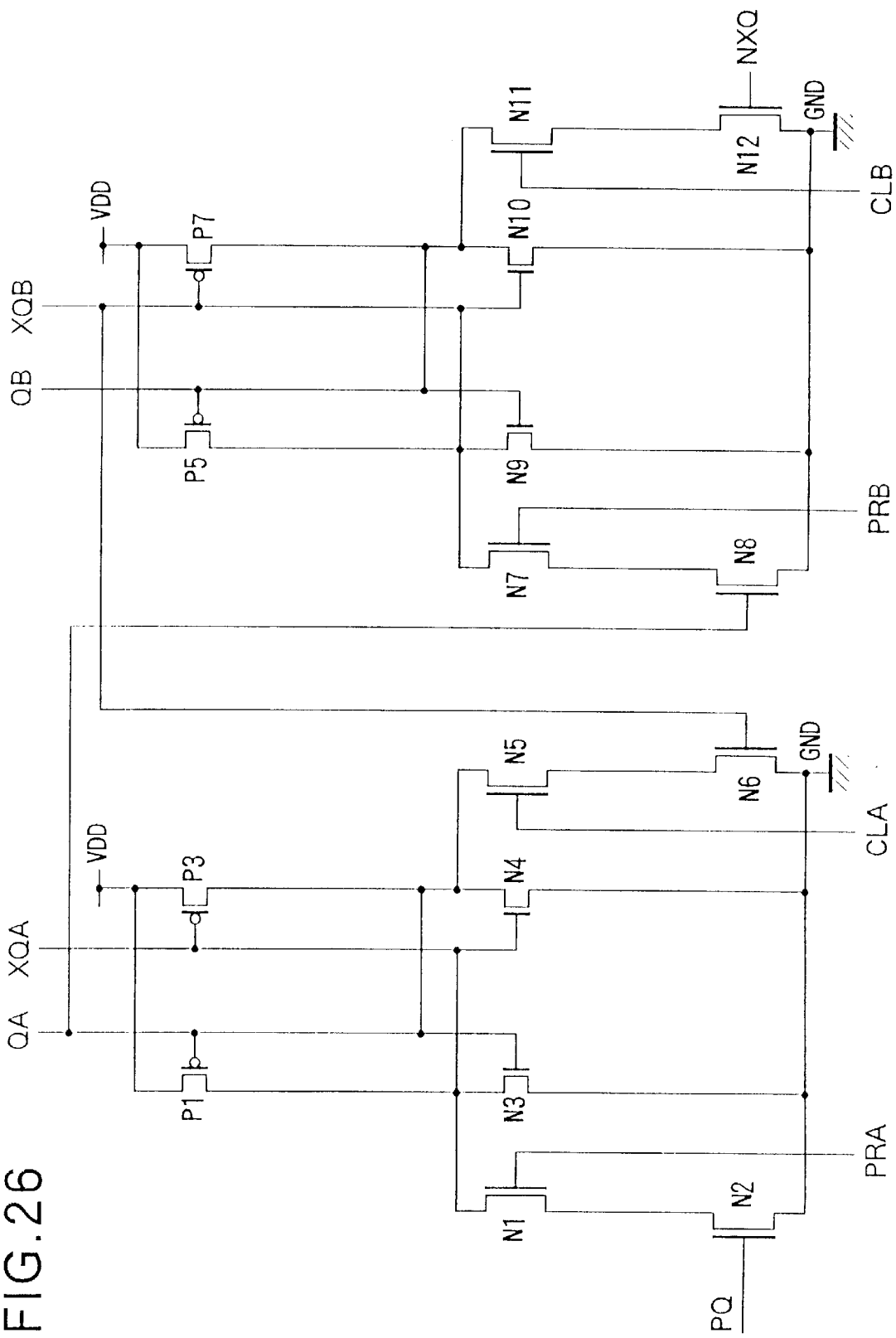
FIG. 26 is a circuit diagram of another example of the configuration of the delay signal generation element.

FIG. 26 is a circuit diagram of a ninth embodiment of a delay circuit according to the present invention.

The present embodiment shows another example of the latch circuit constituting the delay control signal generation circuit similar to the eighth embodiment mentioned above. Note, in the present embodiment, by adjusting the driving capability of the pMOS transistors and nMOS transistors constituting the latch circuit, a latch circuit capable of further decreasing the number of the MOS transistors in comparison with the eighth embodiment shown in FIG. 25 is realized.

As shown in FIG. 26, if the driving capabilities of the pMOS transistors P1, P3, P5, and P7 are set sufficiently smaller than those of N1, N2, N5, N6, N7, N8, N11, and N12 and the wires to which the sources and drains of the transistors of pMOS transistors P2, P4, P6, and P8 are connected are short-circuited, it is possible to delete the pMOS transistors P2, P4, P6, and P8 existing in the latch circuit of FIG. 25, and the number of transistors constituting the latch circuit is further decreased.

10th Embodiment

Figure 27:
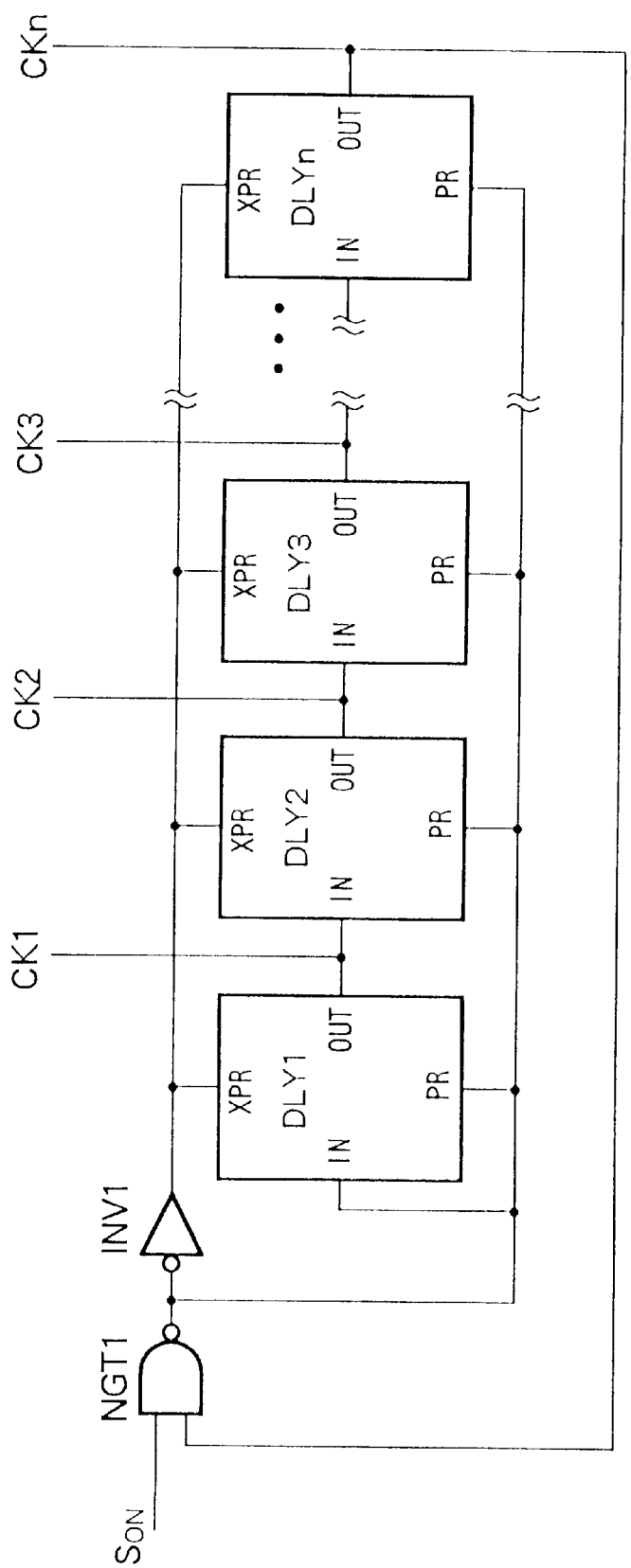
FIG. 27 is a circuit diagram of a first embodiment of an oscillator circuit according to the present invention.

FIG. 27 is a circuit diagram of a first embodiment of an oscillator circuit according to the present invention.

As illustrated, the oscillator circuit of the present embodiment is realized by using the first embodiment of the delay circuit shown in FIG. 7. Here, the same constituent parts of the circuit are represented by using the same symbols. In the following explanation, the part of the delay circuit comprising the delay elements DLY1, DLY2, . . . , and DLYn will be omitted.

The output signal CKn of the delay element DLYn of the final stage of the delay circuit is fed back to the input terminal of the delay circuit via the NAND gate NGT1, thus a ring-configuration oscillator circuit (ring oscillator) is constituted. One input terminal of the NAND gate NGT1 is connected to the output terminal OUT of the delay element DLYn, while the other input terminal is connected to the input terminal of the control signal $S_{ON}$ controlling the operating/stopped state of the oscillator circuit.

When the control signal $S_{ON}$ is held at a low level, the output terminal of the NAND gate NGT1 is held at a high level, all of the output signals CK1, CK2, ..., and CKn of the delay elements DLY1, DLY2, ..., and DLYn are held at a high level, and the oscillator circuit is set in the stopped state.

On the other hand, when the control signal $S_{ON}$ is held at a high level, the inverted signal of the output signal CKn of the delay element DLYn is output to the output terminal of the NAND gate NGT1, this is input to the input terminal IN of the delay element DLY1 as the input signal of the delay circuit, the oscillator circuit is set in the operation state, and clock signals CK1, CK2, ..., and CKn are respectively output from the delay elements DLY1, DLY2, ..., and DLYn.

Figure 28:
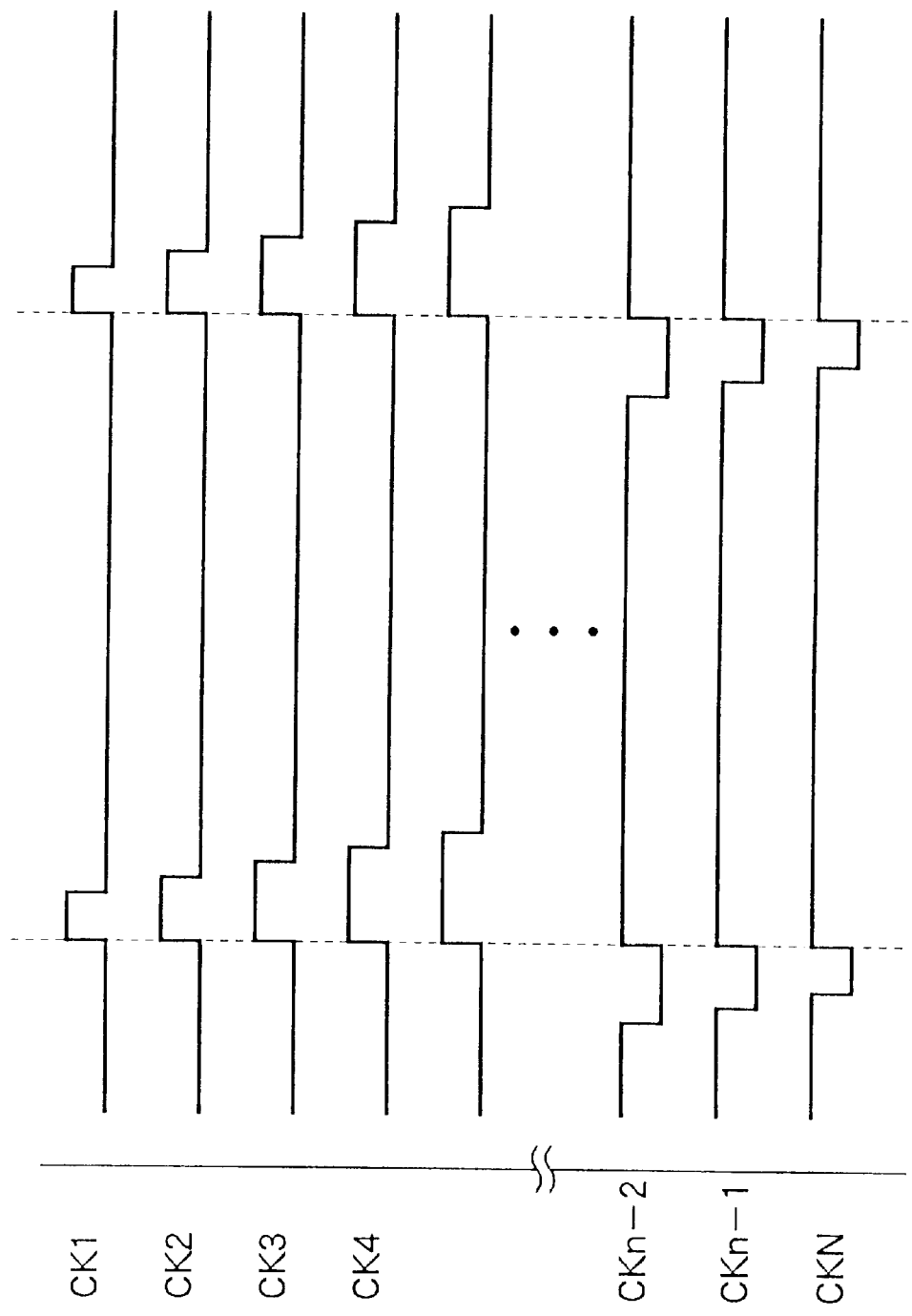
FIG. 28 is a waveform diagram of the oscillator circuit.

FIG. 28 shows the output signals at the time of operation of the oscillator circuit shown in FIG. 27. As illustrated, at the time of operation of the oscillator circuit, clock signals CK1, CK2, ..., and CKn having different duty ratios are respectively obtained from the delay elements DLY1, DLY2, ..., and DLYn constituting the delay circuit.

As explained above, according to the present embodiment, since the delay circuit is constituted by a plurality of delay elements DLY1, DLY2, ..., and DLYn, an inverted signal of the output signal from the delay element DLYn of the final stage is input to the input terminal of the delay element DLY1 of the initial stage via the NAND gate NGT1, and therefore a ring oscillator is constituted, a plurality of clock signals CK1, CK2, ..., and CKn having different duty ratios can be simultaneously obtained.

11th Embodiment

Figure 29:
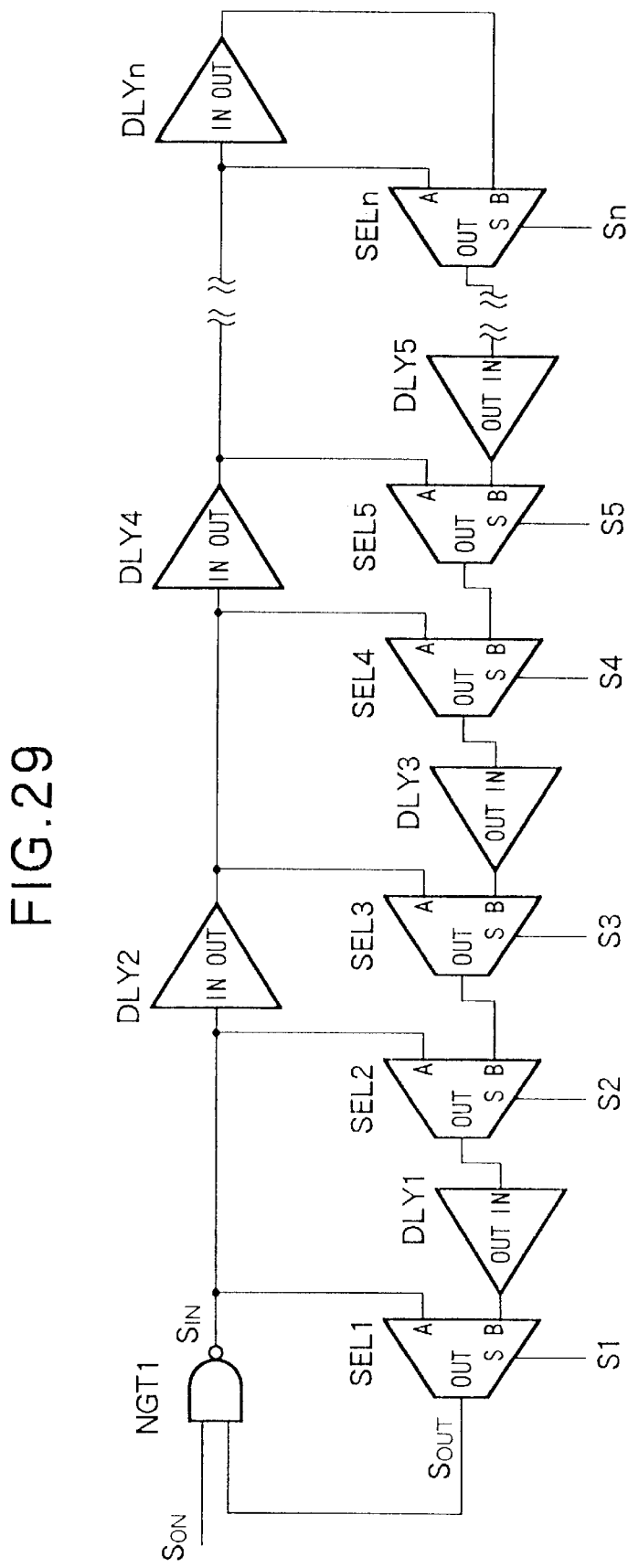
FIG. 29 is a circuit diagram of a second embodiment of the oscillator circuit according to the present invention.

FIG. 29 is a circuit diagram of a second embodiment of an oscillator circuit according to the present invention.

The oscillator circuit of the present embodiment is constituted by using the delay circuit shown in FIG. 14.

As illustrated, the oscillator circuit of the present example is constituted by the NAND gate NGT1 and by a variable delay circuit comprising the delay elements DLY1, DLY2, ..., and DLYn and the selectors SEL1, SEL2, ..., and SELn. The delay time of the delay circuit is controlled in accordance with the delay control signals S1, S2, ..., and Sn input to the selectors SEL1, SEL2, ..., and SELn, whereby the oscillation frequency of the oscillator circuit is controlled.

The output signal $S_{OUT}$ of the selector SEL1 constituting the delay circuit is input to one input terminal of the NAND gate NGT1, and the output signal $S_{IN}$ of the NAND gate NGT1 is input to the delay circuit as the input signal of the delay circuit. The other input terminal of the NAND gate NGT1 is connected to the input terminal of the control signal $S_{ON}$ controlling the operating/stopped state of the oscillator circuit.

When the control signal $S_{ON}$ is held at a low level, the output terminal of the NAND gate NGT1 is held at a high level and the oscillation operation is set in the stopped state, while when the control signal $S_{ON}$ is held at a high level, the inverted signal $S_{IN}$ of the output signal $S_{OUT}$ of the delay circuit is output from the output terminal of the NAND gate NGT1 and the inverted signal $S_{IN}$ is further input to the delay circuit, therefore an oscillation operation is carried out at the ring-configuration oscillator circuit.

The delay time of the delay circuit is controlled by the delay control signals S1, S2, ..., and Sn input to the selectors SEL1, SEL2, ..., and SELn and the oscillation frequency of the oscillator circuit is controlled in accordance with this. Namely, a frequency-variable oscillator circuit can be constituted by the variable delay circuit. For example, when the delay time is set small by the delay control signals S1, S2, ..., and Sn, the oscillation frequency becomes large, conversely when the delay time is set large, the oscillation frequency becomes small.

As explained above, according to the present embodiment, since a ring-configuration oscillator circuit is constituted by the variable delay circuit constituted by the delay elements DLY1, DLY2, ..., and DLYn and the selectors SEL1, SEL2, ..., and SELn and by the NAND gate NGT1 and since the oscillation frequency is controlled by controlling the delay time of the delay circuit by the delay control signals S1, S2, ..., and Sn input to the selectors SEL1, SEL2, ..., and SELn, an oscillator circuit having an oscillation frequency which can be set by a digital signal can be realized, an increase or decrease of the number of delay steps can be easily dealt with by repetition of the same circuit, and the position of the output terminal of the signal in the circuit layout does not change even if the number of stages of the delay elements is increased. Further, the maximum number n of delay steps does not exert an influence upon the minimum delay time, and the linear characteristic of the delay time with respect to the delay control signal is held uniform, therefore the linear characteristic of the oscillation frequency with respect to the delay control signal is good, and the maximum oscillation frequency can be set large.

12th Embodiment

Figure 30:
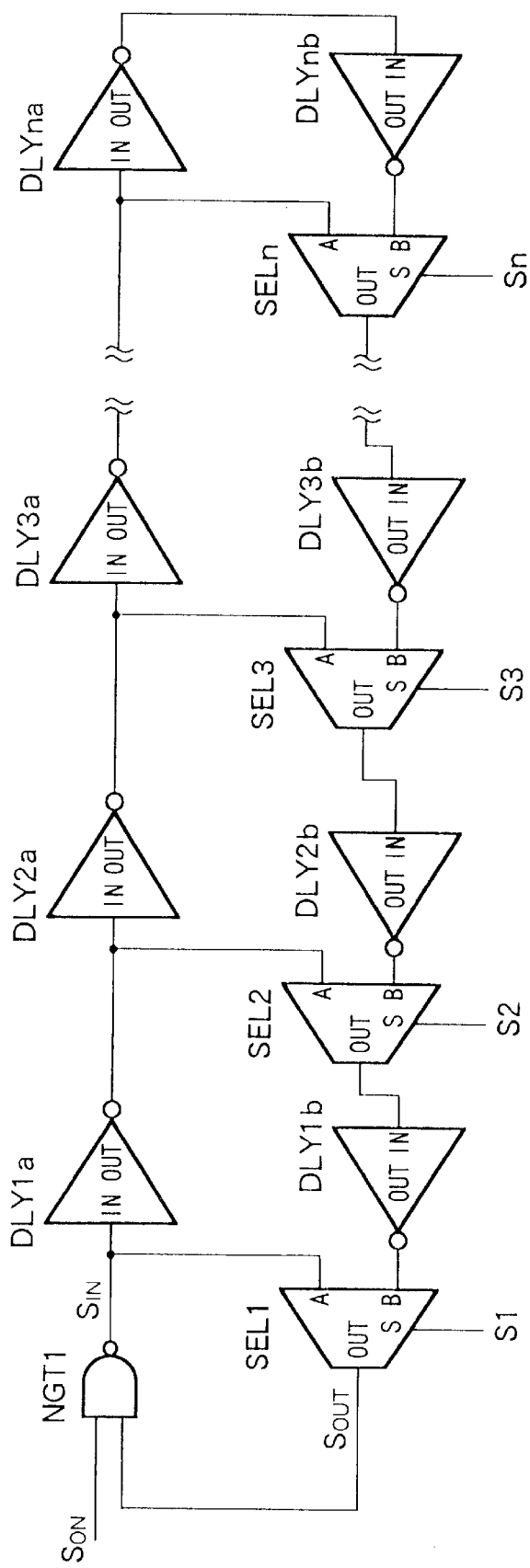
FIG. 30 is a circuit diagram of a third embodiment of the oscillator circuit according to the present invention.

FIG. 30 is a circuit diagram of a third embodiment of an oscillator circuit according to the present invention.

The oscillator circuit of the present embodiment is constituted by using the delay circuit shown in FIG. 15.

As illustrated, the oscillator circuit of the present example is constituted by the NAND gate NGT1 and by the variable delay circuit comprising the delay elements DLY1a, DLY1b, DLY2a, DLY2b, ..., DLYna and DLYnb and the selectors SEL1, SEL2, ..., and SELn. The delay time of the delay circuit is controlled in accordance with the delay control signals S1, S2, ..., and Sn input to the selectors SEL1, SEL2, ..., and SELn, whereby the oscillation frequency of the oscillator circuit is controlled.

Note that, except for the difference of constituent elements of the delay circuit, the present embodiment has substantially the same configuration as that of the second embodiment of the oscillator circuit shown in FIG. 29 and accordingly has a substantially similar effect to that of the oscillator circuit of the second embodiment explained above.

13th Embodiment

Figure 31:
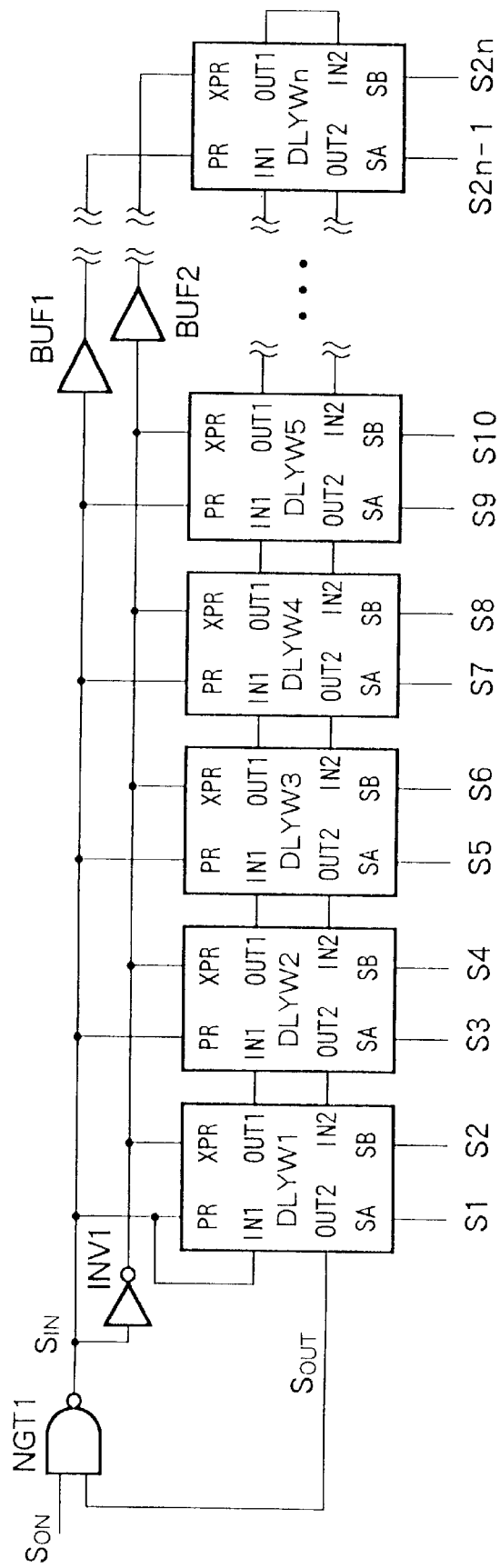
FIG. 31 is a circuit diagram of a fourth embodiment of the oscillator circuit according to the present invention.

FIG. 31 is a circuit diagram of a fourth embodiment of an oscillator circuit according to the present invention.

The oscillator circuit of the present embodiment is constituted by using the delay circuit shown in FIG. 16.

As illustrated, the oscillator circuit of the present example is constituted by the NAND gate NGT1 and by the variable delay circuit comprising the delay elements DLYW1, DLYW2, ..., and DLYWn. The configuration of the delay elements DLYW1, DLYW2, ..., and DLYWn is shown in FIG. 17, and a detailed explanation has been already made of the configuration and operation of the variable delay circuit constituted by these delay elements in the fifth embodiment of the delay circuit, so the explanation of the part of the delay circuit is omitted here.

The output signal $S_{OUT}$ of the delay circuit is input to one input terminal of the NAND gate NGT1, while the other input terminal of the NAND gate NGT1 is connected to the input terminal of the control signal $S_{ON}$ controlling the operating/stopped state of the oscillator circuit. The output signal $S_{OUT}$ of the NAND gate NGT1 is input to the delay circuit as the input signal of the delay circuit.

The delay elements DLYW1, DLYW2, . . . , and DLYWn provide both functions of delay and selection, and the delay time of the delay circuit is controlled in accordance with the delay control signals S1, S2, S3, S4, . . . , S2n-1 and S2n input to the delay elements, therefore the oscillation frequency of the oscillator circuit is controlled in accordance with this.

As explained above, according to the present embodiment, since a ring-configuration oscillator circuit is constituted by the NAND gate NGT1 and by the variable delay circuit comprising the delay elements DLYW1, DLYW2, . . . , and DLYWn and since the delay time of the delay circuit is controlled in accordance with the delay control signals S1, S2, S3, S4, . . . , S2n-1 and S2n thereby to control the oscillation frequency of the oscillator circuit, the oscillation frequency can be controlled in accordance with a digital signal. Further, the delay elements have functions of both delay and selection by a simple configuration and a degree of enlargement of the minimum frequency step width by the delay time of the selector becomes small. Further, there is an advantage that a reduction of the number of transistors and the surface area for constituting the circuit can be achieved.

14th Embodiment

Figure 32:
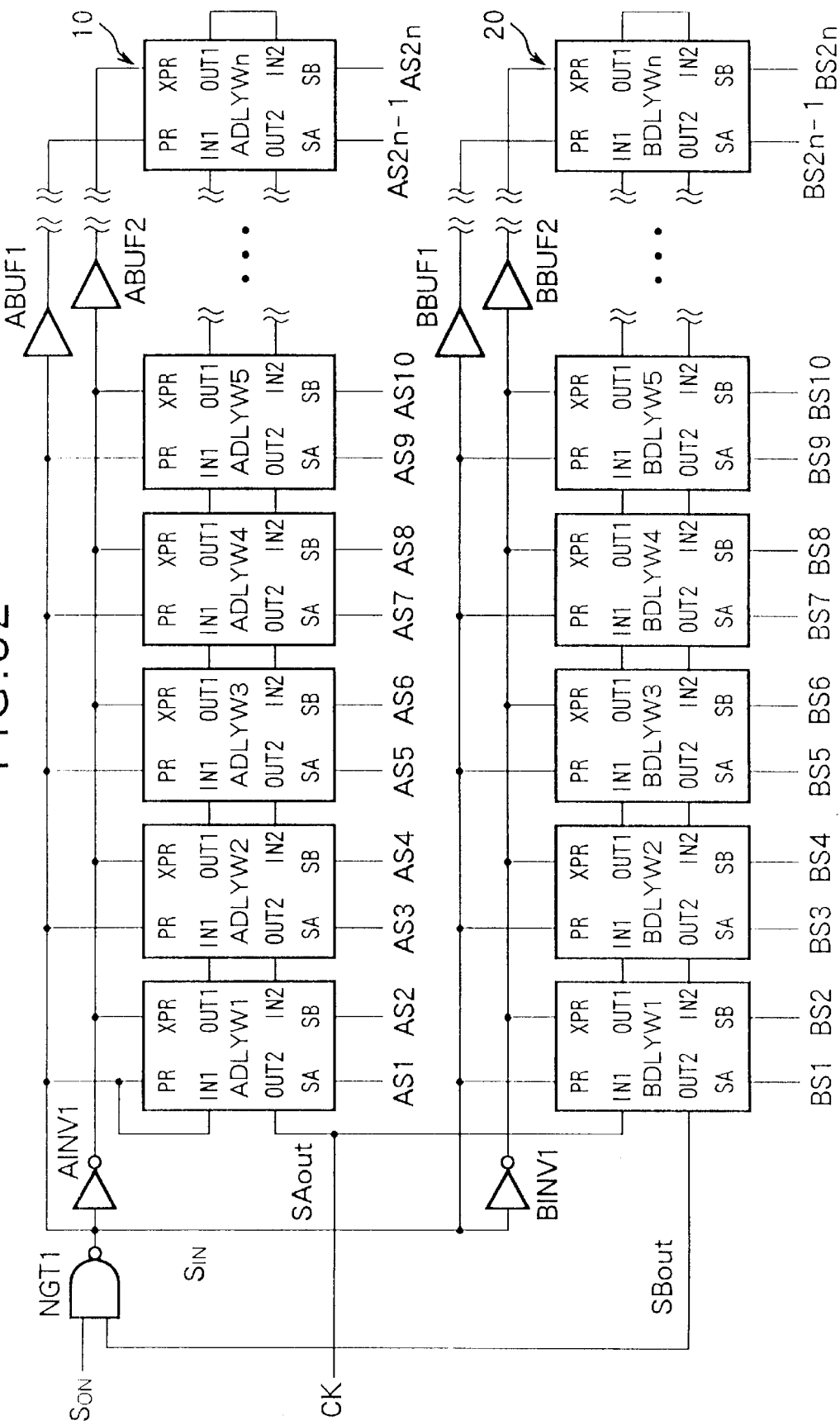
FIG. 32 is a circuit diagram of a fifth embodiment of the oscillator circuit according to the present invention.

FIG. 32 is a circuit diagram of a fifth embodiment of an oscillator circuit according to the present invention.

The oscillator circuit of the present embodiment is constituted by cascade connecting two delay circuits shown in FIG. 16. By taking out the output of the oscillation signal CK from the intermediate point of the two delay circuits and independently controlling the delay times of the two output circuits, an oscillation signal CK having both of an oscillation frequency and duty ratio which are made variable is obtained.

As illustrated, the two delay circuits 10 and 20 are respectively constituted by delay elements ADLYW1, ADLYW2, . . . , and ADLYWn and delay elements BDLYW1, BDLYW2, . . . , and BDLYWn, and the output signal $SA_{OUT}$ of the delay circuit 10 is input to the delay circuit 20 as the input signal of the delay circuit 20. The output signal $SB_{OUT}$ of the delay circuit 20 is input to one input terminal of the NAND gate NGT1, and the control signal $S_{ON}$ controlling the operating/stopped state of the oscillator circuit is input to the other input terminal of the NAND gate NGT1.

The output signal $S_{IN}$ of the NAND gate NGT1 is input to the precharge signal input terminal PR of each delay element as the precharge signal of the delay elements of the delay circuits 10 and 20. Further, the output signal $S_{IN}$ of the NAND gate NGT1 is inverted via the inverter AINV1 and input to the terminal XPR of the delay elements of the delay circuit 10 as the inverted signal of the precharge signal. The output signal $S_{IN}$ is inverted via the inverter BINV1 and input to the terminal XPR of the delay elements of the delay circuit 20.

Delay control signals AS1, AS2, AS3, AS4, . . . , AS2n-1 and AS2n are input to the delay elements ADLYW1, ADLYW2, . . . , and ADLYWn of the delay circuit 10, and the delay time of the delay circuit 10 is controlled in accordance with these signals. Delay control signals BS1, BS2, BS3, BS4, . . . , BS2n-1 and BS2n are input to the delay elements BDLYW1, BDLYW2, . . . , and BDLYWn of the delay circuit 20, and the delay time of the delay circuit 20 is controlled in accordance with these signals. The delay times of the delay circuits 10 and 20 are controlled in accordance with the delay control signals input to these delay circuits.

When a control signal $S_{ON}$ of a low level is input to the NAND gate NGT1, the output signal $S_{IN}$ of the NAND gate NGT1 is held at a high level, the output terminals OUT1 and OUT2 of the delay elements constituting the delay circuit are held at a high level, and the oscillator circuit is set in the stopped state.

When the control signal $S_{ON}$ becomes a high level, the output terminals OUT1 and OUT2 of the delay elements ADLYW1, ADLYW2, . . . , and ADLYWn and BDLYW1, BDLYW2, . . . , and BDLYWn are precharged for a short time, and the output signal from the output terminal OUT2 of the BDLYW1 is input to the NAND gate NGT1. Where the input signal $S_{ON}$ is at a high level, the change thereof is propagated to the output terminal of the NAND gate NGT1, and the output signal $S_{IN}$ of the NAND gate NGT1 becomes a low level. Further, the change is sequentially propagated from the input terminal IN1 of the ADLY1 to the output terminal and next sequentially propagated from the input terminal IN1 of the ADLYW2 to the output terminal OUT1. Here, when a bypass is formed by the delay route set by the delay control signals AS1, AS2, AS3, AS4, . . . , AS2n-1 and AS2n, it passes through the input terminal IN2 of the delay element ADLYW1 in the reverse direction, reaches the output terminal OUT2, and is output as the output signal $SA_{OUT}$ of the delay circuit 10. In the delay elements BDLYW1, BDLYW2, . . . , and BDLYWn of the delay circuit 20, signals are propagated in the same way as that described above. After a signal is delayed by the signal route set by the delay control signals BS1, BS2, BS3, BS4, . . . , BSn-1 and BS2n, it reaches the output terminal OUT2 of the delay element BDLYW1 and is input to the NAND gate NGT1 as the output signal $SB_{OUT}$ of the delay circuit 20. Therefore, the output terminal of the NAND gate NGT1 changes from a low level to a high level, and the delay elements constituting the delay circuits 10 and 20 become the precharge state again.

The ring oscillation is carried out by the signal propagation as described above. The output signal $SA_{OUT}$ of the delay circuit 10 is output to the outside as the oscillation signal CK. Accordingly, the oscillation frequency of the oscillator circuit is determined by the sum of delay amounts after and before the oscillation signals CK, that is the sum of delay times of the delay circuits 10 and 20.

Further, the amounts of delay of the oscillation signal CK from a high level to a low level before and after the output terminal are controlled independently by the delay control signals AS1, AS2, AS3, AS4, . . . , AS2n-1 and AS2n and BS1, BS2, BS3, BS4, . . . , BS2n-1 and BS2n, therefore the duty ratio of the oscillation signal CK can be controlled.

As explained above, according to the present embodiment, since the delay circuit is constituted by cascade connecting the delay circuits 10 and 20 comprising the delay elements ADLYW1, ADLYW2, . . . , and ADLYWn and BDLYW1, BDLYW2, . . . , and BDLYWn, the output signal $SB_{OUT}$ of the delay circuit 20 is input to the NAND gate NGT1, the output signal $S_{IN}$ of the NAND gate NGT1 is input to the delay circuit 10 again, and the output signal $SA_{OUT}$ is taken out from the intermediate point of the delay circuits 10 and 20, that is, the output terminal of the delay circuit 10, and output as the oscillation signal CK, by individually independently setting the delay control signals to be input to the delay circuits 10 and 20, it becomes possible to respectively control the frequency and duty ratio of the oscillation signal CK.

Further, when the actual circuit is laid out on an LSI, a reduction of the lowest oscillation frequency can be realized by adding the delay elements to the right side in the delay circuits 10 and 20. No change is made to the left side of the circuit at this time. Therefore, the problems of the lowering of the highest oscillation frequency which is apt to occur where the lowest oscillation frequency is lowered, that is, when then range of variation of the oscillation frequency is broadened, and the lowering of the linear characteristic of the oscillation frequency with respect to the control signal can be avoided, and a reduction of the step width of the oscillation frequency and an increase of the range of variation can be realized.

15th Embodiment

Figure 33:
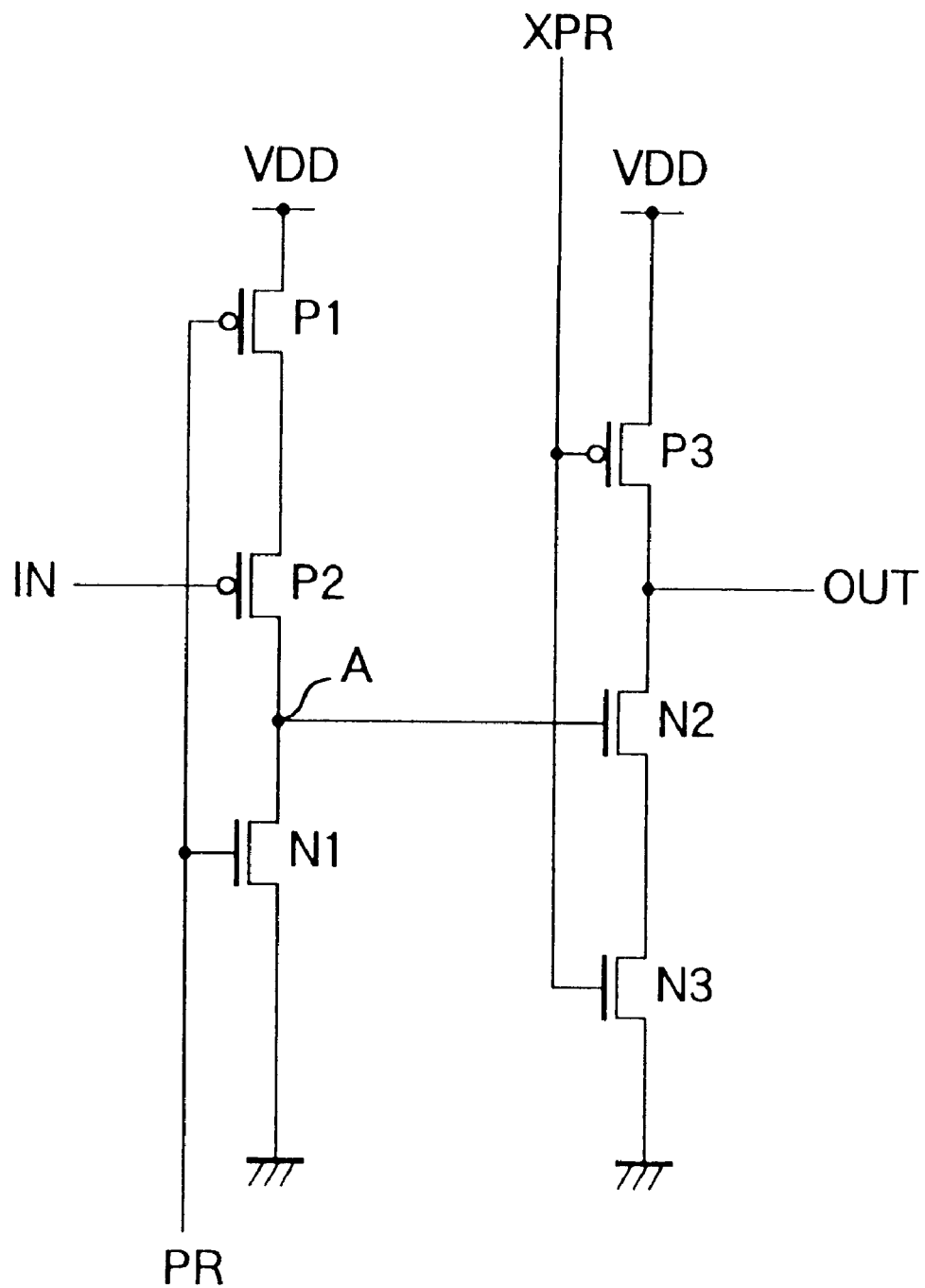
FIG. 33 is a circuit diagram of an example of the delay element comprising a domino inverter.
Figure 34:
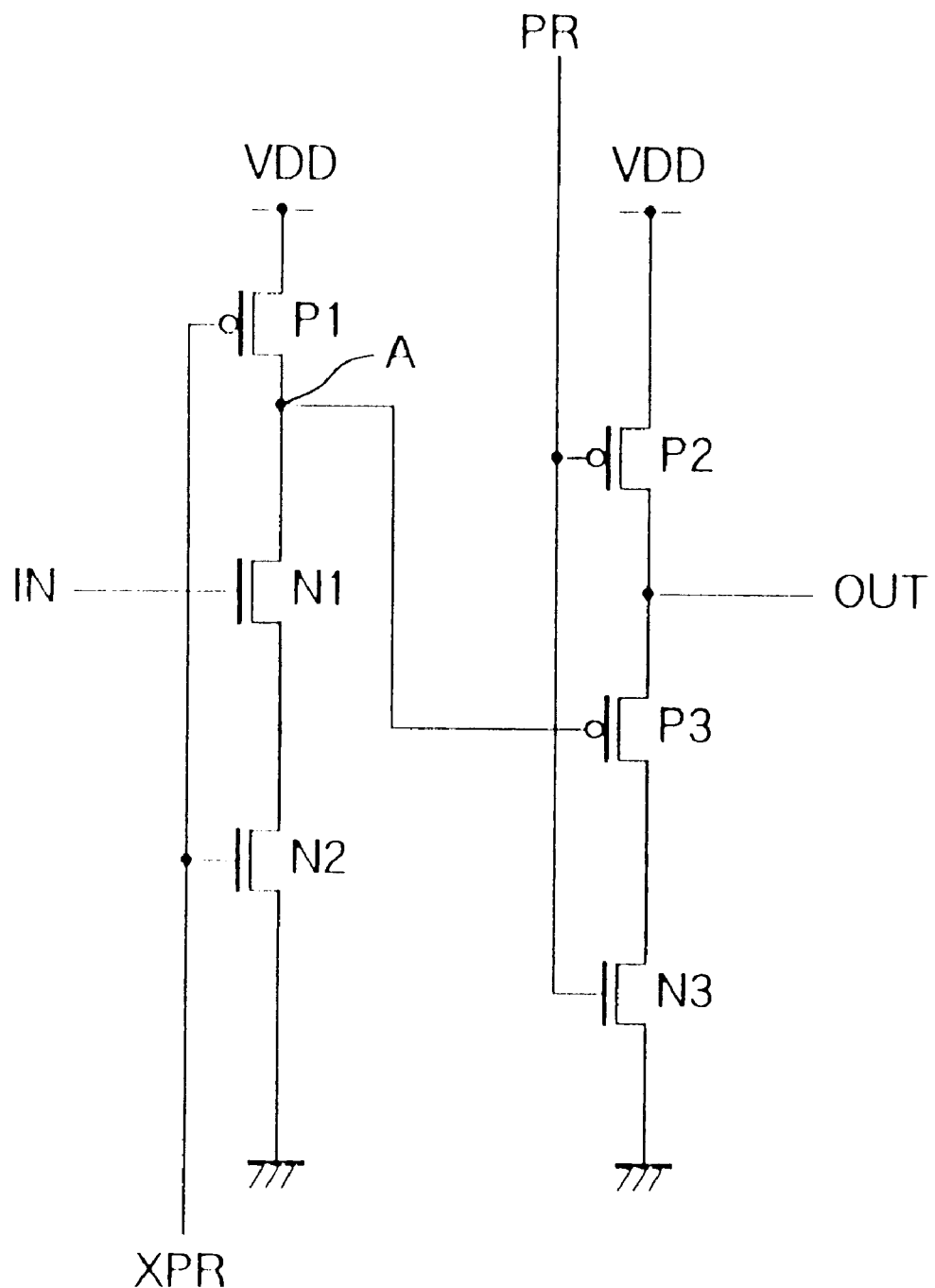
FIG. 34 is a circuit diagram of another example of the delay element comprising a domino inverter.

FIG. 33 and FIG. 34 are circuit diagrams of another example of the configuration of the delay elements constituting the delay circuit and oscillator circuit according to the present invention.

FIG. 33 shows an example of the delay element constituted by a domino inverter. The delay element of the present example is constituted by the pMOS transistors P1, P2, and P3 and the nMOS transistors N1, N2, and N3.

The source of the pMOS transistor P1 is connected to the supply line of the power supply voltage VDD, while the drain is connected to the source of the pMOS transistor P2. The source of the pMOS transistor P2 is connected to the drain of the pMOS transistor P1, while the drain is connected to the node A. The drain of the nMOS transistor N1 is connected to the node A, while the source is grounded. The gates of the pMOS transistor P1 and nMOS transistor N1 are commonly connected to the input terminal PR of the precharge signal, while the gate of the pMOS transistor P2 is connected to the input terminal IN of the delay element.

The source of the pMOS transistor P3 is connected to the supply line of the power supply voltage VDD, while the drain is connected to the output terminal OUT of the delay element. The drain of the nMOS transistor N2 is connected to the output terminal OUT, while the source is connected to the drain of the nMOS transistor N3. The drain of the nMOS transistor N3 is connected to the source of the nMOS transistor N2, while the drain is grounded. The gates of the pMOS transistor P3 and the nMOS transistor N3 are connected to the input terminal XPR of the inverted signal of the precharge signal, while the gate of the nMOS transistor N2 is connected to the node A.

In this delay element, when a signal of a high level is input to the precharge signal terminal PR, and a signal of a low level is input to the inverted signal terminal XPR thereof, the nMOS transistor N1 and the pMOS transistor P3 are held in the conductive state, the node A is held at a low level, for example, the ground potential GND, and the output terminal OUT is held at a high level, for example, the power supply voltage VDD level, that is, the delay element is set in the precharge state.

After the precharge, a signal of a low level is input to the terminal PR, and a signal of a high level is input to the terminal XPR. According to this, the nMOS transistor N1 and the pMOS transistor P3 are held in the nonconductive state, and the precharge state of the delay element is held. When the precharge state is held during a period where the signal input to the input terminal IN is at a high level and the input signal switches from a high level to a low level, the pMOS transistor P2 and the nMOS transistor N3 become the conductive state, the node A is charged by the power supply voltage VDD and switches to high level, the nMOS transistor N2 becomes the conductive state in accordance with this, and the output terminal OUT is discharged and switched to a low level. The time from the falling edge of the input signal to the falling edge of the output signal becomes the delay time of the delay element.

In this way, in the delay element of the present example, substantially the same effect as that by the delay element shown in FIG. 8 is obtained. The delay value and the surface area of the circuit are slightly increased by the amount of increase of the number of transistors constituting the delay element, but on the other hand the through current at the time of precharge of the delay element is reduced and the power consumption of the circuit can be reduced.

Where the delay circuit shown in FIG. 7 is constituted by using the delay element of the present embodiment, for example, the precharge signal terminal PR of each delay element is connected to the terminal of the input signal $S_{IN}$, the input terminal XPR of the inverted signal of the precharge signal is connected to the inverted signal terminal of the input signal $S_{IN}$, the input terminal IN of the delay element of the initial stage is connected to the terminal of the input signal $S_{IN}$, and the input terminals IN of delay elements after them are connected to the output terminals OUT of the delay elements of the former stages.

When the input signals $S_{IN}$ is held at a high level, each delay element is set in the precharge state, both of the pMOS transistors P1 and P2 in the delay element of the initial stage are in the conductive state at the falling edge of the input signal $S_{IN}$, and the node A is charged by the power supply voltage VDD and held at high level. According to this, the nMOS transistor N2 is held in the conductive state and the nMOS transistor N3 is in the conductive state, therefore the output terminal OUT is discharged and switched to a low level. According to the level change of the output terminal of the initial stage, each delay element of the next stage sequentially changes in state. The falling edge of the input signal $S_{IN}$ is transferred to the output terminal OUT of the delay element of the final stage after passing through each delay element.

As explained above, according to the present embodiment, since the delay element is constituted by an domino inverter comprising the pMOS transistors P1, P2, and P3 and nMOS transistors N1, N2, and N3, and the generation of a leakage current can be suppressed at the change of status of the delay element, a reduction of the power consumption can be realized in the delay circuit and oscillator circuit constituted by the delay elements of the present embodiment.

FIG. 34 shows another example of a delay element constituted by a domino inverter. The delay element of the present example is constituted by the pMOS transistors P1, P2, and P3 and nMOS transistors N1, N2, and N3. Note that the configuration of connection of these transistors is different from that of the example of the delay elements shown in FIG. 33.

In the delay element of the present example, when the precharge signal is at a low level, both of the pnp transistor P1 and nMOS transistor N3 are held in the conductive state, the node A is held at a high level, and the output terminal OUT is held at a low level. When the precharge signal is held at a high level and then the input signal to the input terminal IN is switched from a low level to a high level, both of the nMOS transistors N1 and N2 are held in the conductive state, the node A is discharged, and the potential thereof switches to a low level. According to this, the pMOS transistor P3 is switched to the conductive state and the pMOS transistor P2 is in the conductive state, therefore the output terminal OUT is charged by the power supply voltage VDD and switched to a high level.

In this way, the rising edge of the signal input to the input terminal IN is delayed by the delay element.

Note that, where the delay circuit is constituted by the delay elements shown in FIG. 34, the delay circuit shown in FIG. 10 can be applied. The precharge signal terminal PR of each delay element is connected to the terminal of the input signal $S_{IN}$, and the input terminal XPR of the inverted signal of the precharge is connected to the inverted signal $S_{XIN}$ terminal of the input signal $S_{IN}$. The input terminal IN of the delay element of the initial stage is connected to the terminal of the inverted signal $S_{XIN}$ of the input signal $S_{IN}$, and the input terminals IN of following delay elements are connected to the output terminals OUT of the delay elements of the former stages.

16th Embodiment

Figure 35:
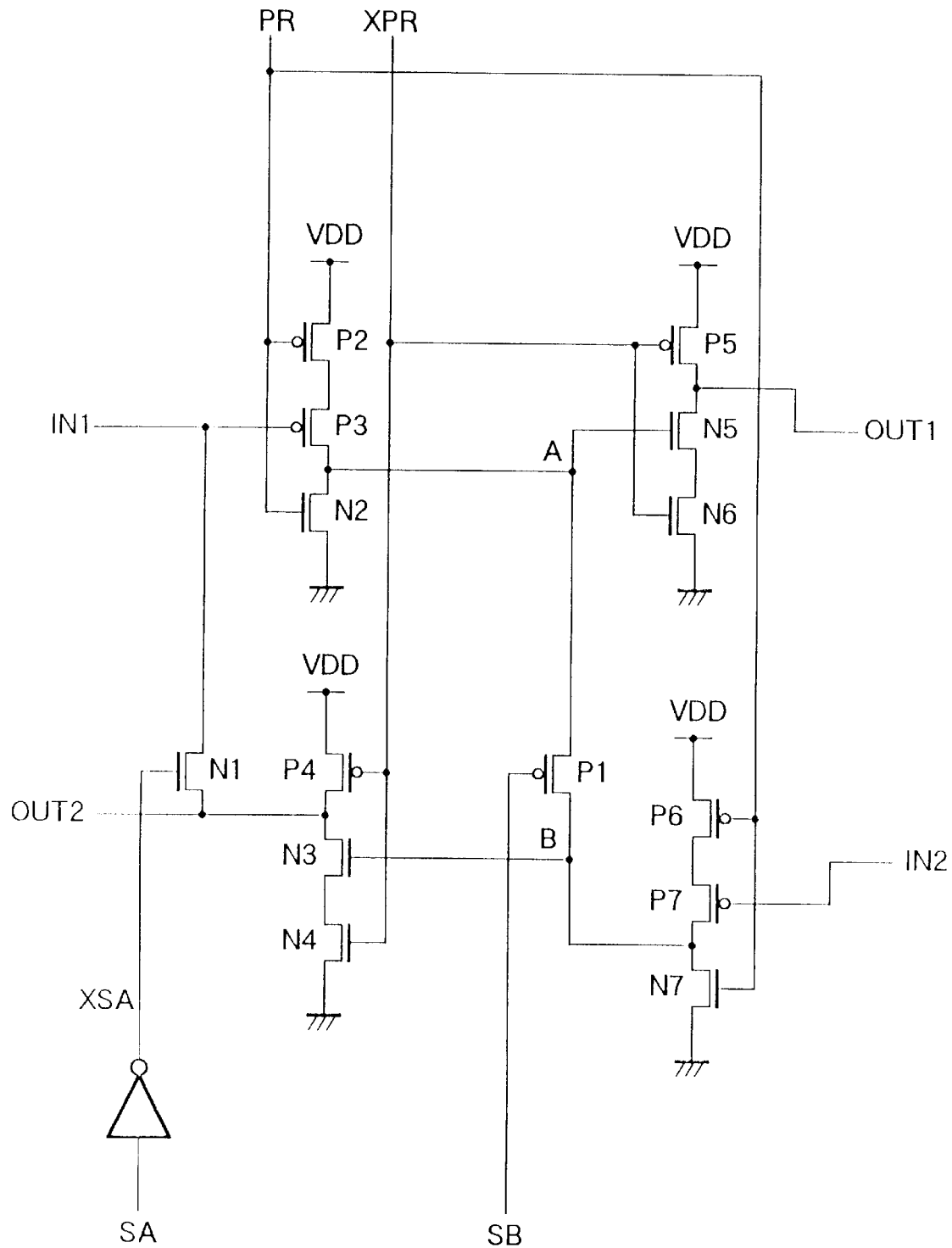
FIG. 35 is a circuit diagram of an example of upper and lower stages of delay elements comprising domino inverters.
Figure 36:
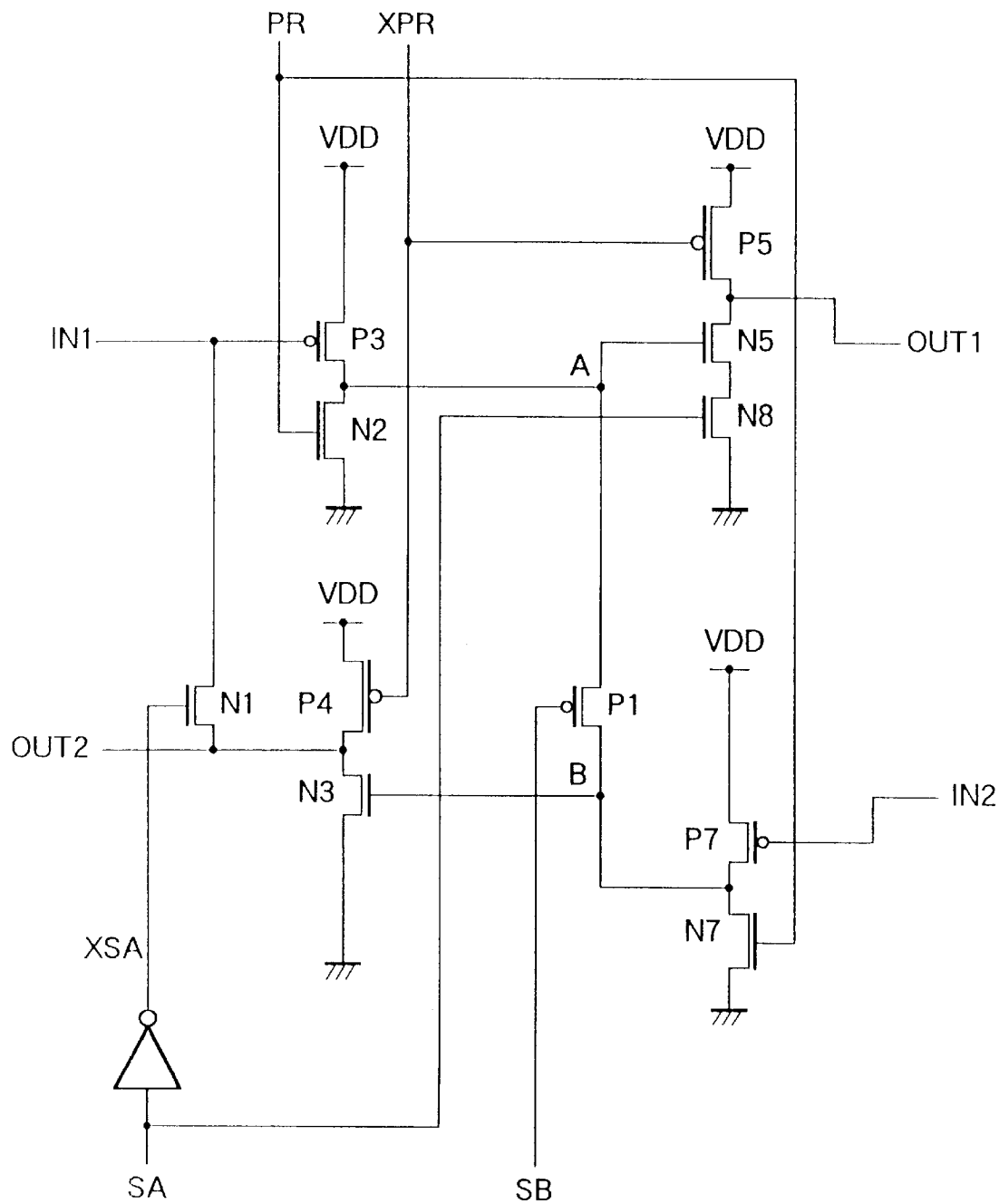
FIG. 36 is a circuit diagram of an improved example of upper and lower stages of delay elements comprising domino inverters.
Figure 37:
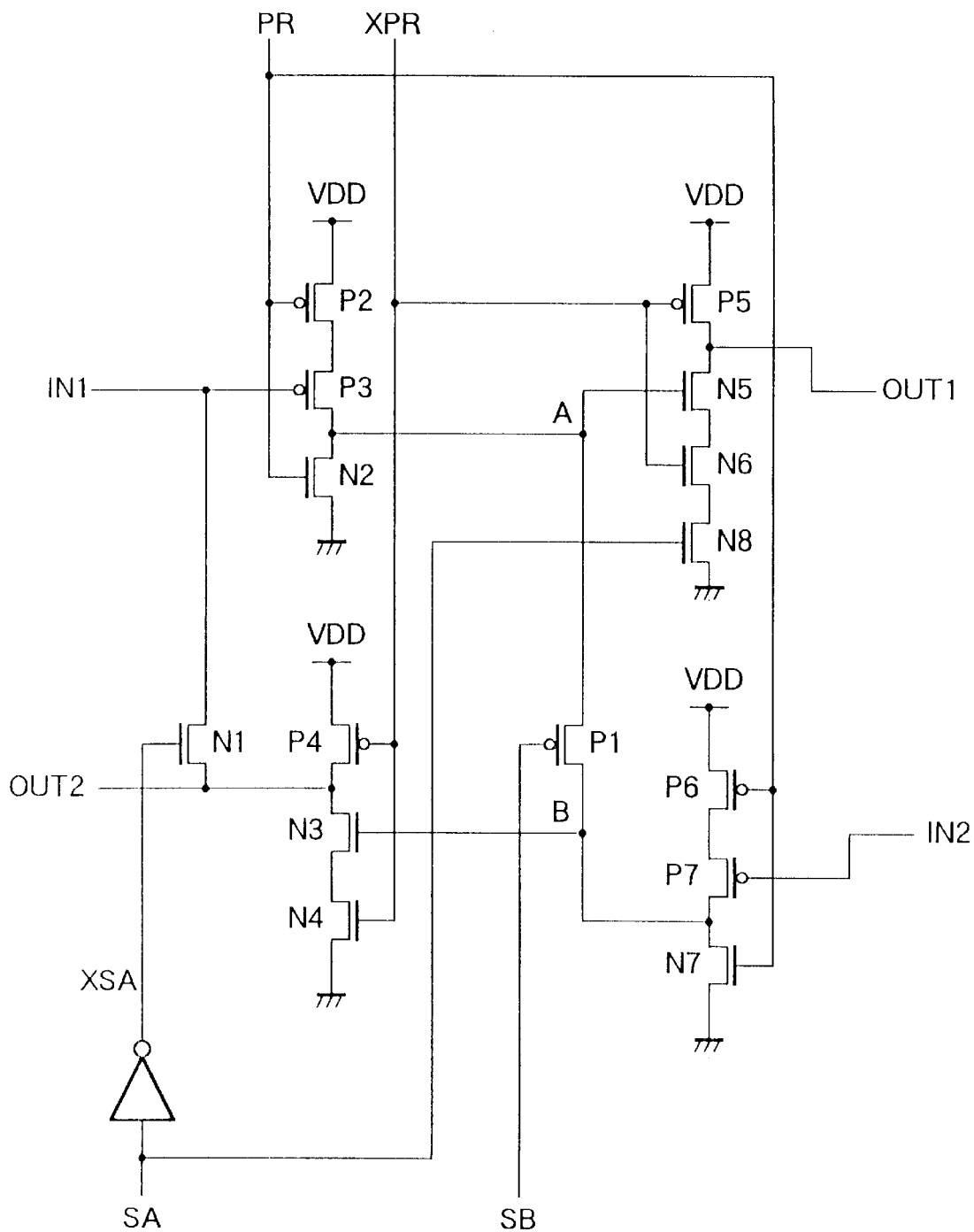
FIG. 37 is a circuit diagram of another improved example of upper and lower stages of delay elements comprising domino inverters.

FIGS. 35, 36 and 37 are circuit diagrams of other examples of the configurations of the delay elements constituting the delay circuit and oscillator circuit according to the present invention.

By constituting for example the delay circuit shown in FIG. 16 by the delay elements of the present embodiment, the delay time of the delay circuit is set by the delay control signals S1, S2, S3, S3, . . . , S2n-1 and S2n and a variable delay circuit can be realized.

FIG. 35 shows an example of the delay element constituted by using a domino inverter. The delay element of the present example has substantially the same configuration as that of the delay element shown in FIG. 17. However, the delay element of the present example is constituted by using a domino inverter. As illustrated, the present embodiment is constituted by two delay elements. The delay element of the upper stage outputs the signal input to the input terminal IN1 to the output terminal OUT1 via the node A. The delay element of the lower stage outputs the signal input to the input terminal IN2 to the output terminal OUT2 via the node B.

A switch element comprising the nMOS transistor N1 is connected between the input terminal IN1 of the upper stage and the output terminal OUT2 of the lower stage. When a control signal of a low level is input to the delay control signal input terminal SA, a signal of a high level is supplied to the gate of the nMOS transistor N1, the nMOS transistor N1 is held in the conductive state, the input terminal IN1 of the upper stage and the output terminal OUT2 of the lower stage are connected, and the signal input to the input terminal IN1 is output to the output terminal OUT2 of the lower stage as it is without being given the delay time.

Further, when a switch element comprising the pMOS transistor P1 is connected between the node A of the upper stage and the node B of the lower stage and a control signal of a low level is input to the delay control signal input terminal SB, the pMOS transistor P1 is held in the conductive state and the node A of the upper stage and the node B of the lower stage are connected. At this time, when a control signal of a high level is input to the delay control signal input terminal SA, the signal input to the input terminal IN1 of the upper stage is output via the node A and node B to the output terminal OUT2 of the lower stage. In this case, the signal output to the output terminal OUT2 of the lower stage is given the delay time of the amount of one stage of delay element.

Further, when a control signal of a high level is input to both of the delay control signal input terminals SA and SB, both of the nMOS transistor N1 and the pMOS transistor P1 are held in the nonconductive state. In this case, the signal input to the input terminal IN1 of the upper stage is output to the output terminal OUT1 of the lower stage via the node A, further delayed by the other delay elements connected to the latter stages, and the input to the input terminal IN2 of the lower stage. The input signal is output to the output terminal OUT2 via the node B. Namely, in this case, the input signal is delayed by the delay elements of the upper stage and the lower stage.

The delay element shown in FIG. 35 has both functions of delay and selection. The selection of the signal can be realized by one transistor. The configuration of the circuit becomes simple by the variable delay circuit constituted by using the selector. Further, generation of a through current is suppressed at the change of status of the delay element, and a reduction of the power consumption of the circuit can be achieved.

FIG. 36 shows another example of the configuration of the delay element. The delay element of the present example is obtained by improving the delay element shown in FIG. 17. An nMOS transistor N8 for prohibiting the signal propagation is added.

Looking at the delay element shown in FIG. 17, the nMOS transistor N8 is added between the nMOS transistor N5 and the ground potential GND. The drain of the nMOS transistor N8 is connected to the source of the nMOS transistor N5, while the source is grounded. The gate of the nMOS transistor N8 is connected to the input terminal SA of the delay control signal.

As mentioned above, when a signal of a low level is input to the delay control signal input terminal SA, the nMOS transistor N1 is held in the conductive state, the input terminal IN1 of the upper stage and the output terminal OUT2 of the lower stage are connected, and the input signal to the input terminal IN1 is output to the output terminal OUT2 of the lower stage as it is. At this time, since the added nMOS transistor N8 is held in the nonconductive state, the output terminal OUT1 of the upper stage is held at a high level, for example, the power supply voltage VDD level. By this, the state of each delay element after the output terminal OUT1 of the upper stage does not change, and the power consumption accompanying the charge and discharge is reduced.

When a signal of a high level is input to the delay control signal input terminal SA, the nMOS transistor N8 is held in the conductive state, and the delay element of the present example performs the same operation as that of the delay element shown in FIG. 17.

FIG. 37 shows another example of the configuration of the delay element. The delay element of the present example is obtained by improving the delay element shown in FIG. 35. That is, a nMOS transistor N8 for prohibiting signal propagation is added.

As illustrated, the delay element of the present example has substantially the same configuration as that of the delay element shown in FIG. 35 except that the nMOS transistor N8 is added. Due to the addition of the nMOS transistor N8, when a signal of a low level is input to the delay control signal input terminal SA and the input signal is passed by the nMOS transistor N1 in the conductive state and directly output to the output terminal OUT2 of the lower stage, the nMOS transistor N8 is held in the nonconductive state, and the output terminal OUT1 of the upper stage is held at a high level, for example, the power supply voltage VDD level. According to this, in each subsequent delay element connected to the output terminal OUT1 of the upper stage, a reduction of the power consumption can be realized without a change of the state.

When a control signal of a high level is input to the delay control signal input terminal SA, the nMOS transistor N8 is held in the conductive state, and the delay element of the present example operates similar to the delay element shown in FIG. 35.

As explained above, according to the present embodiment, by adding the nMOS transistor N8 for prohibiting the status change to the delay element and controlling the on/off state of the nMOS transistor N8 in accordance with the delay control signal, when the delay control signal input terminal SA is held at a high level, the nMOS transistor N8 is held in the nonconductive state, and the output terminal OUT1 of the upper stage changes in accordance with the input signal to the input terminal IN1 of the upper stage. When the delay control signal input terminal SA is held at a low level, the input signal to the input terminal IN1 of the upper stage is passed to the output terminal OUT2 of the lower stage, and the nMOS transistor N8 is held in the nonconductive state, therefore the output terminal OUT1 of the upper stage is precharged, but held at high level without being discharged, and the propagation of the signal to the latter stage stops, thus unnecessary power consumption accompanying a change of status of the latter stage can be suppressed.

As explained above, according to the delay circuit of the present invention and the oscillator circuit using the same, the amount of delay of the delay element is small and the delay time can be more finely controlled. Further, there are the advantages that the desired maximum amount of delay of the delay circuit can be obtained by increasing or decreasing the number of delay elements, the input/output position of the signal on the chip can be fixed, the maximum delay time can be set without exerting an influence upon the minimum delay time, the delay time can be controlled by a digital control signal, the linear characteristic of the delay amount with respect to the control signal is good, and there is strong resistance against noise.

Further, according to the present invention, the selection circuit for constituting the variable delay circuit can be realized by one transistor, simplification of the circuit configuration can be realized, the linear characteristic of the amount of delay can be enhanced, and the configuration of the circuit for generation of the delay control signal for controlling the amount of delay can be simplified. Further, in the oscillator circuit constituted by the delay circuit of the present invention, an oscillator circuit capable of being adjusted in the oscillation frequency and duty ratio by a fine step width and capable of being controlled in both of the oscillation frequency and duty ratio can be realized.

Further, according to the present invention, there is an advantage that the size of the circuit in the delay element is not increased and the power consumption can be reduced.

What is claimed is:

1. A delay circuit for outputting an input signal taking a first or a second level delayed by exactly a predetermined time, said delay circuit having:
 a first holding means for receiving a control signal and holding a first node at a first level in accordance with the control signal;
 a second holding means for holding a second node at a second level in accordance with a second control signal;
 a first switching means for receiving the input signal and switching the first node from the first level to the second level when the input signal switches from the second level to the first level; and
 a second switching means for switching the second node from the second level to the first level in accordance with a level change of the first node and outputting the signal of the second node.

2. A delay circuit as set forth in claim 1, wherein:
the first holding means has a first first conductivity type transistor which is connected between a first power source for supplying the first level and the first node, is controlled in its on/off state in accordance with the control signal, and holds the first node at the first level at the time of conduction;

the second holding means has a first second conductivity type transistor which is connected between a second power source for supplying the second level and the second node, is controlled in its on/off state in accordance with the control signal, and holds the second node at the second level at the time of conduction;

the first switching means has a second second conductivity type transistor which is connected between the second power source and the first node, receives the input signal, is controlled in its on/off state in accordance with the input signal, switches from the conductive state to the nonconductive state when the input signal switches from the second level to the first level, and switches the first node from the first level to the second level;

the second switching means has a second first conductivity type transistor which is connected between the first power source and the second node, is controlled in its on/off state in accordance with the level change of the first node, switches from the nonconductive state to the conductive state when the first node changes from the first level to the second level, and switches the second node from the second level to the first level; and a driving capability of the first first conductivity type transistor serving as the first holding means is set larger than that of the second second conductivity type transistor serving as the first switching means and the driving capability of the first second conductivity type transistor serving as the second holding means is set larger than that of the second first conductivity type transistor serving as the second switching means.

3. A delay circuit as set forth in claim 1, wherein:
the first holding means has a first first conductivity type transistor which is connected between a first power source and the first node, is controlled in its on/off state in accordance with the control signal, and holds the first node at the first level at the time of conduction;

the second holding means has a first second conductivity type transistor which is connected between a second power source and the second node, is controlled in its on/off state in accordance with the control signal, and holds the second node at the second level at the time of conduction;

the first switching means has a second second conductivity type transistor and a third second conductivity type transistor connected in series between the second power source and the first node, the second second conductivity type transistor is controlled in its on/off state in accordance with the input signal upon receipt of the input signal and is set in the conductive state when the input signal is held at the first level, the third second conductivity type transistor is controlled in its on/off state in accordance with the control signal and is set in an on/off state reverse to that of the first first conductivity type transistor serving as the first holding means, and the first node is switched from the first level to the second level when the second and third second conductivity type transistors are set in the conductive state; and the second switching means has a second first conductivity type transistor and a third first conductivity type transistor connected in series between the first power source and the second node, the second first conductivity type transistor is controlled in its on/off state in accordance with the level of the first node and is set in the conductive state when the first node is held at the second level, the third first conductivity type transistor is controlled in its on/off state in accordance with the control signal and is set in an on/off state reverse to that of the first second conductivity type transistor serving as the second holding means, and the second node is switched from the second level to the first level when the second and third first conductivity type transistors are set in the conductive state.

4. A delay circuit comprising at least two delay elements which are connected in series and outputting a delay input signal taking a first or a second level delayed by exactly a predetermined time, in said delay circuit, each of the delay elements has a first holding means for receiving a first control signal and holding a first node at the first level in accordance with said first control signal, a second holding means for holding a second node at the second level in accordance with a second control signal, a first switching means for receiving an input signal and switching the first node from the first level to the second level when the input signal switches from the second level to the first level, and a second switching means for switching the second node from the second level to the first level in accordance with a level change of the first node and then outputting the signal of the second node to a delay element of a latter stage as the input signal of the delay element of the latter stage; and the delay input signal is supplied as an input signal of the delay element of an initial stage and further supplied to each delay element as the control signal of each delay element.

5. A delay circuit as set forth in claim 4, wherein:

the first holding means has a first first conductivity type transistor which is connected between a first power source and the first node, is controlled in its on/off state in accordance with the control signal, and holds the first node at the first level at the time of conduction;

the second holding means has a first second conductivity type transistor which is connected between a second power source and the second node, is controlled in its on/off state in accordance with the control signal, and holds the second node at the second level at the time of conduction;

the first switching means has a second second conductivity type transistor which is connected between the second power source and the first node, is controlled in its on/off state in accordance with the input signal upon receipt of the input signal, switches from the nonconductive state to the conductive state when the input signal switches from the second level to the first level, and switches the first node from the first level to the second level;

the second switching means has a second first conductivity type transistor which is connected between the first power source and the second node, is controlled in its on/off state in accordance with the level change of the first node, switches from the nonconductive state to the conductive state when the first node changes from the first level to the second level, and switches the second node from the second level to the first level; and the driving capability of the first first conductivity type transistor serving as the first holding means is set larger than that of the second second conductivity type transistor serving as the first switching means and the driving capability of the first second conductivity type transistor serving as the second holding means is set larger than that of the second first conductivity type transistor serving as the second switching means.

6. A delay circuit as set forth in claim 4, wherein:

the first holding means has a first first conductivity type transistor which is connected between a first power source and the first node, is controlled in its on/off state in accordance with the control signal, and holds the first node at the first level at the time of conduction;

the second holding means has a first second conductivity type transistor which is connected between a second power source and the second node, is controlled in its on/off state in accordance with the control signal, and holds the second node at the second level at the time of conduction;

the first switching means has a second second conductivity type transistor and a third second conductivity type transistor connected in series between the second power source and the first node, the second second conductivity type transistor is controlled in its on/off state in accordance with the input signal upon receipt of the input signal and is set in the conductive state when the input signal is held at the first level, the third second conductivity type transistor is controlled in its on/off state in accordance with the control signal and is set in an on/off state reverse to that of the first first conductivity type transistor serving as the first holding means, and the first node is switched from the first level to the second level when the second and third second conductivity type transistors are set in the conductive state; and the second switching means has a second first conductivity type transistor and a third first conductivity type transistor connected in series between the first power source and the second node, the second first conductivity type transistor is controlled in its on/off state in accordance with the level of the first node and is set in the conductive state when the first node is held at the second level, the third first conductivity type transistor is controlled in its on/off state in accordance with the control signal and is set in an on/off state reverse to that of the first second conductivity type transistor serving as the second holding means, and the second node is switched from the second level to the first level when the second and third first conductivity type transistors are set in the conductive state.

7. A delay circuit in which a delay time is set in accordance with a control signal, said delay circuit having a plurality of basic circuits each comprising a first delay element for delaying an input signal of a first input terminal of said delay circuit by a predetermined time and outputting the result to a first output terminal, a selecting means for selecting and outputting either of the output signal of the first delay element or an input signal of a second input terminal of said delay circuit in accordance with a control signal, and a second delay element for delaying and outputting the output signal of the selecting means by a predetermined time, and the first output terminal of a basic circuit of a former stage is connected to the first input terminal of the basic circuit of a latter stage, and the second input terminal of the basic circuit of a former stage is connected to a second output terminal of the basic circuit of a latter stage.

8. A delay circuit in which a delay time is set in accordance with a control signal, said delay circuit having a plurality of stages of delay elements each comprising:

a first inverting and outputting means for inverting an input signal of a first input terminal and outputting the inverted input signal to a first node, a second inverting means for inverting the signal of the first node and outputting the inverted signal of the first node to a first output terminal, a third inverting means for inverting the input signal of a second input terminal and outputting the inverted signal of the second input terminal to a second node, a fourth inverting means for inverting the signal of the second node and outputting the inverted signal of the second node, a first switch which is connected between the first input terminal and the second node and is controlled in its on/off state in accordance with a first control signal, and a second switch which is connected between the first and second nodes and is controlled in its on/off state in accordance with a second control signal; and the first output terminal of the delay element of a former stage is connected to the first input terminal of the delay element of a latter stage, and the second input terminal of the delay element of a former stage is connected to the second output terminal of the delay element of a latter stage.

9. A delay circuit as set forth in claim 8, wherein the first inverting means is constituted by:

a first conductivity type insulation gate type electric field effect transistor with a gate which is connected to the first input terminal, with a source which is connected to a first power source, and with a drain which is connected to the first node and a second conductivity type insulation gate type electric field effect transistor with a gate which is connected to the input terminal of a precharge control signal, with a drain which is connected to the first node, with a source which is connected to a second power source, and with a driving capability which is larger than that of the first conductivity type insulation gate type electric field effect transistor.

10. A delay circuit as set forth in claim 9, wherein the precharge control signal is the input signal to be input to the delay element of the initial stage.

11. A delay circuit as set forth in claim 8, wherein the first inverting means is constituted by:

a first first conductivity type insulation gate type electric field effect transistor with a source which is connected to a first power source and with a gate which is connected to the input terminal of a precharge control signal;

a second first conductivity type insulation gate type electric field effect transistor with a source which is connected to a drain of the first first conductivity type insulation gate type electric field effect transistor, with a drain which is connected to the first node, and with a gate which is connected to the first input terminal; and a second conductivity type insulation gate type electric field effect transistor with a drain which is connected to the first node, with a source which is connected to a second power source, and with a gate which is connected to the input terminal of the precharge control signal.

12. A delay circuit as set forth in claim 11, wherein the precharge control signal is the input signal to be input to the delay element of the initial stage.

13. A delay circuit as set forth in claim 8, wherein the second inverting means is constituted by:

a first conductivity type insulation gate type electric field effect transistor with a source which is connected to a first power source, with a drain which is connected to the first output terminal, and with a gate which is connected to the input terminal of the inverted signal of a precharge control signal and a second conductivity type insulation gate type electric field effect transistor with a drain which is connected to the first output terminal, with a source which is connected to a second power source, with a gate which is connected to the first node, and with a driving capability which is smaller than that of the first conductivity type insulation gate type electric field effect transistor.

14. A delay circuit as set forth in claim 13, wherein the precharge control signal is the input signal to be input to the delay element of the initial stage.

15. A delay circuit as set forth in claim 8, wherein the second inverting means is constituted by:

a first conductivity type insulation gate type electric field effect transistor with a source which is connected to a first power source, with a drain which is connected to the first output terminal, and with a gate which is connected to the input terminal of the inverted signal of a precharge control signal;

a first second conductivity type insulation gate type electric field effect transistor with a drain which is connected to the first output terminal and with a gate which is connected to the first node; and a second second conductivity type insulation gate type electric field effect transistor with a drain which is connected to the source of the first second conductivity type insulation gate type electric field effect transistor, with a source which is connected to a second power source, and with a gate which is connected to the input terminal of the inverted sigenal of the precharge control signal.

16. A delay circuit as set forth in claim 15, wherein the precharge control signal is the input signal to be input to the delay element of the initial stage.

17. A delay circuit as set forth in claim 8, wherein the third inverting means is constituted by:

a first conductivity type insulation gate type electric field effect transistor with a gate which is connected to the second input terminal, with a source which is connected to a first power source, and with a drain which is connected to the second node and a second conductivity type insulation gate type electric field effect transistor with a gate which is connected to the input terminal of the precharge control signal, with a drain which is connected to the second node, with a source which is connected to the second power source, and with a driving capability which is larger than that of the first conductivity type insulation gate type electric field effect transistor.

18. A delay circuit as set forth in claim 17, wherein the precharge control signal is the input signal to be input to the delay element of the initial stage.

19. A delay circuit as set forth in claim 8, wherein the third inverting means is constituted by:
- a first first conductivity type insulation gate type electric field effect transistor with a source which is connected to a first power source and with a gate which is connected to the input terminal of a precharge control signal;
- a second first conductivity type insulation gate type electric field effect transistor with a source which is connected to the drain of the first first conductivity type insulation gate type electric field effect transistor, with a drain which is connected to the second node, and with a gate which is connected to the second input terminal; and
- a second conductivity type insulation gate type electric field effect transistor with a drain which is connected to the second node, with a source which is connected to a second power source, and with a gate which is connected to the input terminal of the precharge control signal.

20. A delay circuit as set forth in claim 19, wherein the precharge control signal is the input signal to be input to the delay element of the initial stage.

21. A delay circuit as set forth in claim 8, wherein the fourth inverting means is constituted by:
- a first conductivity type insulation gate type electric field effect transistor with a source which is connected to a first power source, with a drain which is connected to the second output terminal, and with a gate which is connected to the input terminal of the inverted signal of a precharge control signal and
- a second conductivity type insulation gate type electric field effect transistor with a drain which is connected to the second output terminal, with a source which is connected to a second power source, with a gate which is connected to the second node, and with a driving capability which is smaller than that of the first conductivity type insulation gate type electric field effect transistor.

22. A delay circuit as set forth in claim 21, wherein the precharge control signal is the input signal to be input to the delay element of the initial stage.

23. A delay circuit as set forth in claim 8, wherein the fourth inverting means is constituted by:
- a first conductivity type insulation gate type electric field effect transistor with a source which is connected to a first power source, with a drain which is connected to the second output terminal, and with a gate which is connected to the input terminal of the inverted signal of a precharge control signal;
- a first second conductivity type insulation gate type electric field effect transistor with a drain which is connected to the second output terminal and with a gate which is connected to the second node; and
- a second second conductivity type insulation gate type electric field effect transistor with a drain which is connected to the source of the first second conductivity type insulation gate type electric field effect transistor, with a source which is connected to a second power source, and with a gate which is connected to the input terminal of the inverted signal of the precharge control signal.

24. A delay circuit as set forth in claim 23, wherein the precharge control signal is the input signal to be input to the delay element of the initial stage.

25. A delay circuit as set forth in claim 8, wherein
the first switch is constituted by a transistor with a gate which is supplied with the first control signal and with diffusion layers which are connected to the first input terminal and the second output terminal, respectively.

26. A delay circuit as set forth in claim 8, wherein
the second switch is constituted by a transistor with a gate which is supplied with the second control signal and with diffusion layers which are connected to the first and second nodes, respectively.

27. A delay circuit as set forth in claim 8, further having
a holding means connected to the second inverting means for receiving the first control signal and holding the first output terminal at a predetermined level when the first switch is set to a conductive state.

28. An oscillator circuit feeding back an output signal of a delay circuit to an input side so as to oscillate at an oscillation frequency in accordance with a delay time of said delay circuit,
wherein, in said oscillator circuit,
said delay circuit is comprised by a plurality of delay elements connected in series, each delay element being constituted by
- a first holding means for receiving a first control signal and holding a first node at a first level in accordance with the control signal,
- a second holding means for holding a second node at a second level in accordance with a second control signal,
- a first switching means for receiving an input signal and switching the first node from the first level to the second level when the input signal switches form the first level to the second level, and
- a second switching means for switching the second node from the second level to the first level in accordance with a level change of the first node and then outputting the signal of the second node to the delay element of a latter stage as the input signal of the delay element of the latter stage; and
provision is made of an inverting means for inverting the output signal of the delay element of the final stage and inputting the inverted signal to the delay element of the initial stage as the input signal of the delay element of the initial stage; the input signal of the delay element of the initial stage being supplied to each delay element as the control signal of each delay element.

29. An oscillator circuit as set forth in claim 28, wherein:
the first holding means has a first first conductivity type transistor which is connected between a first power source and the first node, is controlled in its on/off state in accordance with the control signal, and holds the first node at the first level at the time of conduction;
the second holding means has a first second conductivity type transistor which is connected between a second power source and the second node, is controlled in its on/off state in accordance with the control signal, and holds the second node at the second level at the time of conduction;
the first switching means has a second second conductivity type transistor which is connected between the second power source and the first node, is controlled in its on/off state in accordance with the input signal upon receipt of the input signal, switches from the nonconductive state to the conductive state when the input signal switches from the second level to the first level, and switches the first node from the first level to the second level;

the second switching means has a second first conductivity type transistor which is connected between the first power source and the second node, is controlled in its on/off state in accordance with a level change of the first node, switches from the nonconductive state to the conductive state when the first node changes from the first level to the second level, and switches the second node from the second level to the first level; and the driving capability of the first first conductivity type transistor serving as the first holding means is set larger than that of the second second conductivity type transistor serving as the first switching means, and the driving capability of the first second conductivity type transistor serving as the second holding means is set larger than that of the second first conductivity type transistor serving as the second switching means.

30. An oscillator circuit as set forth in claim 28, wherein:

the first holding means has a first first conductivity type transistor which is connected between a first power source and the first node, is controlled in its on/off state in accordance with the first control signal, and holds the first node at the first level at the time of conduction;

the second holding means has a first second conductivity type transistor which is connected between a second power source and the second node, is controlled in its on/off state in accordance with the second control signal, and holds the second node at the second level at the time of conduction;

the first switching means has a second second conductivity type transistor and a third second conductivity type transistor connected in series between the second power source and the first node, the second second conductivity type transistor is controlled in its on/off state in accordance with the input signal upon receipt of the input signal and is set in the conductive state when the input signal is held at the first level, the third second conductivity type transistor is controlled in its on/off state in accordance with the control signal and is set in an on/off state reverse to that of the first first conductivity type transistor serving as the first holding means, and the first node is switched from the first level to the second level when the second and third second conductivity type transistors are set in the conductive state; and the second switching means has a second first conductivity type transistor and a third first conductivity type transistor connected in series between the first power source and the second node, the second first conductivity type transistor is controlled in its on/off state in accordance with the level of the first node and is set in the conductive state when the first node is held at the second level, the third first conductivity type transistor is controlled in its on/off state in accordance with the control signal and is set in an on/off state reverse to that of the first second conductivity type transistor serving as the second holding means, and the second node is switched from the second level to the first level when the second and third first conductivity type transistors are set in the conductive state.

31. An oscillator circuit feeding back an output signal of a delay circuit to an input side and controlled in oscillation frequency in accordance with a control signal, where, in said oscillator circuit, the delay circuit is comprised by a plurality of basic circuits connected in series; each basic circuit having a first delay element for delaying an input signal of a first input terminal of said delay circuit by a predetermined time and then outputting the delayed input signal to a first output terminal a selecting means for selecting either of an output signal of the first delay element or the input signal of a second input terminal of said delay circuit in accordance with the control signal, and a second delay element for delaying an output signal of the selecting means by a predetermined time and then outputting to a second output terminal the delayed output signal of the selecting means;

the first output terminal of the basic circuit of a former stage is connected to the first input terminal of the basic circuit of a latter stage, the second input terminal of the basic circuit of a former stage is connected to the second output terminal of the basic circuit of a latter stage, and the first output terminal of the basic circuit of the final stage is connected to the second input terminal of the final stage; and provision is made of an inverting means for inverting the output signal of the second output terminal of the basic circuit of the initial stage and inputting the inverted signal to the first input terminal of the basic circuit of the initial stage.

32. An oscillator circuit feeding back an output signal of a delay circuit to an input side and controlled in oscillation frequency in accordance with a control signal, wherein, in said oscillator circuit, the delay circuit is comprised of a plurality of delay elements connected in series; each delay element having a first inverting means for inverting the input signal of a first input terminal and then outputting the inverted input signal to a first node, a second inverting means for inverting the signal of the first node and then outputting to a first output terminal the inverted signal of the first node, a third inverting means for inverting the input signal of a second input terminal and then outputting the inverted input signal of the second input terminal to a second node, a fourth inverting means for inverting and then outputting the signal of the second node, a first switch connected between the first input terminal and the second output terminal and controlled in its on/off state in accordance with the first control signal, and a second switch connected between the first and second nodes and controlled in its on/off state in accordance with the second control signal;

the first output terminal of the delay element of a former stage is connected to the first input terminal of the delay element of a latter stage, and the second input terminal of the delay element of a former stage is connected to the second output terminal of the delay element of a latter stage; and provision is made of an inverting means for inverting the output signal of the second output terminal of the delay element of the initial stage and inputting the inverted signal to the first input terminal of the delay element of the initial stage.

33. An oscillator circuit as set forth in claim 32, wherein the first inverting means is constituted by:

a first conductivity type insulation gate type electric field effect transistor with a gate which is connected to the first input terminal, with a source which is connected to a first power source, and with a drain which is connected to the first node and a second conductivity type insulation gate type electric field effect transistor with a gate which is connected to the input terminal of a precharge control signal, with a drain which is connected to the first node, with a source which is connected to a second power source, and with a driving capability which is larger than that of the first conductivity type insulation gate type electric field effect transistor.

34. An oscillator circuit as set forth in claim 32, wherein the first inverting means is constituted by:

a first first conductivity type insulation gate type electric field effect transistor with a source which is connected to a first power source and with a gate which is connected to the input terminal of a precharge control signal;

a second first conductivity type insulation gate type electric field effect transistor with a source which is connected to the drain of the first first conductivity type insulation gate type electric field effect transistor, with a drain which is connected to the first node, and with a gate which is connected to the first input terminal; and a second conductivity type insulation gate type electric field effect transistor with a drain which is connected to the first node, with a source which is connected to a second power source, and with a gate which is connected to the input terminal of a precharge control signal.

35. An oscillator circuit as set forth in claim 32, wherein the second inverting means is constituted by:

a first conductivity type insulation gate type electric field effect transistor with a source which is connected to a first power source, with a drain which is connected to the first output terminal, and with a gate which is connected to the input terminal of the inverted signal of a precharge control signal; and a second conductivity type insulation gate type electric field effect transistor with a drain which is connected to the first output terminal, with a source which is connected to a second power source, with a gate which is connected to the first node, and with a driving capability which is smaller than that of the first conductivity type insulation gate type electric field effect transistor.

36. An oscillator circuit as set forth in claim 32, wherein the second inverting means is constituted by:

a first conductivity type insulation gate type electric field effect transistor with a source which is connected to a first power source, with a drain which is connected to the first output terminal, and with a gate which is connected to the input terminal of the inverted signal of a precharge control signal;

a first second conductivity type insulation gate type electric field effect transistor with a drain which is connected to the first output terminal and with a gate which is connected to the first node; and a second second conductivity type insulation gate type electric field effect transistor with a drain which is connected to the source of the first second conductivity type insulation gate type electric field effect transistor, with a source which is connected to a second power source, and with a gate which is connected to the input terminal of the inverted signal of a precharge control signal.

37. An oscillator circuit as set forth in claim 32, wherein the third inverting means is constituted by:

a first conductivity type insulation gate type electric field effect transistor with a gate which is connected to the second input terminal, with a source which is connected to a first power source, and with a drain which is connected to the second node and a second conductivity type insulation gate type electric field effect transistor with a gate which is connected to the input terminal of a precharge control signal, with a drain which is connected to the second node, with a source which is connected to a second power source, and with a driving capability which is larger than that of the first conductivity type insulation gate type electric field effect transistor.

38. An oscillator circuit as set forth in claim 32, wherein the third inverting means is constituted by:

a first first conductivity type insulation gate type electric field effect transistor with a source which is connected to a first power source and with a gate which is connected to the input terminal of a precharge control signal;

a second first conductivity type insulation gate type electric field effect transistor with a source which is connected to the drain of the first first conductivity type insulation gate type electric field effect transistor, with a drain which is connected to the second node, and with a gate which is connected to the second input terminal; and a second conductivity type insulation gate type electric field effect transistor with a drain which is connected to the second node, with a source which is connected to a second power source, and with a gate which is connected to the input terminal of a precharge control signal.

39. An oscillator circuit as set forth in claim 32, wherein the fourth inverting means is constituted by:

a first conductivity type insulation gate type electric field effect transistor with a source which is connected to a first power source, with a drain which is connected to the second output terminal, and with a gate which is connected to the input terminal of the inverted signal of a precharge control signal and a second conductivity type insulation gate type electric field effect transistor with a drain which is connected to the second output terminal, with a source which is connected to a second power source, with a gate which is connected to the second node, and with a driving capability which is smaller than that of the first conductivity type insulation gate type electric field effect transistor.

40. An oscillator circuit as set forth in claim 32, wherein the fourth inverting means is constituted by:

a first conductivity type insulation gate type electric field effect transistor with a source which is connected to a first power source, with a drain which is connected to the second output terminal, and with a gate which is connected to the input terminal of the inverted signal of a precharge control signal;

a first second conductivity type insulation gate type electric field effect transistor with a drain which is connected to the second output terminal and with a gate which is connected to the second node; and a second second conductivity type insulation gate type electric field effect transistor with a drain which is connected to the source of the first second conductivity type insulation gate type electric field effect transistor, with a source which is connected to a second power source, and with a gate which is connected to the input terminal of the inverted signal of a precharge control signal.

41. An oscillator circuit as set forth in claim 32, wherein
the first switch is constituted by a transistor with a gate which is supplied with the first control signal and with a diffusion layer which is connected to the first input terminal and the second output terminal.

42. An oscillator circuit as set forth in claim 32, wherein
the second switch is constituted by a transistor with a gate which is supplied with the second control signal and with diffusion layers which are connected to the first and second nodes, respectively.

43. An oscillator circuit as set forth in claim 32, further having
a holding means connected to the second inverting means for receiving the first control signal and holding the first output terminal at a predetermined level when the first switch is set to a conductive state.

44. An oscillator circuit for generating an oscillation signal controlled in its oscillation frequency and duty ratio in accordance with a first and a second control signal, said oscillator circuit having:

a first delay circuit for imparting a first delay time to an input signal in accordance with the first control signal and outputting the input signal delayed by the first delay time, a second delay circuit for imparting a second delay time to the input signal in accordance with the second control signal upon receipt of the output signal of the first delay circuit and outputting the input signal delayed by the first and second delay times, and an inverting means for inverting the output signal of the second delay circuit and then outputting the inverted signal as the input signal of the first delay circuit to the first delay circuit and outputting the output signal of the first delay circuit as the oscillation signal to an external position.

* * * * *

UNITED STATES PATENT AND TRADEMARK OFFICE
CERTIFICATE OF CORRECTION

| | | |
|---|---|---|
| PATENT NO. | : 6,127,872 | Page 1 of 1 |
| APPLICATION NO. | : 09/039028 | |
| DATED | : October 3, 2000 | |
| INVENTOR(S) | : Ichiro Kumata | |

It is certified that error appears in the above-identified patent and that said Letters Patent is hereby corrected as shown below:

In Claim 2, lines 18-19, (column 36, lines 15-16), please change the following:

"from the conductive state to the nonconductive state" to --from the nonconductive state to the conductive state--.

Signed and Sealed this

Sixth Day of September, 2011

David J. Kappos
*Director of the United States Patent and Trademark Office*